United States Patent
Okino et al.

(10) Patent No.: US 6,660,450 B2
(45) Date of Patent: Dec. 9, 2003

(54) RESIN USEFUL FOR RESIST, RESIST COMPOSITION AND PATTERN FORMING PROCESS USING THE SAME

(75) Inventors: Takeshi Okino, Yokohama (JP); Koji Asakawa, Kawasaki (JP); Naomi Shida, Minato-Ku (JP); Toru Ushirogouchi, Yokohama (JP); Satoshi Saito, Yamato (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/246,619

(22) Filed: Sep. 19, 2002

(65) Prior Publication Data

US 2003/0149225 A1 Aug. 7, 2003

Related U.S. Application Data

(62) Division of application No. 09/884,977, filed on Jun. 21, 2001, now Pat. No. 6,541,597, and a division of application No. 09/401,181, filed on Sep. 23, 1999, now Pat. No. 6,303,266.

(30) Foreign Application Priority Data

Sep. 24, 1998 (JP) .......................................... 10-269320
Mar. 16, 1999 (JP) ............................................ 11-70591

(51) Int. Cl.[7] .............................................. G03C 1/492
(52) U.S. Cl. ..................... 430/270.1; 430/271; 428/411
(58) Field of Search ............................... 430/270.1, 271; 428/411

(56) References Cited

U.S. PATENT DOCUMENTS

| | | | | |
|---|---|---|---|---|
| 4,018,767 A | 4/1977 | Buyniski et al. | ........ | 424/248.54 |
| 4,166,915 A | 9/1979 | Bucholz | ..................... | 568/820 |
| 6,013,416 A | 1/2000 | Nozaki et al. | ........... | 430/283.1 |
| 6,027,856 A | 2/2000 | Nozaki et al. | ........... | 430/281.1 |
| 6,512,067 B2 * | 1/2003 | Nishi et al. | ................. | 526/266 |

FOREIGN PATENT DOCUMENTS

| | | |
|---|---|---|
| JP | 5-127370 | 5/1993 |
| JP | 7-120927 | 5/1995 |
| JP | 08-259626 | 10/1996 |
| JP | 9-73173 | 3/1997 |
| JP | 10-83076 | 3/1998 |
| JP | 10-239847 | 9/1998 |
| JP | 10-307400 | 11/1998 |
| WO | WO 00/01684 | 1/2000 |

* cited by examiner

*Primary Examiner*—Terressa M. Boykin
(74) *Attorney, Agent, or Firm*—Oblon, Spivak, McClelland, Maier & Neustadt, P.C.

(57) ABSTRACT

According to the present invention, a resist resin having in its structure a specific bridged-bond-containing aliphatic ring, and a resist composition comprising the same are provided. By using this resist composition, a resist pattern excellent in both transparency against short-wavelength light and dry-etching resistance can be formed by alkali development with high resolution.

15 Claims, 5 Drawing Sheets

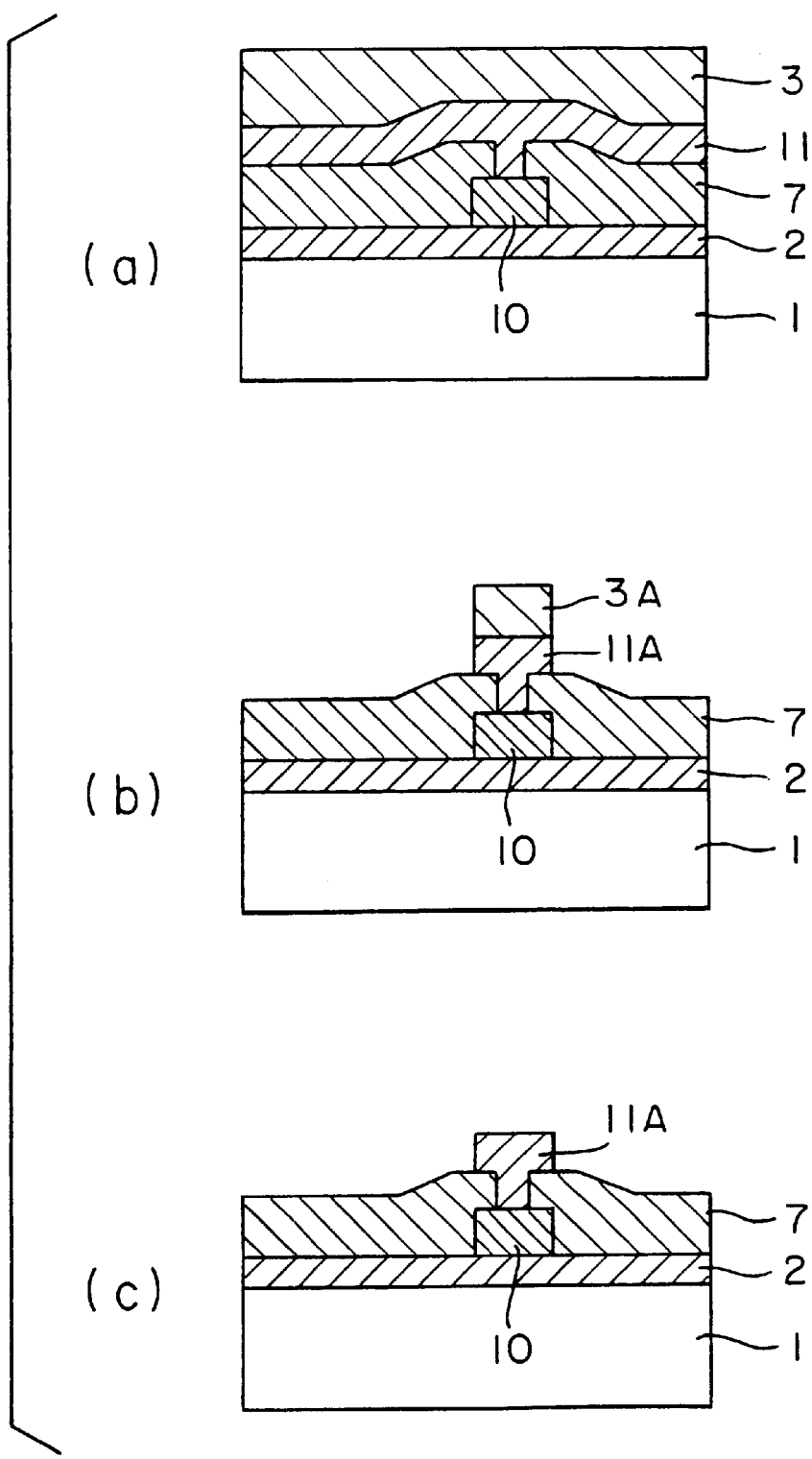
F I G. 2

RESIN USEFUL FOR RESIST, RESIST COMPOSITION AND PATTERN FORMING PROCESS USING THE SAME

This application is a division of Ser. No. 09/884,977 filed Jun. 21, 2001 U.S. Pat. No. 6,541,597, which is a division of Ser. No. 09/401,181 filed Sep. 23, 1999 U.S. Pat. No. 6,303,266.

FIELD OF THE INVENTION

The present invention relates to resins useful for resists, and to resist compositions comprising the same. The present invention also relates to a pattern forming process and a process for producing semiconductors using the resist compositions.

BACKGROUND OF THE INVENTION

In manufacturing processes of electronic components such as LSIs, fine patterning techniques utilizing photolithography have conventionally been adopted. Namely, a resist solution is firstly coated onto the surface of a substrate or the like to form a resist film; and the resist film is subjected to pattern-wise exposure to light, and then to treatments such as development by an alkaline developer to form a resist pattern. Subsequently, the bare surface of the substrate or the like is dry-etched by utilizing this resist pattern as an anti-etching mask to form minute lines and openings, and the remaining resist is finally removed by means of ashing.

Therefore, the resist herein used is generally required to have high dry-etching resistance. From this point of view, resists containing aromatic compounds have widely been used. Specifically, there have been developed a large number of resists containing, as base resins, novolak resins that are alkali-soluble.

On the other hand, in line with the trend toward high-density, high-integration LSIs and the like, the above-described fine patterning techniques have been improved in recent years so that patterning can be attained at the level of sub-half micron order; and this tendency toward fine patterning is expected to be more remarkable. Indeed, the wavelengths of light sources for use in photolithography are being made shorter; and it is now attempted to form fine resist patterns by using ArF excimer laser light (wavelength 193 nm), or a 5-fold higher harmonic wave of a YAG laser (wavelength 218 nm).

However, the resists containing, as base resins, resins containing aromatic compounds, which have commonly been used heretofore, have such a peculiarity that benzene nucleus contained in the compounds show high light absorption against the above-described short-wavelength light. Therefore, when it is tried to form a resist pattern, it is difficult to allow light to fully reach the substrate side of a resist film when the film is exposed to light. It has thus been difficult to form, with high sensitivity and high accuracy, patterns excellent in shape.

Under such circumstances, there is a strong demand for the development of highly transparent resist resins suitable also for photolithography which uses ArF excimer laser light, or a 5-fold higher harmonic wave of a YAG laser.

From this viewpoint, those resists containing alicyclic compounds in place of aromatic compounds are now attracting attention. Japanese Patent Laid-Open Patent Publication No. 39665/1992, for instance, describes the following example: alkali-solubility is imparted to a resist which is excellent in both dry-etching resistance and transparency against short-wavelength light and which comprises a compound containing adamantane that is a bridged-bond-containing alicyclic compound, by copolymerizing the resist and another acrylic compound; and a resist pattern is formed by alkali development, by the use of this alkali-solubility-imparted resist.

As shown in Japanese Patent Laid-Open Publication No. 199467/1995, there is known a resist material containing, as tricyclodecanyl structure, an alicyclic compound having 5-membered rings, which is one of bridged-bond-containing alicyclic compounds.

However, in the case where a resist pattern is formed by means of alkali development by the use of a resist containing such an alicyclic compound, various problems will be brought about. This is because the alicyclic structure such as adamantane skeleton has extremely high hydrophobicity, so that the difference in alkali-solubility between this alicyclic structure and a group which imparts alkali solubility to the resist is great.

For example, the predetermined area of the resist film cannot be uniformly dissolved and removed by development, so that the lowering of resolution is brought about. Moreover, the lowering of resolution is also caused due to the swelling of the resist pattern that occurs after development, and the resist film is cracked or undergoes surface roughening because even the area of the resist film that is supposed to remain after development is partly dissolved. Further, the separation of the resist pattern is often caused due to the penetration of an alkaline solution into the resist film-substrate interface. Furthermore, phase separation between the part having the alicyclic structure and the group which imparts alkali solubility, such as carboxylic acid moiety, tends to proceed in the polymer, so that it is difficult to obtain a homogeneous resist solution. In addition, such a resist solution shows poor coating performance.

In order to reduce the hydrophobicity of these alicyclic compounds, the introduction of a polar group such as COOH or OH group into the alicyclic compounds has been proposed (Japanese Patent Laid-Open Publications No. 83076/1998, No. 252324/1995 and No. 221519/1997). It has been confirmed that the solubility is considerably improved in all of these compounds.

However, the structure of these alicyclic compounds is such that COOH or OH group is combined with secondary or primary carbon atom of the aliphatic ring, so that this COOH or OH group tends to secondarily react with other substituents in the resists. Moreover, these compounds have low glass transition temperatures, so that they tend to bring about the lowering of resolution, and the swelling of the pattern after development.

An object of the present invention is therefore to provide, by overcoming the aforementioned problems, a resist resin which can be a component of a resist composition having high transparency against short-wavelength light and high dry-etching resistance, capable of forming a resist pattern excellent in adhesion and resolution by means of alkali development.

Another object of the present invention is to provide the above-described resist composition.

A further object of the present invention is to provide a pattern forming process using the resist composition.

SUMMARY OF THE INVENTION

Resist resin I according to the present invention is obtained by homopolymerizing at least one monomer selected from monomers represented by the following general formulas (I-1) and (I-2):

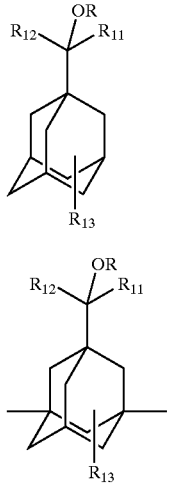

(I-1)

(I-2)

wherein R is acryloyl or methacryloyl group, $R_{11}$, and $R_{12}$ independently represent hydrogen atom or amonovalent alkyl group, and $R_{13}$ is OH group, =O group, COOH group or $COOR_{14}$ group ($R_{14}$ is a monovalent organic group), or by copolymerizing the monomer(s) and any other vinyl monomer.

Resist resin II according to the present invention comprises a bridged-bond-containing aliphatic ring, at least two oxygen-containing polar groups being combined with a tertiary carbon atom of the bridged-bond-containing aliphatic ring.

Resist resin III according to the present invention comprises a bridged-bond-containing aliphatic ring, at least one carbon constituting the bridged-bond-containing aliphatic ring being combined with oxygen through double bond.

A resist composition according to the present invention comprises one of the above resist resins I, II and III, and a photo acid generator.

A pattern forming process according to the present invention comprises the steps of:

coating a resist composition comprising one of the above-described resist resins onto a substrate, subjecting the resist composition coated onto the substrate to pattern-wise exposure, and developing the resist composition exposed to light.

Further, a process for producing a semiconductor device according to the present invention comprises the steps of:

coating the above-described resist composition onto a substrate, subjecting the resist composition coated onto the substrate to pattern-wise exposure, developing the resist composition exposed to light, thereby forming a patterned photomask, and etching an etching film by dry etching, using the photomask as a mask.

DESCRIPTION OF DRAWINGS

In the drawings,

FIGS. 1 to 3 are cross-sectional views showing processes for producing semiconductor devices, using resist compositions of the present invention.

DETAILED DESCRIPTION OF THE INVENTION

Figure 1:
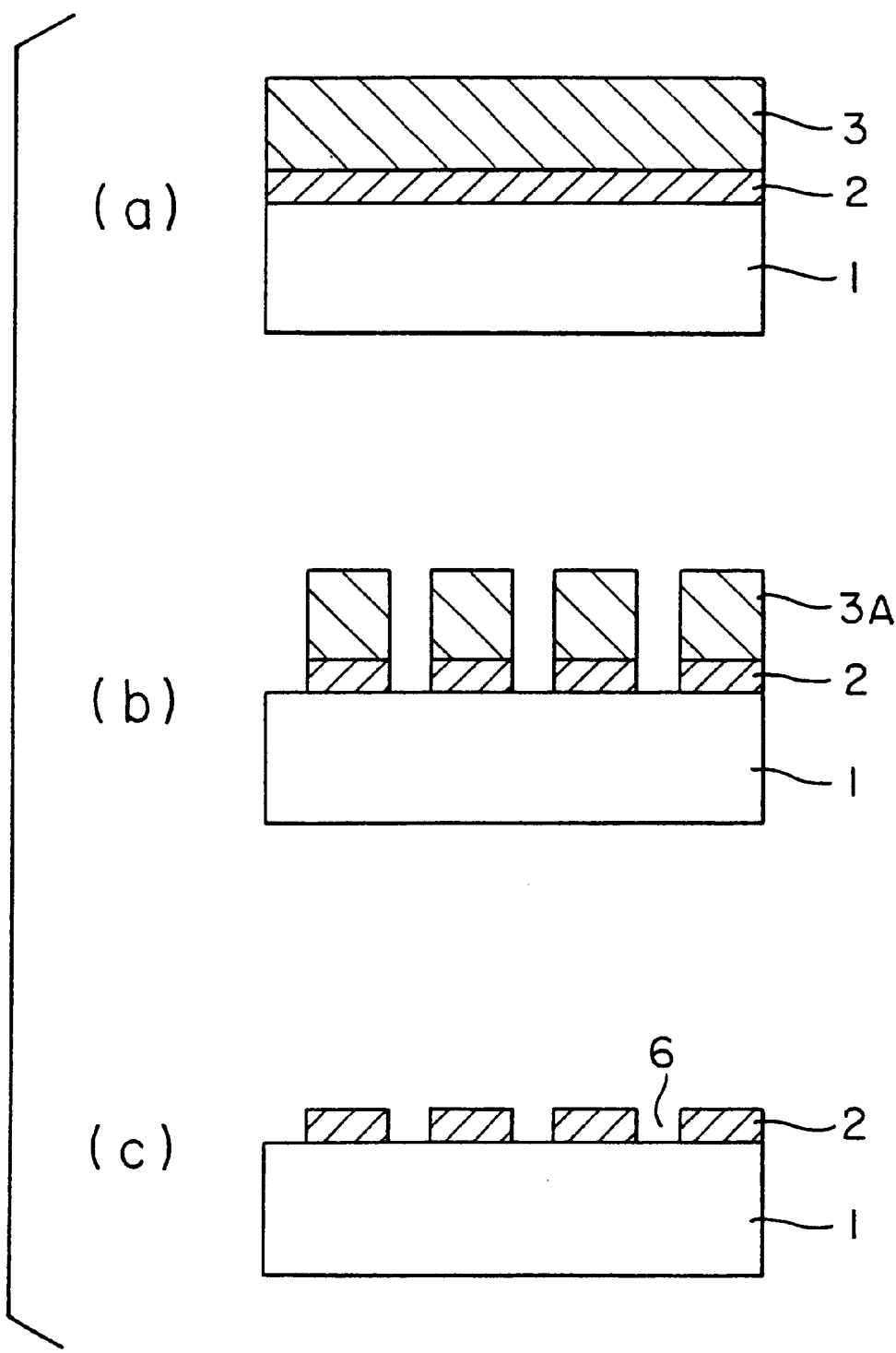

The present invention relates to a resist resin obtainable by homopolymerizing at least one monomer selected from monomers represented by the following general formulas (I-1) and (I-2):

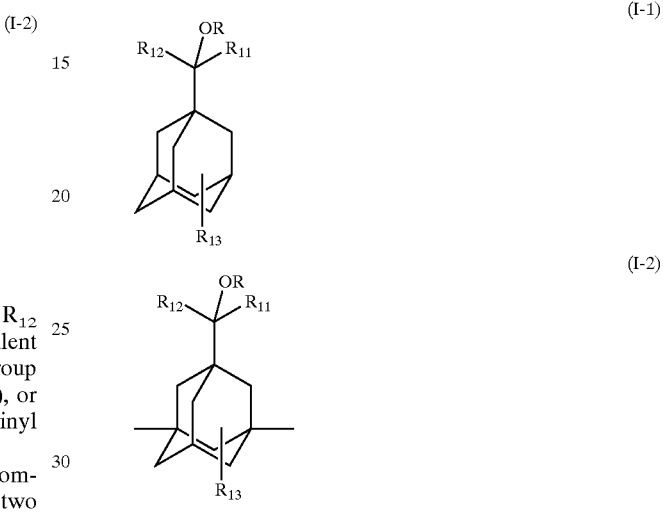

or by copolymerizing the monomer(s) and any other vinyl monomer.

The present invention also relates to a resist resin having a bridged-bond-containing aliphatic ring, at least two oxygen-containing polar groups being combined with a tertiary carbon atom of the bridged-bond-containing aliphatic ring.

Further, the present invention relates to a resist resin comprising a polymer or condensate of a monomer having a bridged-bond-containing aliphatic ring composed of at least two rings selected from the group consisting of 5-membered rings, 6-membered rings and 7-membered rings, at least two oxygen-containing polar groups being combined with a tertiary carbon atom of the bridged-bond-containing aliphatic ring.

Furthermore, the present invention relates to a resist composition comprising the above-described resist resin, and a photo acid generator.

Furthermore, the present invention relates to a pattern forming process comprising the steps of coating the above-described resist composition onto a substrate, subjecting the resist composition coated onto the substrate to pattern-wise exposure, and developing the resist composition exposed to light.

By the use of the resist resin, resist composition, and pattern forming process according to the present invention, it is possible to form, by means of alkali development, a resist pattern excellent in transparency against short-wavelength light, dry-etching resistance, and resolution.

A resist composition according to the present invention comprises as main components a resist resin and a photo acid generator. These components will be explained in detail hereinafter.

Resist Resins

Resist resins according to the present invention will be described hereinafter.

[Resist Resin I]

In one aspect of the present invention, resist resin I is obtained by homopolymerizing at least one monomer selected from monomers represented by the following general formulas (I-1) and (I-2):

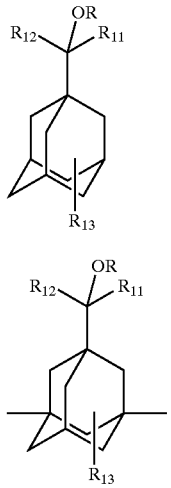

(I-1)

(I-2)

wherein R is acryloyl or methacryloyl group, $R_{11}$ and $R_{12}$ independently represent hydrogen atom or a monovalent alkyl group, and $R_{13}$ is OH group, =O group, COOH group or $COOR_{14}$ group ($R_{14}$ is a monovalent organic group), or by copolymerizing the monomer(s) and any other vinyl monomer.

In the monomers represented by the general formulas (I-1) and (I-2), $R_{11}$ and $R_{12}$ are hydrogen atom or a monovalent alkyl group. Since these groups are released and decomposed more sensitively in the presence of an acid, the resist resin becomes alkali-soluble. It is preferable that $R_{11}$ and $R_{12}$ be not hydrogen atom at the same time, but methyl, ethyl, propyl or isopropyl group because the latter groups are released and decomposed more sensitively than hydrogen atom.

$R_{13}$ is OH group, =O group, COOH group, or $COOR_{14}$ group ($R_{14}$ is a monovalent organic group). Since the resist resin contains $R_{13}$, it shows reduced hydrophobicity. By introducing this group, it has become possible to improve the adhesion between a photosensitive resist composition and a substrate, and the alkali-solubility of a polymer. In order to enhance this function, a plurality of $R_{13}$s may be introduced. In particular, =O group is preferred because it hardly causes undesirable reaction with other groups introduced as side chains. It is preferable that OH group, COOH group or $COOR_{14}$ group ($R_{14}$ is a monovalent organic group) introduced as $R_{13}$ is combined with a tertiary carbon atom as will be described in [Resist Resin II]. Further, although R is acryloyl or methacryloyl group, acryloyl or methacryloyl group substituted with cyano group or halogen atom is also included in the scope of the present invention.

In the case where a copolymer of a monomer represented by the general formula (I-1) or (I-2) and another vinyl monomer is used, the content of the monomer represented by the general formula (I-1) or (I-2) is preferably from 10 to 90 mol %, more preferably from 30 to 70 mol % of the copolymer. When this monomer content is less than 10 mol %, there may not fully be obtained such a function that the unexposed area of the resist resin remains closely adhered to a substrate and keeps dry-etching resistance high, while the exposed area of the resist resin releases the alicyclic structure to increase the alkali-solubility of the polymer. In contrast, when the monomer content exceeds 90 mol %, it becomes difficult to control the alkali-solubility of the polymer, so that the production cost tends to increase.

The vinyl monomer that is copolymerized with a monomer represented by the general formula (I-1) or (I-2) is preferably at least one monomer selected from monomers represented by the following general formulas (I-3), (I-4), (I-5), (I-6) and (I-7):

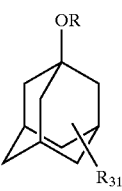

(I-3)

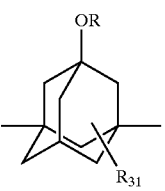

(I-4)

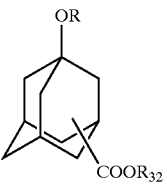

(I-5)

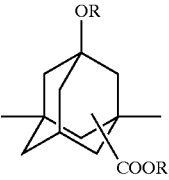

(I-6)

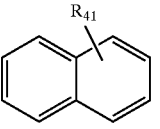

(I-7)

wherein $R_{31}$ represents hydrogen atom, or at least one group selected from the group consisting of OH group, $OR_{14}$ group ($R_{14}$ is a monovalent organic group) and =O group, $R_{32}$ represents hydrogen atom or a monovalent organic group, and $R_{41}$ represents vinyl, acryloyl or methacryloyl group.

When any of these monomers is copolymerized with a monomer represented by the general formula (I-1), a copolymer having improved alkali-solubility and dry-etching resistance can be obtained. Such a copolymer can therefore impart further improved functions to a resist composition. In particular, when a monomer represented by the general formula (I-7) is used, the resulting copolymer shows improved dry-etching resistance, so that the use of this monomer is more preferred. Further, a monomer represented by the formula (I-2) is more preferable than a monomer represented by the formula (I-1); a monomer represented by the formula (I-4) is more preferable than a monomer represented by the formula (I-3); and a monomer represented by the formula (I-6) is more preferable than a monomer represented by the formula (I-5). This is because monomers represented by the formulas (I-2), (I-4) and (I-6) have higher carbon contents than those represented by the formulas (I-1), (I-3) and (I-5), respectively, so that the former monomers are more excellent than the latter monomers in resistance to ordinary energy gases such as $CF_4$.

Further, vinyl monomers other than monomers represented by the above general formulas (I-3), (I-4), (I-5), (I-6) and (I-7) may also be used. In this case, it is desirable that the vinyl monomers have bridged-bond-containing alicyclic structure. The bridged-bond-containing alicyclic structure includes cyclic cyclo or bicyclo compounds represented by the general formula $C_nH_{2n}$ (n is an integer of 3 or more), and condensed rings thereof. Specific examples of this structure include cyclobutane ring, cyclopentane ring, cyclohexane ring, cycloheptane ring, cross-linked-hydrocarbon-introduced cyclobutane, cyclopentane, cyclohexane and cyclopentane rings, spiro rings such as spiroheptane and spirooctane, terpene rings such as norbonyl ring, adamantyl ring, bornene ring, menthyl ring and menthane ring, steroidal skeletons such as thujane, sabinene, thujone, carane, carene, pinane, norpinane, bornane, fenchane, tricyclene and cholesteric rings, bile acid, digitaloides, camphor ring, isocamphor ring, sesquiterpene ring, santone ring, diterpene ring, triterpene ring, and steroid saponins.

Further, it has been known that, since the wavelengths of absorption bands are shifted not only by alicyclic structure but also condensed polycyclic structure, the transparency at 193 nm can be ensured even by condensed polycyclic structure (T. Ushirogouchi et al., Proc. SPIE, Vol. 2195 (1994), page 205, etc.). Therefore, the object of the present invention can be attained even by vinyl monomers having condensed polycyclic structure.

Examples of vinyl monomers having condensed polycyclic structure are as follows: indene, indane, benzofulvene, 1-indanone, 2-indanone, 1,3-indandione, ninhydrin, naphthalene, methylnaphthalene, ethylnaphthalene, dimethylnaphthalene, cadalene, vinylnaphthalene, 1,2-dihydronaphthalene, 1,4-dihydronaphthalene, 1,2,3,4-tetrahydronaphthalene tetralene, 1,2,3,4,5,6,7,8-octahydronaphthalene, cis-decalene, trans-decalene, fluoronaphthalene, chloronaphthalene, bromonaphthalene, iodonaphthalene, dichloronaphthalene, (chloromethyl) naphthalene, 1-naphthol, 2-naphthol, naphthalene diol, 1,2,3,4-tetrahydro-1-naphthol, 1,2,3,4-tetrahydro-2-naphthol, 5,6,7,8-tetrahydro-1-naphthol, 5,6,7,8-tetrahydro-2-naphthol, decahydro-1-naphthol, decahydro-2-naphthol, chloronaphthol, nitronaphthol, aminonaphthol, methoxynaphthalene, ethoxynaphthalene, naphthyl ether, naphthyl acetate, naphthoaldehyde, naphthalene dicarbaldehyde, hydroxynaphthoaldehyde, dinaphthyl ketone, 1(2H)-nephthalene, alpha-tetralone, beta-tetralone, alpha-decalone, beta-decalone, 1,2-naphthoquinone, 1,4-naphthoquinone, 2,6-naphthoquinone, 2-methyl-1,4-naphthoquinone, 5-hydroxy-1,4-naphthoquinone, isonaphthazaline, naphthoeic acid, 1-naphthol-4-carboxylic acid, naphthalic acid, naphthalic anhydride, 1-naphthylacetic acid, thionaphthol, N,N-dimethylnaphthylamine, naphthonitrile, nitronaphthalene, pentalene, azulene, heptalene, fluorene, 9-phenylfluorene, nitrofluorene, 9-fluorenol, fluorenone, anthracene, methylanthracene, dimethylanthracene, 9,10-dihydroanthracene, anthrol, anthranol, hydroanthranol, dihyroxyanthracene, anthragallol, 1(4H)-anthracenone, anthrone, anthrarobin, chrysarobin, oxanthrone, anthracenecarboxylic acid, anthramine, nitroanthracene, anthracenequinone, anthraquinone, methylanthraquinone, hydroxyanthraquinone, phenanthrene, phenanthrol, phenanthrenehydroquinone, phenanthraquinone, biphenylene, s-indacene, as-indacene, phenarene, teracene, chrysene, 5,6-chrysoquinone, pyrene, 1,6-pyrenequinone, triphenylene, benzo[alpha]anthracene, benzo[alpha]anthracene-7,12-quinone, benzanthrone, aceanthrene, acephenanthrylene, acephenanthrene, 17H-cyclopeneta [alpha]-phenanthrene, fluoranthene, pleiadene, pentacene, pentaphen, picene, pirylene, dibenzo[a,j]anthracene, benzo[alpha]pyrene, coronene, pyranthrene, and pyranthrone.

The resist resin according to the present invention can be obtained by polymerizing, by means of radical, cationic or anionic polymerization, a polymerizable compound having, in its molecule, alicyclic structure into which an acidic substituent has been introduced, and polymerizable double bond. In general, a monomer having polymerizable double bond like one in an alicylic group contained in polymer backbone can produce a high-molecular-weight polymer when it is subjected to cationic or anionic polymerization. However, in the present invention, even if the molecular weight of the resist resin is low, there is no problem as long as a film can be formed by the use of the resin. Therefore, the polymerization may be conducted by a simple technique such as radical polymerization, and the resulting polymer that is a mixture of low-molecular-weight compounds and high-molecular-weight compounds may also be used as the resist resin.

At this time, the polymerizable compound may also be copolymerized with acrylic acid, maleic anhydride, an ester substitution product of acrylic acid or maleic anhydride, vinyl phenol, vinyl naphthol, hydroxyethyl methacrylate, $SO_2$, or the like.

Further, it is also possible to control the alkali-solubility of the polymer, and to improve the adhesion between the resist and a substrate by copolymerizing the polymerizable compound and an alkali-soluble compound whose alkali-soluble group has been protected by a group decomposable by an acid, having dissolution-preventing ability. However, when the transparency of the resist against short-wavelength light is taken into consideration, it is preferable to copolymerize the polymerizable compound and a compound having no molecular skeleton whose light absorption in short-wavelength ranges is great, such as benzene nucleus. Specifically, it is desirable that the absorbance of the polymer against light having a wavelength of 193 nm be 4 or less, preferably 2 or less per 1 micrometer. In the case where the resist composition of the present invention is used as an upper resist to be coated onto a substrate having an intermediate layer, the above absorbance may be made as high as approximately 8 per 1 micrometer.

It is preferable to make the average molecular weight of the resist resin according to the present invention in the range of 1,000 to 500,000, more preferably in the range of 3,000 to 50,000. A resist resin having an average molecular weight of less than 1,000 is unfavorable for forming a resist film having sufficiently high mechanical strength. On the contrary, when the average molecular weight of the resist resin is made higher than 500,000, it becomes difficult to form a resist pattern excellent in resolution. These compounds are, in general, mixtures of the compound of the present invention and other copolymers having various molecular weights.

The resist resin according to the present invention shows its effects even when it has a relatively low molecular weight; and even if the average molecular weights of the components of the resin are localized in the range of, for example, 500 to 1,000, the resist resin is prevented from being dissolved unevenly. Therefore, such a resin is also desirable one. Moreover, in this case, even if the monomers are remaining in the resin in a large amount, the dissolution properties and dry-etching resistance of the resin are hardly marred.

[Resist Resin II]

Resist resin II according to the present invention comprises, in its main or side chain, a bridged-bond-containing aliphatic ring, at least two oxygen-containing polar groups being combined with a tertiary carbon atom of the bridged-bond-containing aliphatic ring.

In the resist resin II according to the present invention, at least two oxygen-containing polar groups are combined with a tertiary carbon atom of the above-described bridged-bond-containing aliphatic ring. When three or more oxygen-containing polar groups are combined with a tertiary carbon atom of the above-described bridged-bond-containing aliphatic ring, these groups can highly contribute to the improvement in adhesion between the resin and a substrate, and in the alkali-solubility of the resin. Therefore, such a resin is more preferred.

The oxygen-containing polar groups combined with one bridged-bond-containing aliphatic ring may be the same or different.

In the present invention, the oxygen-containing polar group is a substituent having carbon-oxygen bond, a difference in electronegativity between carbon and oxygen being great.

Examples of such a group include substituted or unsubstituted carboxyl groups, substituted or unsubstituted cyclic lactone groups, substituted or unsubstituted hydroxyl groups, aldehyde group, groups containing peroxides, substituted or unsubstituted urethane groups, acyl groups, and carbonate groups.

When the oxygen-containing polar groups are combined with a tertiary carbon atom of the bridged-bond-containing aliphatic ring through —$(CH_2)n$— (n is a natural number), these polar groups have high degree of freedom of movement. Therefore, there cannot be obtained the effects equal to those obtainable when the oxygen-containing polar groups are combined directly with a tertiary carbon atom of the bridged-bond-containing aliphatic ring. For this reason, such a case is excluded from the state of "oxygen-containing polar groups combined with a tertiary carbon atom".

In view of the properties of the resist composition, it is particularly desirable when polarity is taken into consideration that the oxygen-containing polar group be at least one organic group selected from substituted or unsubstituted carboxyl groups, substituted or unsubstituted hydroxyl groups, and substituents containing cyclic lactones. By the use of these groups, the effects of improving adhesion and solubility can be obtained.

Further, such an oxygen-containing polar group is preferred that the substituent introduced to the carboxyl group be a cyclic lactone. It is also preferable that the carboxyl group form an acid anhydride together with another bridged-bond-containing alicyclic compound having a carboxylic acid. This is because a compound having such an oxygen-containing polar group shows particularly increased solubility.

Furthermore, the bridged-bond-containing aliphatic ring may contain not only two or more oxygen-containing polar groups at a tertiary carbon atom of the ring, but also a non-reactive polar group such as ketone or lactone introduced to the secondary or primary carbon atom of the ring.

The resist resin II reveals its effects through the following action.

The above-described oxygen-containing polar group is restricted in its movement around carbon as compared with the conventional case where the polar group is combined with carbon at the secondary or primary carbon atom. For instance, in the case of a resin having a bridged-bond-containing aliphatic ring in which hydroxyl group is introduced to the carbon atom, the hydroxyl group has freedom of movement only in the direction around the carbon, and the molecular motion of the hydroxyl group is thus small. In contrast, when hydroxyl group is introduced to carbon at the secondary or primary carbon atom of the ring, it has freedom of movement not only in the direction around the carbon but also in the direction parallel to the carbon. The molecular motion of such hydroxyl group is thus great.

For this reason, when a resin having a bridged-bond-containing aliphatic ring, oxygen-containing polar groups being introduced to tertiary carbon atom of the bridged-bond-containing aliphatic ring is used as the base resin of a resist composition, the free volume is decreased, so that the resist composition has a high glass transition temperature (Tg). As a 35 result, high resolution can be obtained.

In fact, when a resin having such a structure that OH group has been introduced to carbon at the 2-position of a bridged-bond-containing aliphatic ring is compared with a resin having such a structure that OH group has been introduced to tertiary carbon atom of a bridged-bond-containing aliphatic ring, the latter is found to have a Tg about 10 to 20° C. higher than that of the former. Moreover, a resin in which OH group has been introduced to an alicyclic skeleton through methylene, like conventionally known hydroxymethyltricyclodecanyl acrylate compounds, has a Tg 10 to 20° C. lower than the above-described resin having OH group at the secondary carbon atom of the bridged-bond-containing aliphatic ring. Therefore, the difference between this resin and the resin having OH group at the 3-position of the bridged-bond-containing aliphatic ring becomes more evident.

In addition, since the molecular motion of OH group introduced to tertiary carbon atom of the ring is small as mentioned previously, a developer hardly penetrates the unexposed area. Therefore, the pattern scarcely swells.

Moreover, the resin according to the present invention should have two or more oxygen-containing polar groups introduced to tertiary carbon atom of a bridged-bond-containing aliphatic ring. These groups play an important role in improvement in adhesion to a substrate and alkali-solubility which are the essential properties of resists. Since these groups are combined with tertiary carbon atom, they have freedom of movement only in the direction around the carbon, and cannot turn laterally. It is therefore highly probable that these groups turn to outside in terms of the backbone. For this reason, the resin has higher compatibility with an alkaline solvent that is brought into contact with the resin, and higher adhesion to a substrate.

Oxygen-containing polar groups, especially OH group and COOH group, combined with carbon at the secondary or primary carbon atom show high reactivity, so that they tend to cause secondary cross-linking reaction by heating. In particular, chemically amplified positive resists have such a crucial problem that pattern formation cannot be attained while they are processed by heating. This tendency can be more remarkable when the resin has acid anhydride structure.

However, oxygen-containing polar groups combined with tertiary carbon atom as in the present invention show low reactivity, and hardly-cause secondary cross-linking reaction when heated. Therefore, the aforementioned problem is not brought about in this case.

Thus, according to the present invention, it is possible to form, by alkali development, a resist pattern excellent in transparency against short-wavelength light, dry-etching resistance, adhesion and resolution.

In the resist resin II according to the present invention, the percentage of the bridged-bond-containing alicyclic ring is desirably from 20 to 905 by weight of the resin. When this percentage is not within this range, the resist resin has reduced dry-etching resistance or alkali-solubility.

In the resin according to the present invention, it is desirable that at least one of the above-described oxygen-containing polar groups be COOH group protected by a dissolution-preventive group (a soluble group which can be decomposed by an acid). If the resin has such a group, the resist layer shows alkali-solubility after it has caused deprotection reaction by an acid. Further, the rate of dissolution of the unexposed area is reduced due to the existence of the protective group, so that high dissolution contrast can be attained. In addition, since the resin has hydrophilicity, the alkali-solubility of the resin is also maintained properly.

In particular, a resin obtained by copolymerizing hydroxyadamantyl acrylate having hydroxyl group combined with tertiary carbon atom and tetrahydropyranyl acrylate can be mentioned as an example of the resin having the above-described protective group. This resin has, in its unexposed area, no alkali-soluble group but has hydroxyl group protruding from its polymer chain; the resin thus shows increased hydrophilicity.

Therefore, the unexposed area of the resist film will never be unevenly dissolved. In addition, the resist film shows increased adhesion to a substrate.

Furthermore, it is desirable that the resin in the present invention contains acid anhydride structure in its structure, that is, in its main or side chain, and that at least one of the above-described oxygen-containing polar groups is hydroxyl group. Namely, in the case where the resin contains, in its structure, both OH group that is not involved in linkage, and acid anhydride structure, a secondary self-crosslinking reaction is suppressed. Therefore, the effects of the polar groups combined with tertiary carbon atom become remarkable, and the resin shows high contrast. Such a resin is thus desirable as a positive resist.

The resin according to the present invention can be obtained by polymerizing or condensing starting monomers in one of the following combinations i) to iv), by any of various means such as radical polymerization or living polymerization:

i) a combination of one or more monomers comprising a bridged-bond-containing aliphatic ring, at least two oxygen-containing polar groups being combined with tertiary carbon atom of the bridged-bond-containing aliphatic ring (structure A);

ii) a combination of one or more monomers having the structure A, and one or more monomers comprising a bridged-bond-containing aliphatic ring, least two oxygen-containing polar groups being combined with secondary or primary carbon atom of the bridged-bond-containing aliphatic ring (structure B);

iii) a combination of one or more monomers having the structure A, and one or more monomers having structure (structure C) that is neither the structure A nor the structure B; and iv) a combination of one or more monomers having the structure A, one or more monomers having the structure B, and one or more monomers having the structure C.

The bridged-bond-containing aliphatic ring and oxygen-containing polar groups contained in the structure A or B can include the previously-mentioned bridged-bond-containing aliphatic rings and oxygen-containing polar groups, respectively.

In the case where the resin according to the present invention is obtained by using monomers in the above combination (i) or (ii), it is desirable that the oxygen-containing polar groups combined with the bridged-bond-containing aliphatic ring contained in the resin be combined with tertiary carbon atom as many as possible. It is sufficient that at least 705, more preferably 905 or more of the oxygen-containing polar groups combined with the bridged-bond-containing aliphatic ring are combined with tertiary carbon atom of the ring. There may be such a case that a monomer having the structure A is to contain a monomer having oxygen-containing polar groups combined with carbon at the 2-position due to the side reaction caused when the former monomer is synthesized, inevitably becoming equal to the above combination (ii). Such a case is also permissible.

When the resin according to the present invention is obtained by using monomers in the combination of (iii) or (iv), the effects of the monomer in which oxygen-containing polar groups are introduced to tertiary carbon atom can be observed when the monomer having the structure A exceeds at least 15%, more preferably 20% or more of the total molar amount of the monomers constituting the resin, although this percentage may vary depending upon the copolymerization ratio of the monomer having the structure A to the other monomers.

A monomer useful as the starting monomer in the present invention, having a bridged-bond-containing aliphatic ring, at least two oxygen-containing polar groups being combined with tertiary carbon atom of the bridged-bond-containing aliphatic ring (structure A) can be obtained by oxidizing an alicyclic compound, and extracting the desired component. Alternatively, the above monomer can conveniently be obtained by partly hydrolyzing an alicyclic compound by bromination, or by means of air oxidation using a catalyst (Japanese Patent Laid-Open Publication No. 35522/1999). Further, it is also possible to use acrylated or methacrylated compounds obtained by further subjecting the above-obtained compounds to addition reaction using a catalyst, or to esterification to be carried out by an acid chloride process.

In the case where the resin of the present invention is obtained by polymerization, it is desirable to use a monomer having the structure A, and, as a monomer having another structure, an acrylic or vinyl compound. It is particularly preferable to use, as the monomer, an acrylic compound to obtain an acrylic or methacrylic resin because it is readily polymerizable. An acrylic or methacrylic resin can be obtained by polymerizing, as the monomer having the structure A, a monomer whose bridged-bond-containing aliphatic ring contains, as the oxygen-containing polar groups, at least one acryloyloxy or methacryloyloxy group. The acryloyloxy or methacryloyloxy group may be substituted with cyano group or halogen atom.

In particular, when the resin of the present invention is obtained by polymerizing, as the monomer having the structure A, a compound represented by the following general formula (II-1) or (II-2), it shows excellent dry-etching resistance, solubility and adhesion, and has a high glass transition temperature; such a resin is thus desirable.

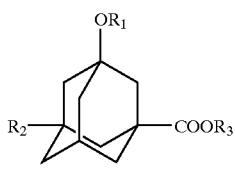

(II-1)

wherein $R_1$ represents acryloyl or methacryloyl group, $R_2$ represents hydrogen atom or an oxygen-containing polar group, and $R_3$ represents hydrogen atom, a group decomposable by an acid, a cyclic substituent having a lactone, or a substituent having acid anhydride structure formed with a bridged-bond-containing alicyclic compound containing a carboxylic acid.

Examples of the group for $R_3$, decomposable by an acid include tert-butyl group, tetrahydropyranyl group and acetal group. Further, in order to obtain high contrast between exposed and unexposed areas, it is desirable that $R_3$ can also act as a dissolution-preventive group.

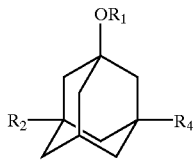

(II-2)

wherein $R_1$ represents acryloyl or methacryloyl group, $R_2$ represents hydrogen atom or an oxygen-containing polar group, and $R_4$ represents hydroxyl group, a cyclic substituent having a lactone, or a substituent having acid anhydride structure formed with a bridged-bond-containing alicyclic compound containing a carboxylic acid.

In the case where the resin of the present invention is obtained by condensation, the resin is desirably an alicyclic-backbone-type polymer or oligomer obtainable by dehydration condensation, using, as the monomer having the structure A, a monomer having a bridged-bond-containing aliphatic ring in which two or more organic groups of at least one of carboxyl group and hydroxyl group are combined with tertiary carbon atom, or a monomer further having lactone structure at tertiary carbon atom.

In the above-described polymer or oligomer, the monomer is combined with the backbone of the polymer through linkage decomposable by an acid. Examples of this linkage include ester linkage and acid anhydride linkage. In this case, the resin is of alicyclic backbone type, and has polyester or polyacid anhydride structure.

When the resin has the polyester or polyacid anhydride structure of alicyclic backbone type, the resist composition undergoes, before and after exposure, drastic decomposition of the molecular skeleton including the backbone of the resin, and high resolution can thus be obtained. Moreover, the number of free secondary oxygen-containing polar groups is small in this resin, so that dehydration condensation side reaction is scarcely caused and that the resin has a high Tg. Such a resin is therefore desirable. Further, since the resin has bridged-bond-containing alicyclic structure, the solubility of the exposed area of the resist is remarkably improved with the coating performance and adhesion of the resist maintained high. Moreover, the dissolution contrast between exposed area and unexposed area can be improved. In addition, since the resist has bridged-bond-containing alicyclic structure in its backbone, it can also show sufficiently high dry-etching resistance.

In particular, when the resin according to the present invention has a polyester or polyacid anhydride linkage that is formed by dehydration condensation between carboxyl group and hydroxyl group, and/or between carboxyl groups, the resin is excellent in the property of being decomposed by an acid, has high stability and high transparency, and can readily be synthesized. This resin is thus desirable.

The above-described ester linkage is obtained by the dehydration condensation of a polyvalent carboxylic acid with an alicyclic polyvalent alcoholic compound, using a catalyst; or by the desalting of a polyvalent carboxylic acid chloride with a polyvalent alcoholic compound. Alternatively, the ester linkage may be obtained by the dehydration condensation of one or more compounds containing a plurality of carboxyl groups and alcohol groups.

The above-described acid anhydride linkage is obtained by the dehydration condensation of one or more polyvalent carboxylic acid compounds.

The resin may contain several types of linkage (e.g., ester linkage and acid anhydride linkage) at the same time when the linkage of different types is formed by the same type of reaction, especially by dehydration condensation reaction.

In general, polymers or oligomers containing acid anhydride linkage have such an advantage that they are excellent in alkali-solubility. It is generally considered that these acid anhydride compounds are readily hydrolizable and unstable. However, acid anhydride linkage that is interposed between bulky alicyclic compounds as in the present invention is extremely stable, and imparts alkali-solubility suitable for pattern formation. On the other hand, polymers or oligomers having ester linkage are stable in any solvent, and show a great change in dissolution rate as the decomposition of an acid catalyst proceeds, so that they have the advantage of improving the resolution. By using these different types of linkage in combination, the solubility and resolution that are more preferable for resists can be obtained at the same time. In this case, it is sufficient that the ratio of acid anhydride linkage to ester linkage is from 1:20 to 5:1; and, more preferably, the acid anhydride linkage content is 10% or more and less than 50%.

Further, a resin containing acid anhydride structure in its structure, that is, in the main or side chain, wherein at least one of the above-described oxygen-containing polar groups is hydroxyl group is desirable as the resin of the present invention as mentioned previously.

Such a resin may be obtained by polymerizing or condensing, in the previously mentioned manner, a monomer having the structure A in which at least one of the oxygen-containing polar groups is hydroxyl group. For instance, not only poly(ester-acid anhydride) compounds but also copolymers comprising alicyclic structure having OH group at its 3-position, and maleic anhydride can be mentioned.

On the other hand, examples of compounds having the structure C include the following: tert-butyl acrylate, tert-butyl methacrylate, methacrylic acid, acrylic acid, alpha-chloroacrylic acid and esters thereof, trifluoromethyl acrylate, alpha-methylstyrene, trimethylsilyl methacrylate, trimethylsilyl alpha-chloroacrylate, trimethylsilylmethyl alpha-chloroacrylate, maleic anhydride, tetrahydropyranyl methacrylate, tetrahydropyranyl alpha-chloroacrylate, methyl methacrylate, t-butyl alpha-chloroacrylate, butadiene, glycidyl methacrylate, isobornyl methacrylate, menthyl methacrylate, norbornyl methacrylate, adamantyl methacrylate, cycloolefin compounds, acrylates having lactone skeleton in acrylic side chains, and acrylates having epoxy skeleton. Of these, tetrahydropyranyl methacrylate and maleic anhydride are particularly preferable for improving the resolution because they do not cause secondary reaction that is commonly caused. Further, in order to improve the dry-etching resistance of a resin, cycloolefin compounds are conveniently used as comonomers; and in order to improve the developability, acrylic compounds having lactone skeleton in the side chains thereof are conveniently used as comonomers.

In the case where the resin according to the present invention is an arylic or methacrylic resin, the weight-average molecular weight (Mw) of the resin, calculated in terms of polystyrene, is preferably from 2,000 to 100,000, more preferably from 5,000 to 60,000 although it may vary depending upon the desired properties of the resist composition. When the Mw is less than 2,000, the resin tends to have poor film-forming properties. On the other hand, when the Mw is in excess of 100,000, the resin tends to have decreased developability and resolution. Further, the molecular-weight distribution Mw/Mn is preferably from 1 to 5, more preferably from 1 to 2.

Further, in the case where the resin according to the present invention is a polyester or polyacid anhydride condensate of alicyclic backbone type, it is preferable to adjust the average molecular weight of the resin, calculated in terms of polystyrene to 100–30,000. A resin having an average molecular weight of less than 100 is unfavorable for forming a resist film excellent in mechanical strength, heat resistance, and coating performance. On the other hand, when the average molecular weight of the polymer compound is in excess of 30,000, the compound has impaired alkali-solubility, so that it becomes difficult to form a resist pattern with high resolution. These compounds are generally mixtures of components having various molecular weights.

The resin of the present invention reveals its effects even when it has relatively low molecular weight like a dimer; and, even such a resin that the average molecular weights of its components are localized, for example, to the range of 100 to 1,000 is also effective. Further, in this case, even if less than 105 of the monomers is remaining in the copolymer, the copolymer scarcely undergoes deterioration of dissolution properties or dry-etching resistance.

[Resist Resin III]

Resist resin III that is the base of a resist composition of the present invention comprises a bridged-bond-containing aliphatic ring in its structure.

The bridged-bond-containing aliphatic ring is a combination of at least two aliphatic rings selected from 5-membered rings, 6-membered rings and 7-membered rings. The aliphatic rings may be either the same or different in terms of the number of members constituting one ring. In addition, the bridged-bond-containing alicyclic skeleton may contain, in addition to carbon, such elements as oxygen, sulfur and nitrogen.

The above bridged-bond-containing aliphatic ring can include those aliphatic rings enumerated in the item of [Resist Resin I].

The resist resin III according to the present invention contains the above-described bridged-bond-containing aliphatic ring in its structure, at least one of the carbons constituting the bridged-bond-containing aliphatic ring being combined with oxygen through double bond to form >C=O.

It is desirable that the resin according to the present invention be incorporated into a resist composition so that the amount of >C=O will be 405 by weight or more of the solid matter of the resist composition. When this amount is less than 405 by weight, it is difficult to obtain, by alkali development, a resist pattern excellent in both resolution and adhesion. Moreover, the resulting resist pattern may have impaired dry-etching resistance.

Further, the resin according to the present invention may be a resin having the above-described bridged-bond-containing alicyclic skeleton in its structure, at least one of the rings constituting the bridged-bond-containing alicylic skeleton being a lactone ring; that is, a resin containing —C(=O)—O— in one ring.

A resin having such bridged-bond-containing alicyclic skeleton containing a lactone ring is to have further improved alkali-solubility, dry-etching resistance and adhesion.

When the bridged-bond-containing alicyclic skeleton in the resin is a lactone ring, the resin can show hydrophilicity higher than that of a resin to which a substituent containing OH, sulfonyl or nitro group has been introduced as mentioned in PRIOR ART. Moreover, since such a resin is not so reactive as a resin having a substituent containing OH group, side reaction by which a resist is made negative hardly occurs.

In this case, it is preferable that the components are so incorporated that the amount of lactonyl group will be 30 mol % or more of the resin. When this amount is less than 30 mol %, it is difficult to form, by alkali development, a resist pattern excellent in both resolution and adhesion. Moreover, the resulting resist pattern tends to have decreased adhesion.

The resin of the present invention can be made in the following manner (a) or (b). (a) Some of the carbons contained in an alicyclic compound having the above-described bridged-bond-containing aliphatic ring are oxidized by the use of a strong oxidizing agent. By this, methylene carbon contained in the bridged-bond-containing aliphatic ring is oxidized, and an alicyclic compound (alicyclic compound (A)) having the bridged-bond-containing aliphatic ring into which >O=O has been introduced can be obtained.

By further allowing the oxidizing agent to act on this compound to cause oxidation, —O— is introduced into the ring. Thus, there can be obtained an alicyclic compound (alicyclic compound (B)) having the bridged-bond-containing aliphatic ring whose bridged-bond-containing alicyclic structure has been made into a lactone ring.

A resin according to the present invention can then be obtained by homopolymerizing, as a monomer, the above alicylcic compound (A) or (B), or a derivative thereof obtained by introducing, into the alicyclic compound (A) or (B), a group that can act as a binding member during the polymerization step to be conducted later, or by copolymerizing such a monomer and any other monomer.

(b) A resin according to the present invention can be obtained by allowing a strong oxidizing agent to react with some of the carbons constituting a resin having the above-described bridged-bond-containing alicyclic skeleton to oxidize the carbons.

Specifically, the following [1] or [2] can be mentioned as the polymerization method described in the above (a).

[1] The alicyclic compound (A) or (B) which is a monomer useful for synthesizing a resin according to the present invention, or, as its derivative, a compound having polymerizable double bond is polymerized by means of radical, anionic, or cationic polymerization, or polymerization using a Ziegler-Natta catalyst. In general, a monomer having polymerizable double bond, such as one having alicyclic moiety in its main chain, can yield a polymer having a higher molecular weight when it is polymerized by the use of a Ziegler-Natta catalyst. However, the resin according to the present invention brings about no problem as long as it can form a film even if the molecular weight of the resin is low. Therefore, the monomer may be polymerized by a simple technique such as radical polymerization, and the resulting mixture of low-molecular-weight compounds and high-molecular-weight compounds may be used.

Examples of the above-described compound having polymerizable double bond include compounds obtained by oxidizing norbomyl di(mono)ene, tricyclodeca (mono)diene or tetracyclododeca (mono)diene to introduce <C=O or —C(=O)—O— into at least one of the aliphatic rings.

Further, it is preferable that the above-described compound containing polymerizable double bond be an alcohol or an ester compound of a carboxylic acid. This is because such a compound is readily polymerizable.

Furthermore, it is desirable that the above-described compound having polymerizable double bond be an acrylic or methacrylic ester compound. This is because such a compound has high polymerizability and can be polymerized at any composition ratio. It is more preferable that adamantane, tricyclodecane, tetracyclodecane or hydronaphthalene skeleton be contained in the side chain of the acrylic or methacrylic ester compound.

It is particularly desirable to obtain a resin of the present invention by polymerizing, as a monomer, a compound represented by the following general formula (III-1a) or (III-1b) because the resulting resin is excellent in dry-etching resistance and adhesion:

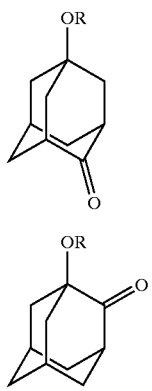

(III-1a)

(III-1b)

wherein R represents acryloyl or methacryloyl group.

In the compound represented by the general formula (1), carbonyl group may be introduced to the 2-position.

Further, it is desirable to obtain a resin of the present invention by polymerizing, as a monomer, a compound represented by the following general formula (III-2a) or (III-2b) because these compounds have high polymerizability and can be polymerized at any composition ratio:

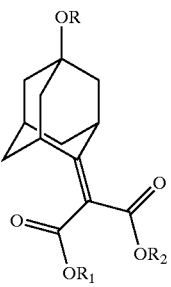

(III-2a)

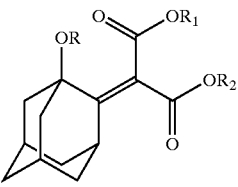

(III-2b)

wherein R represents acryloyl or methacryloyl group, and $R_1$ and $R_2$ represent an alkyl group or a group decomposable by an acid. $R_1$ and $R_2$ may be partly cross-linked to form a cyclic compound. Moreover, adamantylidene group may be introduced to the 2-position.

Furthermore, it is desirable to obtain a resin of the present invention by polymerizing, as a monomer, a compound represented by the following general formula (III-3a), (III-3b), or (III-3c) because the resulting resin is excellent in dry-etching resistance and adhesion:

(III-3a)

(III-3b)

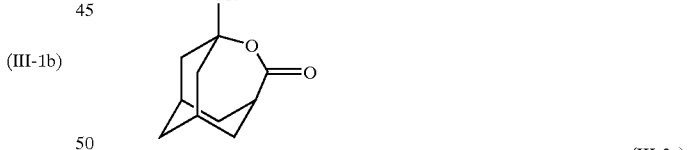

(III-3c)

wherein R represents acryloyl or methacryloyl group. The hydrogen atoms of compound (III-3a), (III-3b) and (III-3c) are able to be substituted by other substituent.

Furthermore, it is desirable to obtain a resin of the present invention by polymerizing, as a monomer, a compound represented by the following general formula (III-4) because this compound is highly polymerizable and can be polymerized at any composition ratio:

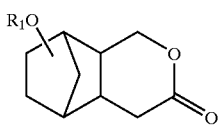
(III-4)

wherein R₁ represents acryloyl or methacryloyl group.

[2] At least either one of a polyester resin or a polyacid anhydride resin is obtained by homopolymerizing the alicyclic compound (A) or (B) that is a monomer useful for synthesizing a resin according to the present invention, or, as its derivative, a compound containing two or more organic groups of at least one of hydroxyl group and carboxyl group. Alternatively, the above compound and another compound containing two or more groups of at least one of hydroxyl group and carboxyl group may be subjected to condensation polymerization to obtain a desired resin.

[2]-1: A polyester resin can be obtained by the dehydration condensation of the alicyclic compound (A) or (B) that is a monomer useful for synthesizing a resin according to the present invention, or, as its derivative, a compound having monohydroxy-monocarboxylic acid skeleton. Alternatively, a polyester resin may be obtained by the dehydration condensation of the alicyclic compound (A) or (B) that is a monomer useful for synthesizing a resin according to the present invention, or, as its derivative, a polyvalent carboxylic acid compound containing two or more groups of at least one of hydroxyl group and carboxyl group with a polyvalent alcoholic compound. Further, a polyester resin may also be obtained by the reaction between the alicyclic compound (A) or (B) that is useful for synthesizing a resin according to the present invention, or a derivative of the alicyclic compound that is a polyvalent alcohol having two or more groups of at least one of hydroxyl group and carboxyl group and conjugated polycyclic condensed aromatic skeleton, and a polyvalent carboxylic acid. The above polyvalent carboxylic acid or polyvalent alcohol may be a mixture of two or more compounds.

A polyester resin can also be obtained not only by the above-described processes but also by any of widely-used processes for synthesizing polyesters, for instance, by carrying out the ring-opening reaction of a lactone, the polymerization of a polyvalent carboxylic acid and a polyvalent alcohol by the ring-opening reaction of an acid anhydride, or the polymerization of a polyvalent carboxylic acid and a polyvalent epoxy compound in the case where a polyvalent carboxylic acid chloride and a polyvalent alcohol are subjected to desalting reaction by the use of triethylamine or the like as a catalyst.

[2]-2: A polyacid anhydride resin can be obtained by the use of the alicyclic compound (A) or (B) that is useful for synthesizing a resin according to the present invention, or its derivative that is a polyvalent carboxylic acid having two or more groups of at least one of hydroxyl group and carboxyl group; this monomer is singly subjected to dehydration condensation. Alternatively, a polyacid anhydride resin can be obtained by using the alicyclic compound (A) or (B), or a derivative thereof that is a polyvalent carboxylic acid having two or more groups of at least one of hydroxyl group and carboxyl group, and a polyvalent carboxylic acid chloride; these monomers are subjected to desalting reaction by using triethylamine or like as a catalyst.

It is noted that the resin according to the present invention may contain both polyester linkage and polyacid anhydride linkage at the same time.

It is desirable to carry out dehydration condensation between a part of or all of >C=O contained in the resin of the present invention, and a compound having active methylene. By doing so, it is possible to further impart, to the resin, adhesion and the property of being decomposed by an acid.

The above-described compound having active methylene herein denotes, for instance, those compounds having electron-attracting substituents on both sides of methylene. Examples of electron-attracting groups include carbonyl group, carboxyl group, esters of carbonyl or carboxyl groups, sulfonyl group, sulfonate group, cyano group, and halogen atoms. Of these, malonic acid derivatives represented by the following general formula (5) are desirable from the viewpoints of adhesion, resolution and developability:

$$R_3O(CO)CH_2(CO)OR4 \qquad (5)$$

wherein $R_3$ and $R_4$, which may be the same or different, represent an alkyl group, or a group that can be decomposed by an acid. Further, $R_3$ and $R_4$, may be partly combined with each other to form a cyclic compound. In particular, when $R_3$ and $R_4$ are tert-butyl group, or when the compound having active methylene is a meldrum compound, the property of being decomposed by an acid, and solubility are improved, respectively.

In the present invention, it is preferable to incorporate the components so that the amount of the alicyclic structure into which double bond formed by condensation with active methylene has been introduced will be 10% by weight or more of the solid matter of the resist. When this amount is less than 10% by weight, it is difficult to form, by alkali development, a resist pattern excellent in both resolution and adhesion. In addition, the resulting resist pattern tends to have impaired dry-etching resistance. On the other hand, when the above amount is made more than 90%, the transparency is lowered.

It is preferable to make the average molecular weight of the resin according to the present invention, calculated in terms of polystyrene, from 500 to 500,000. A resin having an average molecular weight of less than 500 is unfavorable for forming a resist film having sufficiently high mechanical strength. On the contrary, when the average molecular weight of the polymer compound is in excess of 500,000, it is difficult to form a resist pattern excellent in resolution. The resin component of a resist composition is, in general, a mixture consisting of components having different molecular weights. The resin according to the present invention reveals its effects even when it has a low molecular weight. For example, even a resin containing components having average molecular weights of 500 to 1,000 is prevented from being dissolved unevenly, so that such a resin is also desirable. Moreover, in this case, even if many monomers are remaining in the resin, it is acceptable as long as the resin can form a film without causing any problem.

[Structure Common to Resist Resins I, II and III]

A resin according to the present invention can be obtained by copolymerizing the monomer and any of various vinyl compounds. Examples of useful vinyl compounds include methyl acrylate, methyl methacrylate, alpha-chloroacrylate, cyanoacrylate, trifluoromethyl acrylate, alpha-methylstyrene, trimethylsilyl methacrylate, trimethylsilyl alpha-chloroacrylate, trimethylsilylmethyl alpha-chloroacrylate, maleic anhydride, tetrahydropyranyl methacrylate, tetrahydropyranyl alpha-chloroacrylate, t-butyl methacrylate, t-butyl alpha-chloroacrylate, butadiene, glycidyl methacrylate, isobornyl methacryate, menthyl methacrylate, norbornyl methacrylate, adamantyl methacrylate and allyl methacrylate.

Moreover, when the control of the alkali-solubility of the resin and the improvement in adhesion between the resist and a substrate are taken into consideration, it is preferable to copolymerize the monomer and acrylic acid, maleic anhydride, an ester substitution product of acrylic acid or maleic anhydride, or an ankali-soluble compound such as vinyl phenol, vinyl naphthol, naphthol oxymethacrylate or $SO_2$. It is also possible to copolymerize the monomer with a compound obtained by protecting the alkali-soluble group of any of the above alkali-soluble compounds by a dissolution-preventive group (a group decomposable by an acid) having the ability of preventing dissolution.

It is preferable to introduce a dissolution-preventive group (a soluble group decomposable by an acid) into the molecule of a resin according to the present invention because the resulting resin has improved resolution. A dissolution-preventive group can be introduced into a resin by using a monomer compound having the dissolution-preventive group when the resin is synthesized.

A cyclic tertiary ester group having a lactone, or a substituent having acid anhydride structure formed with a bridged-bond-containing alicyclic compound having a carboxylic acid acts as a soluble group decomposable by an acid. Therefore, such a group can conveniently be used as the dissolution-preventive group.

Examples of dissolution-preventive groups include the following: esters such as t-butyl ester, isopropyl ester, ethyl ester, methyl ester and benzyl ester; ethers such as tetrahydropyranyl ether; alkoxy carbonates such as t-butoxy carbonate, methoxy carbonate and ethoxy carbonate; silyl ethers such as trimethylsilyl ether, triethylsilyl ether and triphenylsilyl ether; esters such as isopropyl ester, tetrahydropyranyl ester, tetrahydrofuranyl ester, methoxyethoxy methyl ester, 2-trimethylsilylethoxymethyl ester, 3-oxocyclohexyl ester, isobornyl ester, trimethylsilyl ester, triethylsilyl ester, isopropyldimethylsilyl ester, di-t-butylmethylsilyl ester, oxazole, 2-alkyl-1,3-oxazoline, 4-alkyl-5-oxo-1,3-oxazoline and 5-alkyl-4-oxy-1,3-dioxolane; ethers such as t-butoxycarbonyl ether, t-butoxymethyl ether, 4-pentenyloxymethyl ether, tetrahydropyranyl ether, tetrahydro-thiopyranyl ether, 3-bromotetrahydropyranyl ether, 1-methoxycyclohexyl ether, 4-methoxytetrahydropyranyl ether, 4-methoxytetrahydrothiopyranyl ether, 1,4-dioxane-2-yl ether, tetrahydrofuranyl ether, tetrahydrothiofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylsesquisilyl ether and t-butyldimethylsilyl ether; acetals such as methylene acetal, ethylidene acetal and 2,2,2-trichloroethylidene acetal; ketals such as 1-t-butylethylidene ketal, isopropylidene ketal (acetonide), cyclopentylidene ketal, cyclohexylidene ketal and cycloheptylidene ketal; cyclic orthoesters such as methoxymethylene acetal, ethoxymethylene acetal, dimethoxymethylene orthoester, 1-methoxyethylidene orthoester, 1-ethoxyethylidene orthoester, 1,2-dimethoxyethylidene orthoester, 1-N,N-dimethylaminoethylidene orthoester and 2-oxacyclopentylidene orthoester; silyl ketene acetals such as trimethylsilylsilyl ketene acetal, triethylsilyl ketene acetal and t-butyldimethylsilyl ketene acetal; silyl ethers such as di-t-butylsilyl ether, 1,3-1', 1', 3', 3'-tetraisopropyldisiloxanylidene ether and tetra-t-butoxydisiloxane-1,3-diylidene ether; acyclic acetals and ketals such as dimethyl acetal, dimethyl ketal, bis-2,2,2-trichloroethyl acetal, bis-2,2,2-trichloroethyl ketal, diacetyl acetal and diacetyl ketal; cyclic acetals and ketals such as 1,3-dioxane, 5-methylene-1,3-dioxane, 5,5,-dibromo-1,3-dioxane, 1,3-dioxolane, 4-bromomethyl-1,3-dioxolane, 4-3'-butenyl-1,3-dioxolane and 4,5-dimethoxymethyl-1,3-dioxolane; cyanohydrins such as O-trimethylsilyl cyanohydrin, O-1-ethoxyethyl cyanohydrin and O-tetrahydropyranyl cyanohydrin; and leaving alicyclic skeletons such as tertiary alicylic esters having alkyl groups.

It is preferable to make the percentage of the dissolution-preventive group approximately 35 to 65 mol % of the resin. This value is considerably greater than the percentage of a dissolution-preventive group introduced to a conventional acrylic polymer. For this reason, the resin of the invention has high dissolution contrast as compared with conventional acrylic resists. Moreover, a pattern formed by using the resin of the present invention can be developed with high resolution by a standard developer such as a 2.38% aqueous solution of tetramethylammonium hydroxide (TMAH).

The resin according to the present invention may contain in its molecule a dissolution-preventive group and an alkali-soluble group at the same time. Such a resin can show the two functions of alkali-solubility and dissolution-preventing properties.

Examples of alkali-soluble groups include carboxyl group and phenolic hydroxyl group.

In this case, it is preferable to make the percentage of the dissolution-preventive group approximately 10 to 80 mol % of the resin. When this percentage is less than 10 mol %, the dissolution-preventing function cannot be revealed, and the unexposed area is also dissolved. It is thus impossible to attain the resolution of a pattern. On the other hand, when the above percentage is in excess of 80 mol %, the resin has extremely decreased adhesion, so that it is difficult to form a pattern. Moreover, the resist composition shows extremely high hydrophobicity and repels a developer, so that a pattern cannot be formed.

Further, in this case, the percentage of the alkali-soluble group in the resin be so made that it will be 20 mol % or more in the area that will be removed by development to be conducted after exposure/PEB (post exposure bake). When the percentage of the alkali-soluble group in this area is made less than 20 mol %, the alkali developability becomes worse.

In the case where one alicyclic unit contains both a dissolution-preventive group, and a polar group such as hydroxyl group that can improve adhesion, the above-described problem of adhesion is not brought about. Therefore, in this case, it is possible to introduce a dissolution-preventive group to an extent of 80 mol % or more.

In the resist composition of the present invention, it is desirable that not only the resin but also a part of the structure of an additive (dissolution-preventive agent), which will be described later, has the above-described group decomposable by an acid, the alkali-soluble group contained in this group being protected.

When a water-soluble compound is polymerized to obtain a resin according to the present invention, the resulting resin has improved alkali-solubility. However, such a resin requires the use of a thin developer, so that the use of a water-soluble compound is undesirable. In the resin according to the present invention, it is preferable that the proportion of a vinyl compound having high water-solubility of more than 0.1 g/g water is as low as possible, and it is most preferable that the resin does not contain such a compound. The proportion of a compound whose water-solubility is in excess of 0.1 g/g water is at most 0 to 20% by weight of the polymer.

To make a resin according to the present invention by polymerization, it is preferable to use a compound having no molecular skeleton whose light absorption in short-wavelength ranges is high, such as benzene nucleus, from the viewpoint of the transparency of the resulting resist against short-wavelength light. Specifically, it is desirable that the absorbance of the resin against light having a wavelength of 193 nm be 4 or less per 1 micrometer.

Photo Acid Generator

Examples of photo acid generators useful for resist compositions of the present invention include the following compounds: aryl onium salts, naphthoquinonediazide compounds, diazonium salts, sulfonate compounds, sulfonium compounds, sulfamide compounds, iodonium compounds and sulfonyldiazomethane compounds. Specific examples of these compounds include triphenylsulfonium triflate, diphenyliodonium triflate, 2,3,4,4-tetrahydroxybenzophenone-4-naphthoquinonediazidesulfonate, 4-N-phenylamino-2-methoxyphenyldiazoniumsulfate, 4-N-phenylamino-2-methoxyphenyldiazonium p-ethylphenylsulfate, 4-N-phenylamino-2-methoxyphenyldiazonium 2-naphthylsulfate, 4-N-phenylamino-2-methoxyphenyldiazoniumphenylsulfate, 2,5-diethoxy-4-N-4'-methoxyphenylcarbonylphenyldiazonium 3-carboxy-4-hydroxyphenyl sulfate, 2-methoxy-4-N-phenylphenyldiazonium 3-carboxy-4-hydroxyphenylsulfate, diphenylsulfonylmethane, diphenylsulfonyldiazomethane, diphenyldisulfone, alpha-methylbenzointosylate, pyrogallol trimesylate, benzointosylate, MPI-103 (manufactured by Midori Kagaku Co., Ltd., Japan, CAS No. 87709-41-9), BDS-105 (manufactured by Midori Kagaku Co., Ltd., CAS No. 145612-66-4), NDS-103 (manufactured by Midori Kagaku Co., Ltd., CAS No. 110098-97-0), MDS-203 (manufactured by Midori Kagaku Co., Ltd., CAS No. 127855-15-5), Pyrogallol tritosylate (manufactured by Midori Kagaku Co., Ltd., CAS No. 20032-64-8), DTS-102 (manufactured by Midori Kagaku Co., Ltd., CAS No. 75482-18-7), DTS-103 (manufactured by Midori Kagaku Co., Ltd., CAS No. 71449-78-0), MDS-103 (manufactured by Midori Kagaku Co., Ltd., CAS No.127279-74-7), MDS-105 (manufactured byMidoriKagaku Co., Ltd., CAS No. 116808-67-4), MDS-205 (manufactured by Midori Kagaku Co., Ltd., CAS No. 81416-37-7), BMS-105 (manufactured by Midori Kagaku Co., Ltd., CAS No. 149934-68-9), TMS-105 (manufactured by Midori Kagaku Co., Ltd., CAS No. 127820-38-6), NB-101 (manufactured by Midori Kagaku Co., Ltd., CAS No. 20444-09-1), NB-201 (manufactured by Midori Kagaku Co., Ltd., CAS No. 4450-68-4), DNB-101 (manufactured by Midori Kagaku Co., Ltd., CAS No. 114719-51-6), DNB-102 (manufactured by Midori Kagaku Co., Ltd., CAS No. 131509-55-2), DNB-103 (manufactured by Midori Kagaku Co., Ltd., CAS No. 132898-35-2), DNB-104 (manufactured by Midori Kagaku Co., Ltd., CAS No. 132898-36-3), DNB-105 (manufactured by Midori Kagaku Co., Ltd., CAS No. 132898-37-4), DAM-101 (manufactured by Midori Kagaku Co., Ltd., CAS No. 1886-74-4), DAM-102 (manufactured by Midori Kagaku Co., Ltd., CAS No.28343-24-0), DAM-103 (manufactured by MidoriKagaku Co., Ltd., CAS No. 14159-45-6), DAM-104 (manufactured by Midori Kagaku Co., Ltd., CAS No. 130290-80-1), (manufactured by Midori Kagaku Co., Ltd., CAS No. 130290-82-3), DAM-201 (manufactured by Midori Kagaku Co., Ltd., CAS No. 28322-50-1), CMS-105 (manufactured by Midori Kagaku Co., Ltd.), DAM-301 (manufactured by Midori Kagaku Co., Ltd., CAS No. 138529-81-4), SI-105 (manufactured by Midori Kagaku Co., Ltd., CAS No. 34694-40-7), NDI-105 (manufactured by Midori Kagaku Co., Ltd., CAS No. 133710-62-0), and EPI-105 (manufactured by Midori Kagaku Co., Ltd., CAS No. 135133-12-9). Moreover, the following compounds may also be used.

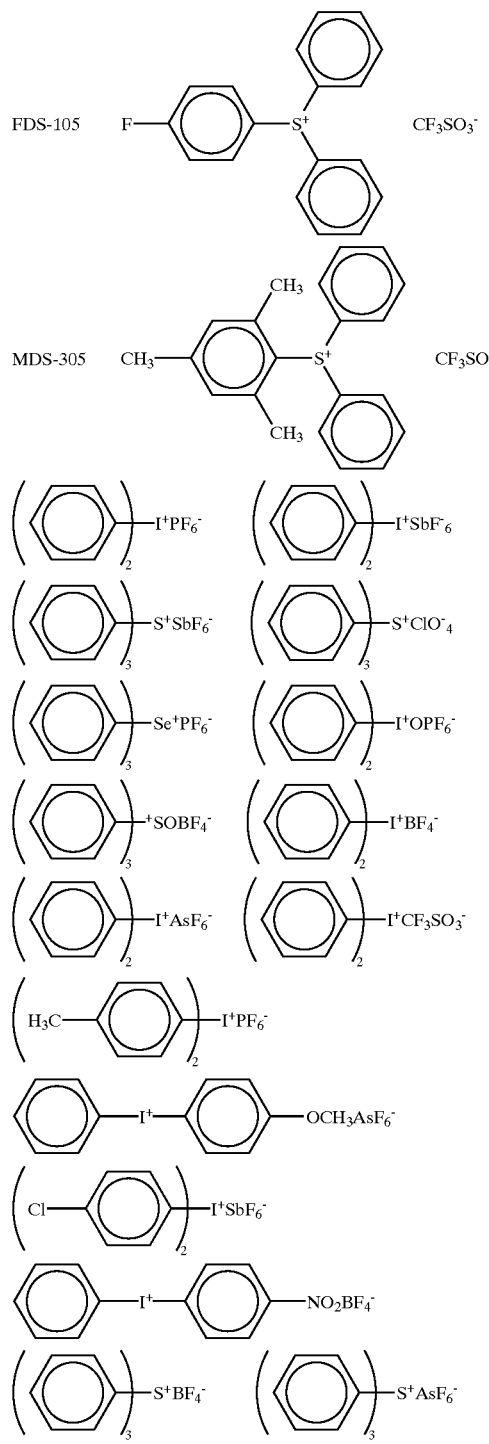

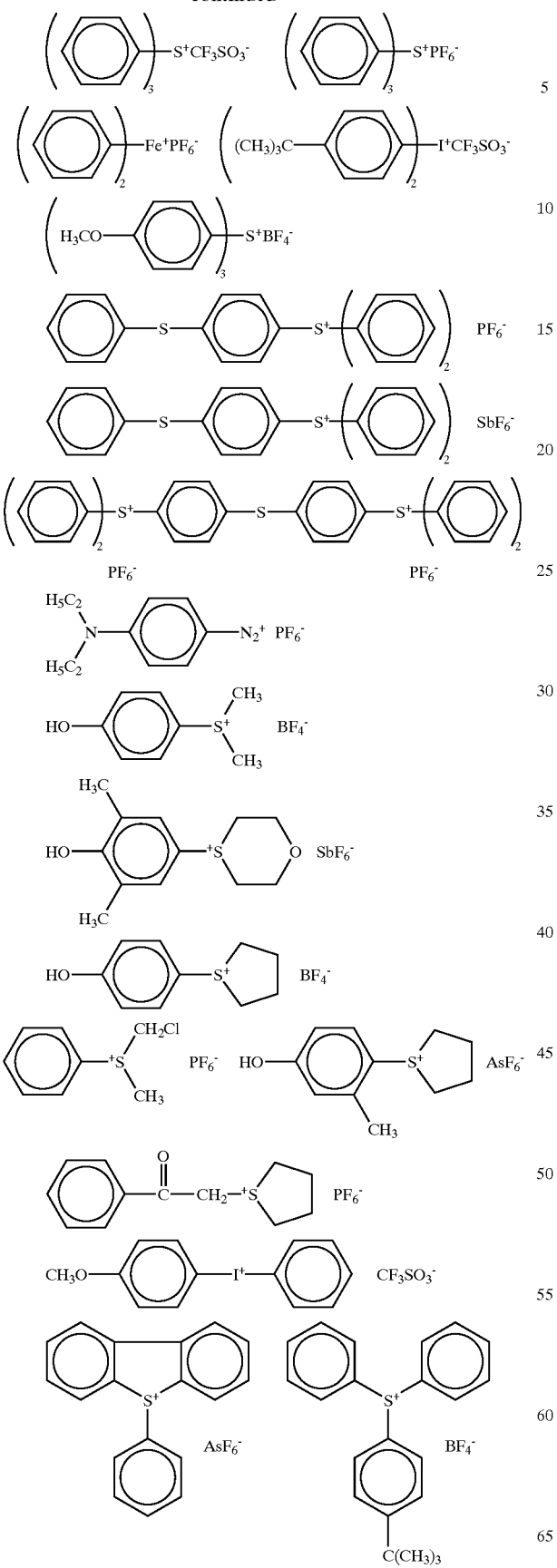
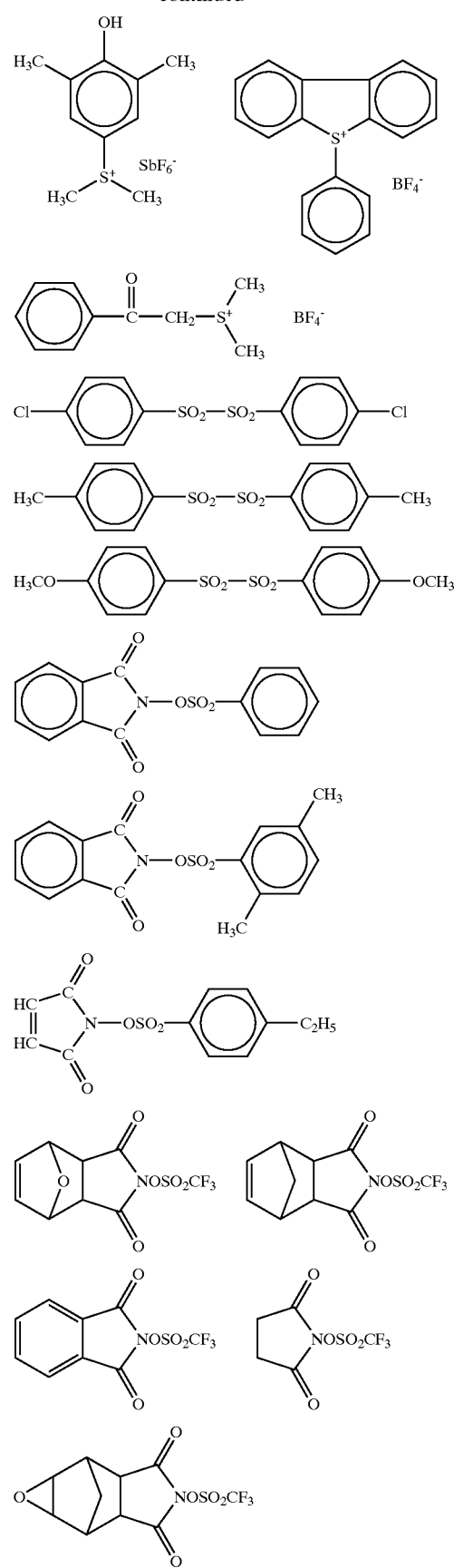

-continued

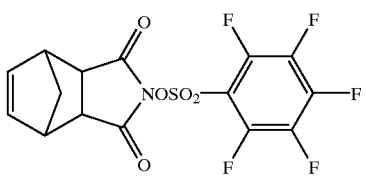

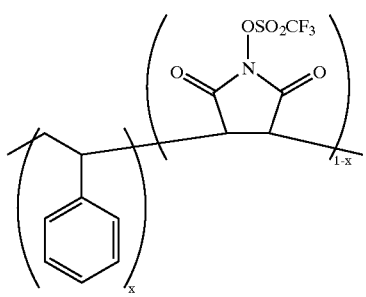

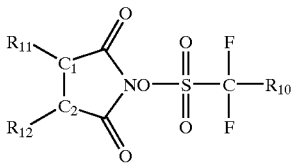

wherein $C_1$ and $C_2$ form single bond or double bond, $R_{10}$ is hydrogen atom, fluorine atom, or an alkyl or aryl group which may be substituted with fluorine atom, and $R_{11}$ and $R_{12}$, which may be the same or different, respectively represent a monovalent organic group, and may be combined with each other to form a cyclic structure.

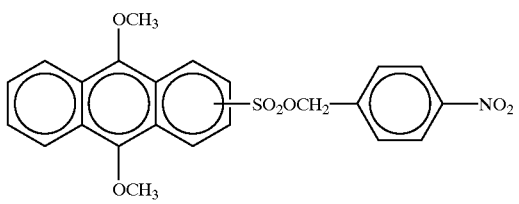

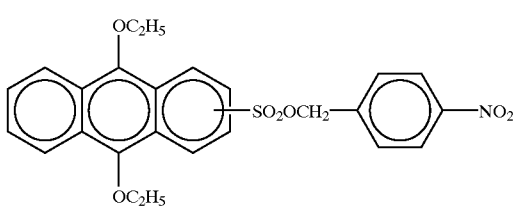

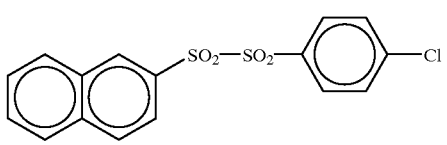

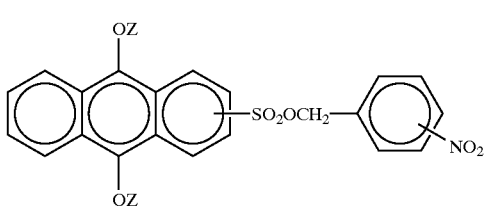

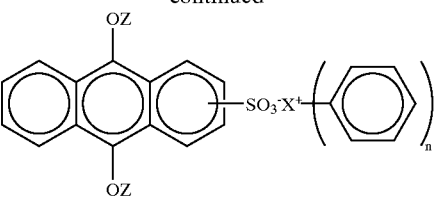

wherein Z represents an alkyl group.

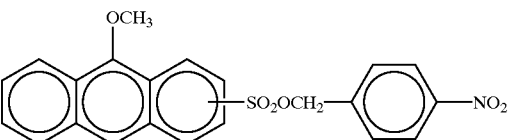

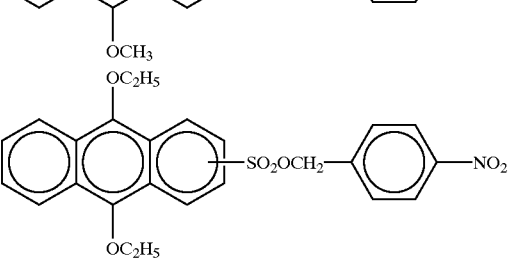

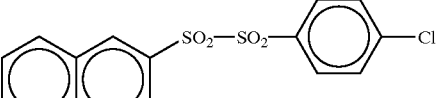

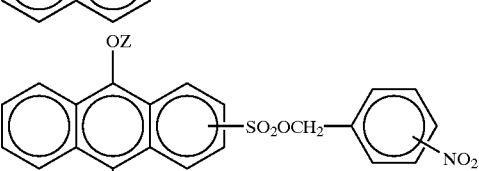

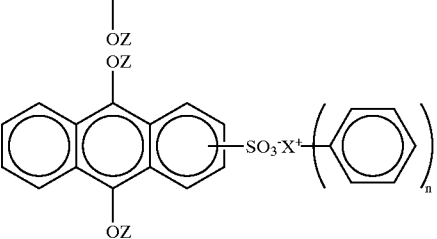

Of the above-enumerated photo acid generators, conjugated polycyclic aromatic compounds having naphthalene or dibenzothiophene skeleton, such as aryl onium salts, sulfonate compounds, sulfonyl compounds and sulfamide compounds are advantageous from the viewpoints of transparency against short-wavelength light, and of heat resistance. Specifically, the following compounds are preferred: sulfonyl or sulfonate compounds having naphthalene, pentalene, indene, azulene, heptalene, biphenylene, as-indacene, s-indacene, acenaphthylene, fluorene, phenalene, phenanthrene, anthracene, fluorantene, acephenanthrylene, aceanthrylene, triphenylene, pyrene, chrysene, naphthacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo[a,j]anthracene, indeno[1,2-a] indene, anthra[2,1-a]naphthacene or 1H-benzo[a]cyclopent [j]anthracene ring; 4-quinonediazide compounds having naphthalene, pentalene, indene, azulene, heptalene, biphenylene, as-indacene, s-indacene, acenaphthylene, fluorene, phenalene, phenanthrene, anthracene, fluorantene, acephenanthrylene, aceanthrylene, triphenylene, pyrene, chrysene, naphthacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo[a,j]anthracene, indeno[1,2-a]indene, anthra[2,1-a]naphthacene or 1H-benzo[a]cyclopent[j]anthracene ring; and salts with triflates of sulfoniums or iodoniums having, as side chain, naphthalene, pentalene, indene, azulene, heptalene, biphenylene, as-indacene, s-indacene, acenaphthylene, fluorene, phenalene, phenanthrene, anthracene, fluorantene, acephenanthrylene, aceanthrylene, triphenylene, pyrene, chrysene, naphthacene, pleiadene, picene, perylene, pentaphene, pentacene, tetraphenylene, hexaphene, hexacene, rubicene, coronene, trinaphthylene, heptaphene, heptacene, pyranthrene, ovalene, dibenzophenanthrene, benz[a]anthracene, dibenzo[a,j]anthracene, indeno[1,2-a]indene, anthra[2,1-a]naphthacene or 1H-benzo[a]cyclopent[j]anthracene ring In particular, sulfonyl or sulfonate compounds having naphthalene or anthracene ring; 4-quinonediazide compounds having naphthalene or anthracene ring to which hydroxyl group has been introduced; and salts with triflates of sulfoniums or iodoniums having as side chain naphthalene or anthracene ring.

Of these photo acid generators, triphenylsulfonium triflate, diphenyliodonium triflate, trinaphthylsulfonium triflate, dinaphthyliodonium triflate, dinaphthylsulfonyl methane, NAT-105 (manufactured by Midori Kagaku Co., Ltd., CAS No. 137867-61-9), NAT-103 (manufactured by Midori Kagaku Co., Ltd., CAS. No. 131582-008), NAI-105 (manufactured by Midori Kagaku Co., Ltd., CAS No. 85342-62-7), TAZ-106 (manufactured by Midori Kagaku Co., Ltd., CAS No. 69432-40-2), NDS-105 (manufactured by Midori Kagaku Co., Ltd.), PI-105 (manufactured by Midori Kagaku Co., Ltd., CAS No. 41580-58-9), s-alkylated dibenzothiophene triflate, and s-fluoroalkylated dibenzothiophene triflate (manufactured by Daikin Industries, Ltd., Japan) are preferably used. Of these compounds, triphenylsulfonium triflate, trinaphthylsulfonium triflate, dinaphthyliodonium triflate, dinaphthylsulfonyl methane, NAT-105 (manufactured by Midori Kagaku Co., Ltd., CAS No. 137867-61-9), NDI-105 (manufactured by Midori Kagaku Co., Ltd., CAS No. 133710-62-0), and NAI-105 (manufactured by Midori Kagaku Co., Ltd., CAS No. 85342-62-7) are particularly preferred.

In the resist composition of the present invention, the amount of the photo acid generator to be incorporated is from 0.001 to 50% by weight, more preferably from 0.01 to 40% by weight, most preferably from 0.1 to 20% by weight of the total amount of the other solid components. When this amount is less than 0.001% by weight, it is difficult to form a resist pattern at high sensitivity. On the other hand, when this amount is in excess of 50% by weight, the resulting resist film may have impaired mechanical strength.

Other Components

The resist composition of the present invention may further comprise dissolution-preventive agents, alkali-soluble resins, and resinous compounds whose alkali-solubility is increased when irradiated.

Dissolution-preventive agents will be described hereinafter.

A resin according to the present invention, which is insoluble in alkalis, becomes alkali-soluble by being decomposed by an acid catalyst that is generated from the photo acid generator incorporated into the resin when light is applied to the generator. It is therefore not essential to introduce a dissolution-preventive group into the resin, or to add a dissolution-preventive agent to the resist composition. However, in order to obtain a great difference in dissolution rate between exposed area and unexposed area, it is preferable to introduce a dissolution-preventive group into the resin, or to add a dissolution-preventive agent to the resin composition.

Among the compounds described in, for example, U.S. Pat. Nos. 4,491,628 and 4,603,101, and Japanese Patent Laid-Open Patent Publication No. 27829/1988, those ones whose aromatic rings are the condensed polycyclic aromatic rings can be used as dissolution-preventive compounds which can serve as the dissolution-preventive agents. Alternatively, those compounds containing condensed polycyclic aromatic ring skeleton having carboxylic acids or phenolic hydroxyl groups can be used if a part of or all of the hydroxyl ends are substituted with protective groups decomposable by an acid.

Examples of the above protective groups include tert-butyl ester, tert-butyl carbonate, tetrahydropyranyl group and acetal group.

Specific examples of such compounds include tert-butyl carbonates of naphthalene, anthracene, and polyhydroxy compounds, tert-butyl carbonate of naphthol phthalein, quinazarine, quinizarine, tert-butyl carbonates of naphthol novolak resins.

The amount of this compound to be incorporated into the resist composition is desirably at least 3% by weight and less than 40% by weight of the polymer. When the amount of this compound to be added is made less than 3% by weight, the effects of the compound cannot be obtained, or the lowering of resolution is brought about. On the contrary, when this amount is made more than 40% by weight, the coating performance or dissolution rate is drastically decreased. In general, it is more desirable that this amount be from 10 to 30% by weight.

In the case where the resist composition contains a dissolution-preventive agent, the resin is not always necessary to have a dissolution-preventive group. In this case, the resin may be one copolymerized with a vinyl compound having an alkali-soluble group, such as methacrylic acid, capable of imparting alkali-solubility to the copolymer. Examples of dissolution-preventive agents include compounds decomposable by an acid, which can sufficiently show dissolution-preventing ability in alkaline solutions and whose decomposition products can produce, in alkaline solutions, —(C=O)O—, —OS(=O)$_2$— or —O—. Specific examples of these compounds include t-butoxycarbonyl ether, tetrahydropyranyl ether, 3-bromotetrahydropyranyl ether, 1-methoxycyclohexyl ether, 4-methoxytetrahydropyranyl ether, 1,4-dioxane-2-yl ether, tetrahydrofuranyl ether, 2,3,3a,4,5,6,7,7a-octahydro-7,8,8-trimethyl-4,7-methanobenzofuran-2-yl ether, t-butyl ether, trimethylsilyl ether, triethylsilyl ether, triisopropylsilyl ether, dimethylisopropylsilyl ether, diethylisopropylsilyl ether, dimethylsesquisilyl ether or t-butyldimethylsilyl ether of phenolic compounds, meldrum acid derivatives, and the like. Of these, those compounds obtained by protecting the hydroxyl group of phenolic compounds by t-butoxycarbonyl, t-butoxycarbonylmethyl, trimethylsilyl, t-butyldimethylsilyl or tetrahydropyranyl group, those compounds obtained by adding meldrum acid to naphthaldehyde, and those compounds obtained by adding meldrum acid to aldehydes having alicyclic structure are preferred.

Moreover, the dissolution-preventive agent may be isopropyl ester, tetrahydropyranyl ester, tetrahydrofuranyl ester, methoxyethoxymethyl ester, 2-trimethylsilylethoxymethyl ester, t-butyl ester, trimethylsilyl ester, triethylsilyl ester, t-butyldimethylsilyl ester, isopropyldimethylsilyl ester, di-t-butylmethylsilyl ester, oxazole, 2-alkyl-1,3-oxazoline, 4-alkyl-5-oxo-1,3-oxazoline, 5-alkyl-4-oxo-1,3-dioxolane or the like of polyvalent carboxylic acids. In addition, there can also be mentioned compounds represented by the following formula.

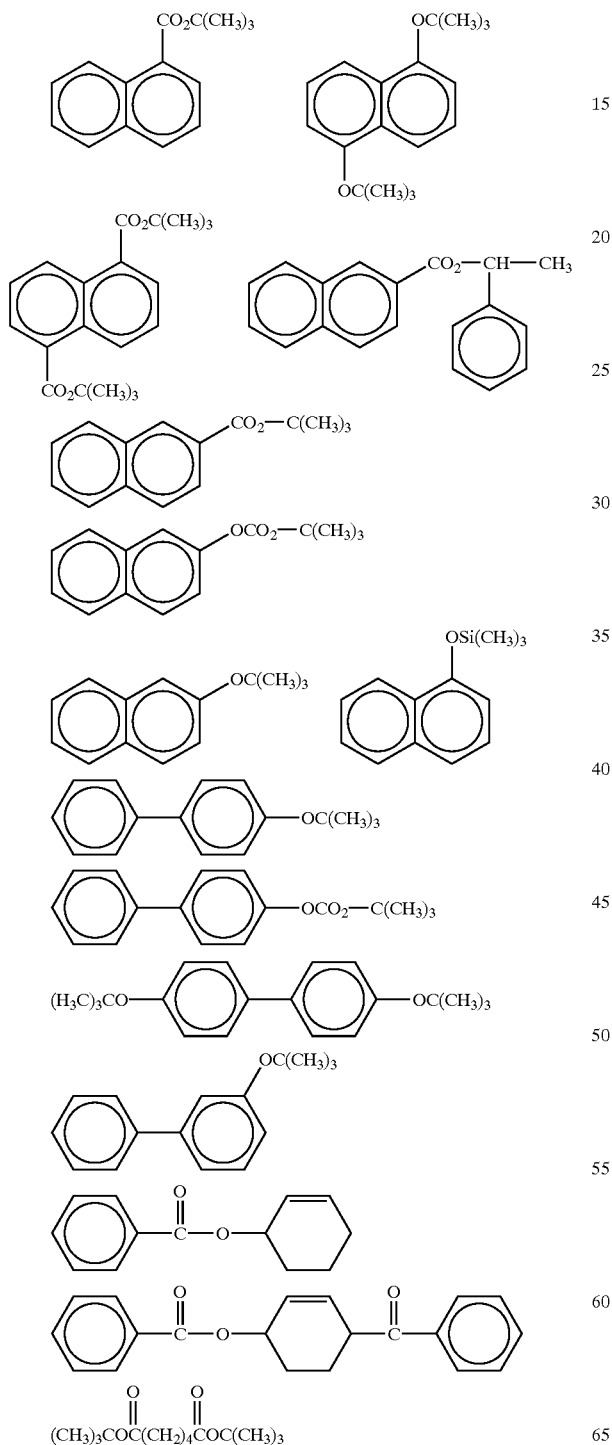

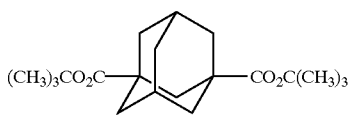

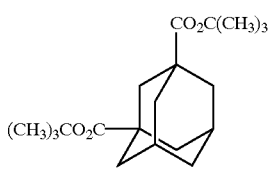

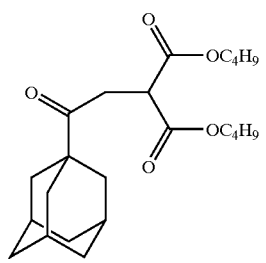

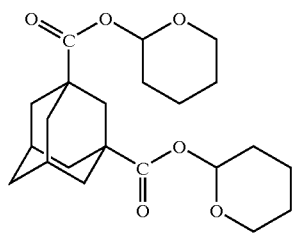

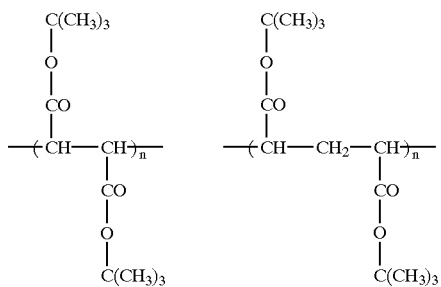

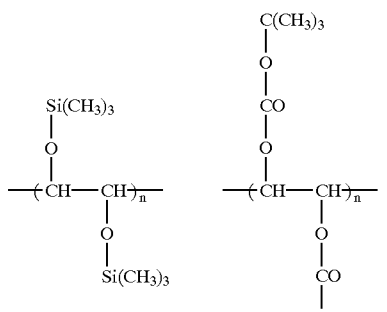

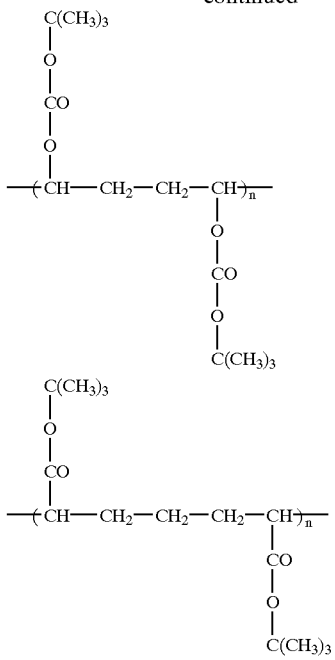

Of these dissolution-preventive agents, conjugated polycyclic aromatic compounds are preferable in the present invention because these compounds are excellent in transparency against short-wavelength light. Light absorption bands are shifted to shorter wavelength regions in these compounds due to the stabilization of conjugation of pi electrons. Therefore, in the present invention, it is possible to obtain a resist having excellent transparency against short-wavelength light and sufficiently high heat resistance by using especially a conjugated phenolic aromatic compound as the dissolution-preventive agent.

For the alkali-soluble resins included in the above-described other components of the resist composition of the present invention, any resin can be used as long as it is basically alkali-soluble. Preferable examples of such resins include those ones useful for known ArF resists, and they may have the functions of chemically amplified resists.

Further, the resist composition of the present invention may form a negative image when a resin having acid anhydride structure is processed as the resin component at a high temperature, or when hydroxyl group is attached to the specific tertiary carbon atom of the resin component, such hydroxyl group being readily underwent dehydration condensation reaction by an acid catalyst. By taking advantage of this action, a negative image may be formed.

The resist composition of the present invention is, in general, prepared as a varnish by dissolving a resin component, a photo acid generator, a dissolution-preventive agent, a cross-linking agent, an alkali-soluble resin and the like in an organic solvent, and filtering the solution. The resist for alkali development according to the present invention may further contain the following agents and compounds: other polymers such as epoxy resins, polymethyl methacrylate, polymethyl acrylate, polymethyl methacrylate, propylene oxide-ethylene oxide copolymers and polystyrene, amine compounds useful for improving environmental resistance, basic compounds such as pyridine derivatives, surface active agents useful as film modifiers, and reflection-preventive agents.

Examples of the organic solvent herein used include ketone solvents such as cyclohexane, acetone, methyl ethyl ketone and methyl isobutyl ketone, cellosolve solvents such as methyl cellosolve, methyl cellosolve acetate, ethyl cellosolve acetate and butyl cellosolve acetate, ester solvents such as ethyl acetate, butyl acetate, isoamyl acetate and gamma-butyrolactone, glycol solvents such as propylene glycol monomethyl ether acetate, dimethyl sulfoxide, and nitrogen-containing solvents such as hexamethylphosphoric triamide dimethylformamide and N-methylpyrrolidone. Besides the above solvents, solvent mixtures obtained by adding dimethyl sulfoxide, dimethylformaldehyde, N-methylpyrrodinone or the like to the above-enumerated solvents in order to improve the solubility may also be used. Further, propionic acid derivatives such as methyl methylpropionate, lactic esters such as ethyl lactate, PGMEA (propylene glycol monomethyl ether acetate) and the like do not have high toxicity, so that they can also be favorably used. Of these, PGMEA and ethyl lactate are particularly preferred because they are highly soluble in the resins of the present invention.

In the present invention, these solvents may be used either singly or in combination of two or more members. Moreover, the solvent may further contain an aliphatic alcohol such as isopropyl alcohol, ethyl alcohol, methyl alcohol, butyl alcohol, n-butyl alcohol, s-butyl alcohol, t-butyl alcohol or isobutyl alcohol, or an aromatic solvent such as toluene or xylene. When the resist composition of the present invention has acid anhydride structure, it shows high reactivity if the solvent contains hydroxyl group, and thus loses its stability. In this case, therefore, the solvent is desirably one having no OH group.

Next, a pattern forming process using a resist composition of the present invention will be described hereinafter by referring to the case where the resist is a chemically amplified positive resist. First of all, a varnish prepared by dissolving the resist in an organic solvent in the above-described manner is coated onto a predetermined substrate by means of spin coating or dipping. Thereafter, the varnish coated onto the substrate is dried at a temperature of 150° C. or lower, preferably from 70 to 120° C. to form a resist film. Examples of the substrate useful herein include silicon wafers, silicon wafers whose surfaces are provided with various insulating films, electrodes and lines, blank masks, semiconductor wafers made from compounds belonging to the groups III to V such as GaIas or AlGaAs, masks on which chrome or chrome oxide is vacuum-deposited, aluminum-deposited substrates, BPSG-coated substrates, PSG-coated substrates, BSG-coated substrates, SOG-coated substrates, and carbon-film-sputtered substrates.

Subsequently, actinic radiation is applied to the resist film through a predetermined mask pattern, or directly scanned on the surface of the resist film, thereby exposing the resist film to light. As mentioned previously, the resist of the present invention for alkali development has excellent transparency against not only short-wavelength light but also light of wide wavelength regions. It is therefore possible to use as the actinic radiation ultraviolet rays, X-rays, the i-, h-, or g-rays of a low-pressure mercury vapor lamp, light emitted by a xenon lamp, deep UV light such as KrF, ArF, or $F_2$ excimer laser light, synchrotron orbital radiation (SOR), electron beams (EB), gamma rays, ion beams or the like.

In particular, in the case of a chemically amplified resist, the resist film is subjected to baking treatment at a temperature of approximately 170° C. or lower by heating the resist film on a hot plate or in an oven, or by applying infrared light to the resist film. Thereafter, the resist film is developed by means of dipping or spraying to selectively dissolve it in an alkaline solution, thereby removing the exposed area or unexposed area of the resist film to form a desired resist pattern. Specific examples of the alkaline solution that can be used herein include aqueous organic alkaline solutions such as an aqueous tetramethylammonium hydroxide solution and an aqueous choline solution, aqueous inorganic alkaline solutions such as an aqueous potassium hydroxide solution and an aqueous sodium hydroxide solution, and solutions obtained by adding alcohols, surface active agents or the like to these solutions. It is preferable that the concentration of the alkaline solution be 15% by weight or less in order to obtain a sufficient difference in dissolution rate between the exposed area and the unexposed area.

The resist pattern thus formed by the use of the resist composition of the present invention is extremely excellent in resolution. For example, when dry etching is conducted by using this resist pattern as an etching mask, an extremely fine pattern at a quarter micron level can be transferred to the bare substrate with high fidelity. The resist pattern herein obtained shows high dry-etching resistance because, even when one of C—C bond in the alicyclic structure contained in the polymer compound, base resin, is broken, the other bond can remain.

Any step other than the above-described steps may be added to the pattern forming process of the present invention. For example, it is possible to properly add the step of forming a planarizing layer as the ground layer of the resist film, the step of pretreatment to be carried out in order to improve the adhesion between the resist film and the substrate, the step of rinsing to be carried out after developing the resist film for removing the developer by using water or the like, and the step of re-applying ultraviolet light before conducting dry etching.

EXAMPLES

The present invention will now be explained more specifically by referring to the following examples.

Synthesis Example I-1

6.0 g of 2-(3-carboxy-1-adamantyl)-2-propyl acrylate was mixed with 20 g of tetrahydrofuran (THF). To this mixture was added 0.20 g of azo-isobutyro-nitrile (AIBN), and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 5,000.

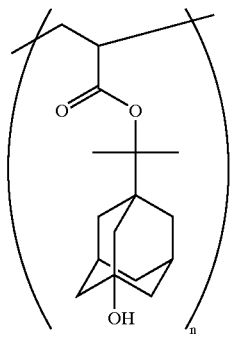

Synthesis Example I-2

50 mol % of 2-(3,7-dimethyl-4-adamantanon-1-yl)-2-propyl acrylate and 50 mol % of 3-(3-hydroxy-1-adamantyl)-3-pentyl acrylate, the total amount being 6.0 g, were mixed with 20 g of THF. To this mixture was added 0.20 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 5,000.

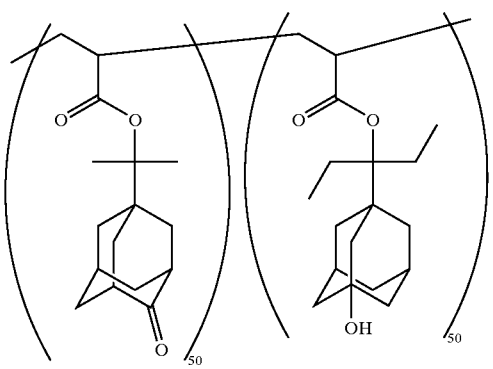

Synthesis Example I-3

65 mol % of 1-(3-hydroxy-1-adamantyl)-1-propyl acrylate, 25 mol % of t-butyl acrylate and 10 mol % of methacrylic acid, the total amount being 6.0 g, were mixed with 20 g of THF. To this mixture was added 0.36 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 8,000.

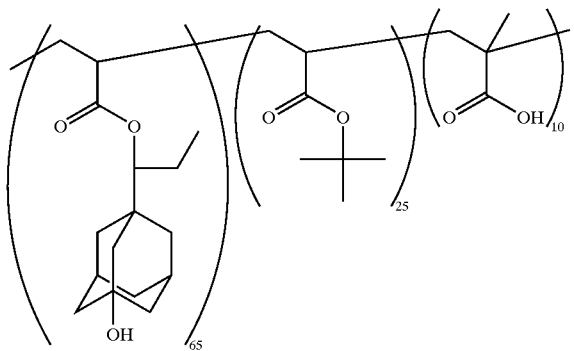

Synthesis Example I-4

80 mol % of 3-(3-hydroxy-1-adamantyl)-3-pentyl acrylate and 20 mol % of 4,6,6-trimethyl-2-oxepanon-4-yl acrylate, the total amount being 6.0 g, were mixed with 20 g of THF. To this mixture was added 0.20 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 7,000.

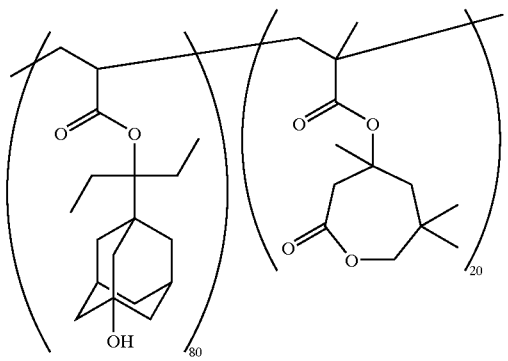

Synthesis Example I-5

60 mol % of 2-(3-hydroxy-1-adamantyl)-2-propyl acrylate, 30 mol % of 5-acryloyloxy-2-adamantanone, and 10 mol % of methacrylic acid, the total amount being 6.0 g, were mixed with 20 g of THF. To this mixture was added 0.18 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 7,000.

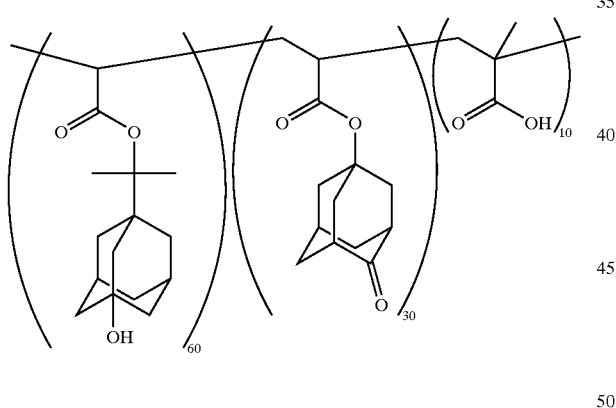

Synthesis Example I-6

70 mol % of 2-(3-hydroxy-1-adamantyl)-2-propyl acrylate, 20 mol % of 2-vinyl naphthalene, and 10 mol % of methacrylic acid, the total amount being 6.0 g, were mixed with 20 g of THF. To this mixture was added 0.18 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 7,000.

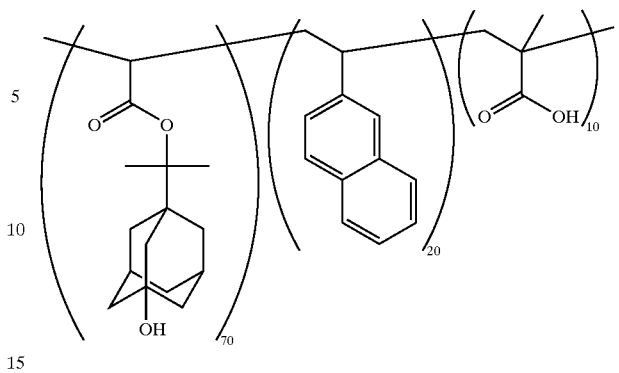

Synthesis Example I-7

50 mol % of 2-(3-hydroxy-1-adamantyl)-2-propyl acrylate, and 50 mol % of maleic anhydride, the total amount being 6.0 g, were mixed with 20 g of THF. To this mixture was added 0.18 g of AIBN, and the mixture was heated at 75° C. for 24 hours with stirring. The reaction solution was added dropwise to methanol to coagulate the copolymer. The copolymer was dissolved in THF again, and the solution was added dropwise to n-hexane. The precipitate was collected by filtration, and dried to obtain a copolymer represented by the following chemical formula, having a weight-average molecular weight (calculated in terms of styrene) of approximately 4,000.

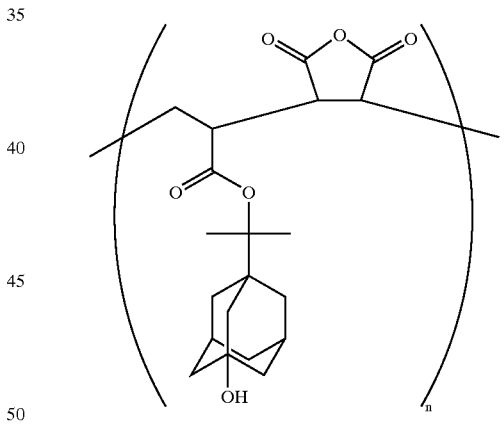

Synthesis Example I-8

70 mol % of 2-(3,3-dimethtyl-3-hydroxy-1-adamantyl)-2-propyl methacrylate, and 30 mol % of tetrahydropyranyl methacrylate, the total amount being 6.0 g, were mixed with 20 g of THF. To this mixture was added 0.18 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 6,000.

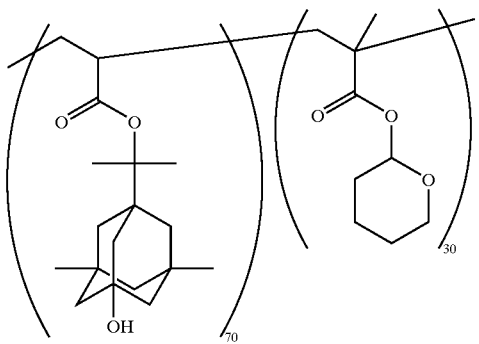

Synthesis Example I-9

60 mol % of 2-(3-tetrahydropyranyloxycarbonyl-1-adamantyl)-2-propyl acrylate, and 40 mol % of 1-methacryloyloxy-3-hydroxyadamantane, the total amount being 6.0 g, were mixed with 20 g of THF. To this mixture was added 0.18 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 6,000.

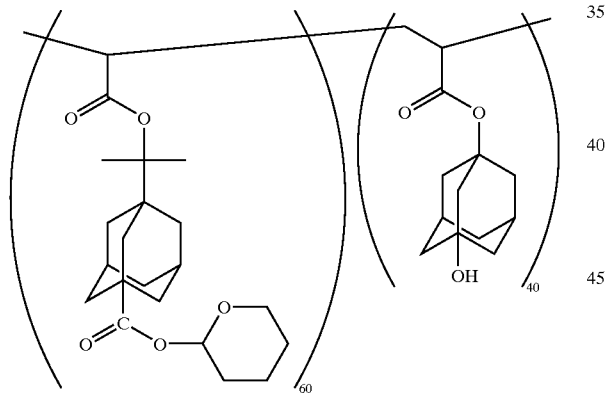

Synthesis Example I-10

70 mol % of carboxytricyclododecyl acrylate, and 30 mol % of ethoxyethoxycarbonyltricyclododecyl methacrylate, the total amount being 6.0 g, were mixed with 20 g of THF. To this mixture was added 0.18 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 15,000.

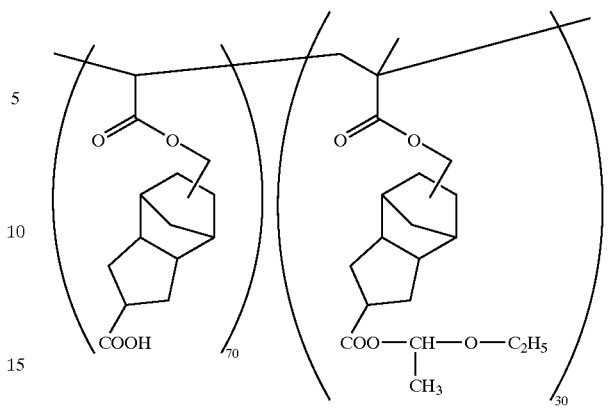

Synthesis Example I-11

50 mol % of 2-adamantyl-2-propyl methacrylate, and 50 mol % mevalonic lactone methacrylate, the total amount being 6.0 g, were mixed with 20 g of THF. To this mixture was added 0.18 g of AIBN, and the mixture was heated at 60° C. for 35 hours with stirring. The reaction solution was added dropwise to n-hexane. The precipitate was collected by filtration, and dried to obtain a copolymer represented by the following chemical formula, having a weight-average molecular weight (calculated in terms of styrene) of approximately 11,000.

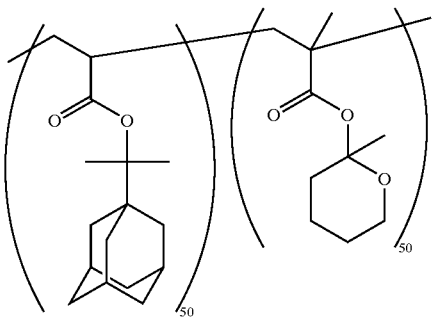

Example I-1

To the polymer obtained in Synthesis Example I-1 was added triphenylsulfonium triflate in an amount of 1% by weight of the polymer. This composition was made into a 10 wt % ethyl lactate solution. After filtering through a 0.2 micron membrane filter, the solution was spin-coated onto a silicon wafer which had been treated with hexamethyl disilazane, and pre-baked at 120° C. for 90 seconds to form a film with a thickness of 0.2 micrometers. This film was exposed to ArF excimer laser (NA=0.55) light. Thereafter, the wafer was baked at 110° C. for 60 seconds, and then developed by a 2.38% aqueous solution of tetramethylammonium hydroxide for 60 seconds. As a result, the resolution with an L/S of 0.25 micrometers was attained at an exposure energy of 3.5 mJ/cm$^2$.

According to optical-microscopic observations, no peeling of the pattern was confirmed, and the adhesion between the film and the substrate was also found to be excellent. Moreover, any residue called scum which tends to be formed when development is conducted was not observed. Examples I-2 to I-9 and Comparative Examples I-1 and I-2

To the respective polymers obtained in Synthesis Examples 2 to 9 and Synthesis Examples 10 and 11, triphenylsulfonium triflate was added in an amount of 1% by weight of the polymer. The compositions obtained were respectively dissolved in proper solvents. By using these solutions, pattern formation was conducted in the same manner as in Example I-1. The results are shown in Table I-1.

TABLE I-1

| | Exposure Energy (mJ/cm$^2$) | Post Exposure Baking | | Development TMAH | | | Adhesion to substrate | Scum |
|---|---|---|---|---|---|---|---|---|
| | | Temp. (° C.) | Time (sec) | conc. (wt %) | Time (sec) | Developability ($\mu$mL/S) | | |
| Ex. I-1 | 3.5 | 110 | 60 | 2.38 | 60 | 0.25 | | Not formed |
| Ex. I-2 | 3.6 | 110 | 60 | 2.38 | 55 | 0.24 | | Not formed |
| Ex. I-3 | 8.8 | 110 | 60 | 2.38 | 40 | 0.17 | | Not formed |
| Ex. I-4 | 4.7 | 110 | 60 | 2.38 | 45 | 0.15 | | Not formed |
| Ex. I-5 | 6.8 | 110 | 60 | 2.38 | 40 | 0.17 | | Not formed |
| Ex. I-6 | 7.8 | 110 | 60 | 2.38 | 50 | 0.17 | | Not formed |
| Ex. I-7 | 4.5 | 110 | 60 | 1.15 | 40 | 0.15 | | Not formed |
| Ex. I-8 | 3.9 | 110 | 60 | 2.38 | 40 | 0.16 | | Not formed |
| Ex. I-9 | 4.7 | 110 | 60 | 2.38 | 90 | 0.15 | | Not formed |
| Comp. Ex. I-1 | 11.0 | 70 | 60 | 2.38 | 60 | 0.16 | | Slightly formed |
| Comp. Ex. I-2 | 5.5 | 110 | 60 | 2.38 | 90 | 0.16 | X | Formed |

As is clear from the data shown in the above table, the resist compositions of the present invention were superior to that of Comparative Example I-1 in sensitivity and developability. The resist of Comparative Example I-2 was poor in adhesion to the substrate, and a fine pattern could not be formed unless a ground film was provided on the substrate beforehand. Moreover, this resist formed scum, like the resist of Comparative Example I-1, when development was conducted. The resist compositions of the present invention were also excellent in this point. Production Example 1 of Semiconductor Device By referring now to the accompanying drawings, a method for producing semiconductor devices, using the resist compositions and pattern forming process of the present invention will now be explained.

FIG. 1 is a cross-sectional view showing one example of a process for producing a semiconductor chip by using the resist composition of the present invention.

As shown in FIG. 1(a), a silicon oxide film with a thickness of approximately 0.8 micrometers was formed as an etching film on a silicon semiconductor substrate 1 by CVD. On top of this film, a resist film 3 with a thickness of approximately 0.3 micrometers, comprising the resist composition of Example I-1 was formed.

This resist film 3 was patterned by the above-described method to form a pattern composed of open holes, each having a diameter of 0.3 micrometers. The resist pattern 3a obtained was heated at 130° C. for 30 minutes in nitrogen atmosphere. The silicon oxide etching film 2 was selectively etched by RIE using CF$_4$gas, and, as an etching mask, the above-obtained resist pattern 3A to conduct pattern transfer as shown in FIG. 1(b).

Finally, the resist pattern 3A was carbonized and removed by O$_2$ plasma to obtain the silicon oxide film 2 having fine open holes 6 as shown in FIG. 1(c). The diameter of the fine open hole 6 formed in the silicon oxide film 2 is 0.32 micrometers, and the scattering in the thicknesses of the film was below 2%. Production Example 2 of Semiconductor Device As shown in FIG. 2(a), a silicon oxide film 2 with a thickness of 0.8 micrometers was formed on a semiconductor substrate 1 by CVD. In the semiconductor substrate 1, MOSFET, a diode and other elements (not shown in the figure), for example, had been formed in advance. Subsequently, a lower wiring layer composed of Al—Si—Cu, having a thickness of approximately 0.3 micrometers, and an interlayer insulating layer 7 made from SiO$_2$, having a thickness of 0.5 micrometers were formed. On these layers was formed an upper wiring layer 11 composed of Al—Si—Cu, having a thickness of approximately 0.3 micrometers. At this time, a step of approximately 0.2 micrometers was formed in the upper wiring layer. A resist film 3 with a thickness of 0.3 micrometers, comprising the resist composition was further formed on the upper wiring layer 11 in the same manner as in Production Example 1 of Semiconductor Device.

This resist film was patterned in the same manner as in Production Example 1 of Semiconductor Device to form a resist pattern. By using this pattern as an etching mask, the upper wiring layer 11 was removed by RIE, using a chlorine gas such as CCl$_4$ to obtain an upper wiring layer 11A as shown in FIG. 2 (b).

Figure 3:
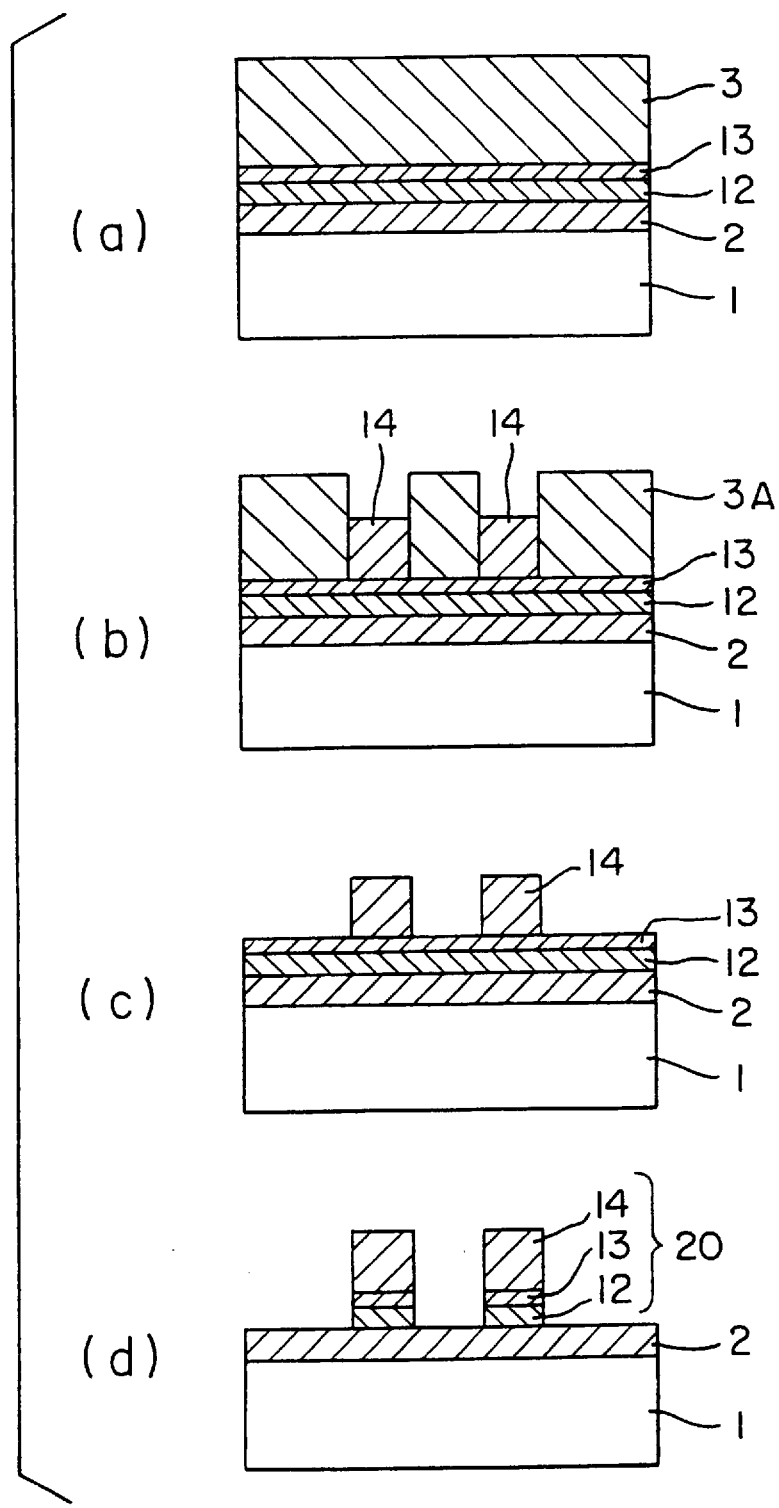

Finally, the resist pattern 3A was carbonated and removed by O$_2$ plasma to obtain two-layered wiring as shown in FIG. 2(c). Production Example 3 of Semiconductor Device FIG. 3 is a cross-sectional view showing a case where the present invention is applied to the formation of Au wiring.

First of all, a silicon oxide film 2 with a thickness of approximately 0.8 micrometers was formed on a semiconductor substrate 1 by CVD. In the semiconductor substrate 1, MOSFET, a diode and other elements (not shown in the figure), for instance, had been formed beforehand. Subsequently, on top of this silicon oxide film 2, a titanium-containing tungsten (Ti—W) film 12 with a thickness of approximately 0.2 micrometers, and a gold (Au) film 13 with a thickness of approximately 0.1 micrometers were formed successively. A resist film having a thickness of approximately 0.3 micrometers, containing the same resist composition as in Production Example 1 of Semiconductor Device was further formed on the Au film.

This resist film 3 was patterned in the same manner as in Production Example 1 of Semiconductor Device to form a resist pattern 3A as shown in FIG. 3(b), thereby making a groove. By using the Ti—W film 12 and Au film 13 bared at the bottom of the groove as electrodes, an Au plating film 14 with a thickness of 1 micrometer was formed in the groove by electroplating.

Subsequently, the resist film 3A was carbonated and removed by $O_2$ plasma to make the Au plating film 14 project from the Au film 13 as shown in FIG. 3(c). Finally, the bare Au film 13 was removed by ion milling, and the bare Ti—W film 13 was removed by the use of a fluorine gas to form an Au wiring 20 as shown in FIG. 3(d).

Example II-1

1-Acryloyl-3-hydroxyadamantane and tetrahydropyranyl methacrylate were used as monomers. They were mixed with each other in one of the mixing ratios shown in Table II-1, the total amount of the monomers being 0.05mol. This mixture was dissolved in 20 g of THF. To this solution was added 0.0125 mol of azobisbutyronitrile (AMBN) as a polymerization initiator. In argon atmosphere, the mixture was subjected three times to freezing deaeration at a temperature of liquid nitrogen, followed by reaction at 60° C. for 30 hours. To this reaction solution was added 2 ml of methanol to terminate the reaction. The reaction solution was added dropwise to 250 g of hexane with stirring for reprecipitation. The solution was filtered through a glass filter, and the solid matter collected was vacuum-dried at 60° C. for three days. In this manner, six different resins were obtained.

The molecular weights of the resins obtained, calculated in terms of polystyrene, were in the range of 3,500 to 8,000. The Mw/Mn ratios were found to be from 1.7 to 1.9. The mixing ratio of the monomers in each resin was determined by NMR. As a result, it was within ±2% of the ratio of the monomers at the time when they were charged.

To 1.0 g of the respective resins obtained was added 0.05 g of triphenylsulfonium triflate as a photo acid generator. The mixtures were respectively dissolved in 4.2 g of ethyl lactate to obtain six different Resists 1 to 6.

These six resist solutions were respectively spin-coated onto silicon wafers at 3,000 rpm for 30 seconds. Thereafter, the silicon wafers were subjected to pre-exposure bake on a hot plate at 120° C. for 90 seconds. The thicknesses of the resist films were 0.5 micrometers. The resist films were exposed to ArF excimer laser light (wavelength 193 nm) to form a line & space pattern. The apparatus used for the exposure was an ArF exposure system (NA=0.55, delta=0.7) manufactured by Nikon Corp., Japan.

The patterned resists were subjected to post-exposure bake at 100° C. for 180 seconds, and then developed by a 2.38% aqueous solution of tetramethylammonium hydroxide at 25° C. for 60 seconds. By this, the exposed area of each resist film was selectively dissolved and removed, and a positive pattern was formed. The sensitivities and degrees of resolution of the resists are also shown in Table II-1.

TABLE II-1

| Resist | Mixing Ratio | Sensitivity (mJ/cm$^2$) | Resolution (μmL/S) | Remarks |
|---|---|---|---|---|
| Resist II-1 | 66:34 | 7.0 | 0.25 | |
| Resist II-2 | 60:40 | 4.5 | 0.19 | |
| Resist II-3 | 55:45 | 3.8 | 0.17 | |
| Resist II-4 | 50:50 | 3.0 | 0.15 | |
| Resist II-5 | 45:55 | 3.2 | 0.23 | 0.15 μmL/S when a protective film was used |

TABLE II-1-continued

| Resist | Mixing Ratio | Sensitivity (mJ/cm$^2$) | Resolution (μmL/S) | Remarks |
|---|---|---|---|---|
| Resist II-6 | 40:60 | 3.4 | 0.30 | 0.15 μmL/S when a protective film was used |

Example II-2

0.02 mol of 1-acryloyl-3-hydroxyadamantane, monomer, was homopolymerized in the same manner as in Example I-1. The molecular weight of the homopolymer, calculated in terms of the polystyrene, was 3,500, and the Mw/Mn was 1.9.

Patterning was conducted in the same manner as in Example II-1 except that the photo acid generator used in Example II-1 was changed to naphthylimide campharsulfonate and that the post-exposure bake was carried out at 160° C. As a result, it was confirmed that it was possible to form a pattern although the L/S was as large as 0.45 micrometers at an exposure energy of 42 mJ/cm$^2$.

TABLE II-2

| Resist | Mixing Ratio | Sensitivity (mJ/cm$^2$) | Resolution (μmL/S) | Remarks |
|---|---|---|---|---|
| Resist II-7 | — | 42 | 0.45 | — |

Examples II-11 to II-15

Polymers were produced by the same method as in Example II-1 except that the 1-acryloyl-3-hydroxyadamantane used in Example II-1 was replaced by 1-acryloyl-3-carboxyadamantan and that the mixing ratios used in Example II-1 were changed to those shown in Table II-3. By using these polymers, resists were prepared in the same manner as in Example II-1. Patterning was conducted in the same manner as in Example II-1 by the use of these resists. The results are shown in Table II-3.

TABLE II-3

| Resist | Mixing Ratio | Sensitivity (mJ/cm$^2$) | Resolution (μmL/S) | Remarks |
|---|---|---|---|---|
| Resist II-11 | 55:45 | 2.9 | 0.20 | — |
| Resist II-12 | 50:50 | 2.7 | 0.18 | — |
| Resist II-13 | 45:55 | 2.6 | 0.17 | — |
| Resist II-14 | 40:60 | 2.7 | 0.15 | — |
| Resist II-15 | 35:65 | 2.7 | 0.16 | — |

It is considered that why the optimum mixing ratios are different from those in Example II-1 is due to difference in acidity. It can be known that patterning can successfully be conducted by using these resists.

Example II-4

A polymer was made in the same manner as in Example II-1 except that a monomer mixture (molar ratio 1:1:2) of 1-acryloyl-3-tert-butyloxycarbonyl adamantane, 1-acryloyl-3-hydroxyadamantane and maleic anhydride was used instead of the monomers used in Example II-1. By the use of this polymer, a resist was prepared in the same manner as in Example II-1. Patterning was conducted in the same manner as in Example II-1 by using this resist. As a result, it was confirmed that it was possible to form a pattern with an L/S of 0.17 micrometers at an exposure energy of 12 mJ/cm2. The results are shown in Table II-4.

On the other hand, a polymer was made in the above-described manner by using a monomer mixture (molar ratio 1:1:2) of 2-acryloyl-7-tert-butyloxy-carbonyltricyclodecane, 2-acryloyl-7-hydroxymethyltricyclodecane, and maleic anhydride. A resist was prepared in the same manner as in the above by using this polymer, and then evaluated. It was impossible to form a pattern at all due to cross-linking reaction. It can thus be known that the resin having the structure according to the present invention shows notable effects when it contains an acid anhydride.

TABLE II-4

| Resist | Mixing Ratio | Sensitivity (mJ/cm$^2$) | Resolution ($\mu$mL/S) | Remarks |
|---|---|---|---|---|
| Resist II-16 | 1:1:2 | 12 | 0.17 | — |

("Mixing Ratio" denotes the molar ratio of 1-acryloyl-3-tert-butyloxycarbonyl adamantane:1-acryloyl-3-hydroxyadamantane:maleic anhydride at the time when they were charged.) Example II-5

Polymers were produced in the manner as in Example II-1 except that the 1-acryloyl-3-hydroxyadamantane used in Example II-1 was replaced with 1-acryloyl-3-tetrahydropyranylcarboxyadamantane and 1-acryloyl-3-hydroxyadamantane and that the mixing ratios used in Example II-1 were changed to those shown in Table II-5. By the use of these polymers, resists were prepared in the same manner as in Example II-1. Patterning was conducted in the same manner as in Example II-1 by using these resists. The results are shown in Table II-5.

TABLE II-5

| Resist | Mixing Ratio | Sensitivity (mJ/cm$^2$) | Resolution ($\mu$mL/S) | Remarks |
|---|---|---|---|---|
| Resist II-21 | 60:40 | 6.8 | 0.17 | — |
| Resist II-22 | 55:45 | 5.8 | 0.17 | — |
| Resist II-23 | 50:50 | 5.6 | 0.16 | — |
| Resist II-24 | 45:55 | 5.4 | 0.18 | — |
| Resist II-25 | 40:60 | 5.9 | 0.19 | — |

("Mixing Ratio" denotes the molar ratio of 1-acryloyl-3-tetrahydropyranyl-carboxyadamantane to 1-acryloyl-3-hydroxyadamantane at the time when they were charged.)

Example II-6

A mixture of 0.06 mol of Compound II-1 and 0.04 mol of Compound II-2 was subjected to radical polymerization, using 0.01 mol of AIBN as a polymerization initiator to obtain Resin II-3 having a molecular weight of approximately 11,000. To 1.0 g of the resin obtained was added 0.01 g of triphenylsulfoniumtriflate as a photo acid generator, and the mixture was dissolved in 10 g of PGMEA. The resist solution thus obtained was spin-coated onto a silicon wafer at 3,000 rpm for 30 seconds, and then subjected to pre-exposure bake on a hot plate at 1200C for 90 seconds. The thickness of the resist film formed was 0.2 micrometers. This resist film was exposed to ArF excimer laser light to form a line & space pattern. This was then subjected to post-exposure bake at 130° C. for 90 seconds, and developed by a 2.38% aqueous TMAH solution at 25° C. for 60 seconds, thereby obtaining a positive pattern with an L/S of 0.15 micrometers. The sensitivity was 7.0 MJ/cm$^2$.

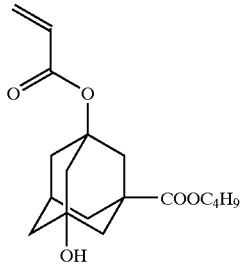

Compound II-1

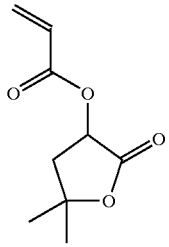

Compound II-2

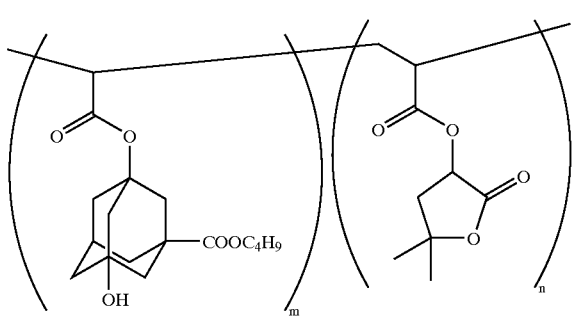

Compound II-3

Example II-7

A mixture of 0.04 mol of Compound II-1 and 0.06 mol of Compound II-4 was subjected to radical polymerization, using 0.01 mol of AIBN as a polymerization initiator to obtain Resin II-5 having a molecular weight of approximately 10,000. To 1.0 g of the resin obtained was added 0.01 g of triphenylsulfoniumtriflate as a photo acid generator, and the mixture was dissolved in 10 g of PGMEA. The resist solution thus obtained was spin-coated onto a silicon wafer at 3,000 rpm for 30 seconds, and then subjected to pre-exposure bake on a hot plate at 120° C. for 90 seconds. The thickness of the resist film obtained was 0.2 micrometers. This resist film was exposed to ArF excimer laser light to form a line & space pattern. This was then subjected to post-exposure bake at 110° C. for 90 seconds, and developed by a 2.38% aqueous TMAH solution at 25° C. for 60 seconds, thereby obtaining a positive pattern with an L/S of 0.15 micrometers. The sensitivity was 30 mJ/cm$^2$.

Compound II-4

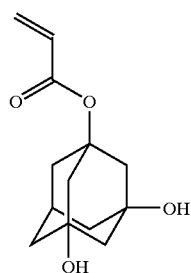

Compound II-12

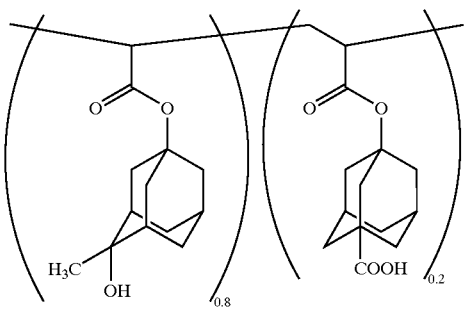

Compound II-5

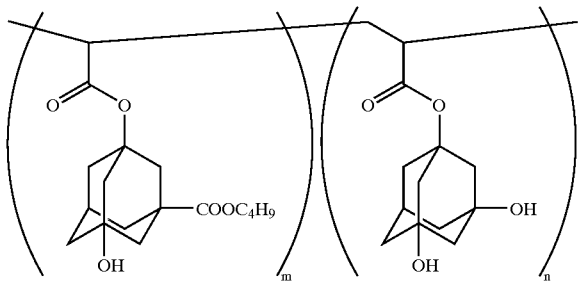

Compound II-7

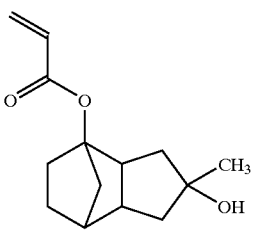

Examples II-33–38

Polymer compounds II-12 to II-17 were obtained by radically polymerizing, as monomers, Compounds II-6 to II-11 and Compound II-2 or 1-acryloyloxy-3-carboxyladamantane. The polymer compounds II-12 to II-17 were respectively mixed with an acid generator TPS-105 (1 wt %), and the mixtures were respectively dissolved in a PGMEA solution. These varnishes obtained were respectively spin-coated onto silicon wafers. The films formed were exposed to light of 193 nm by using an ArF excimer laser stepper, and baked at 110OC for 5 minutes. The baked films were then developed by a 0.36 N TMAH alkali developer, whereby the exposed area remained, while the unexposed area was dissolved in the developer. Negative patterns were thus formed Compound II-13

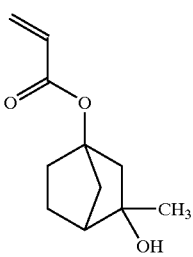

Compound II-8

Compound II-6

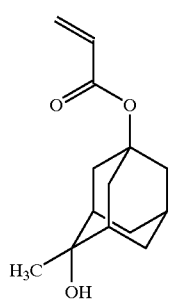

Compound II-14)

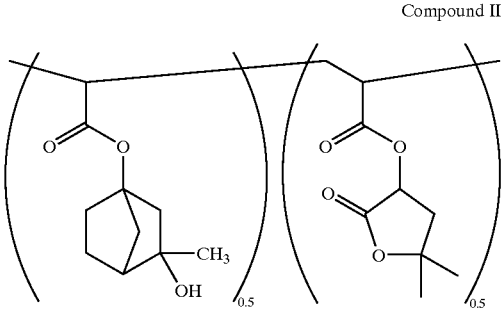

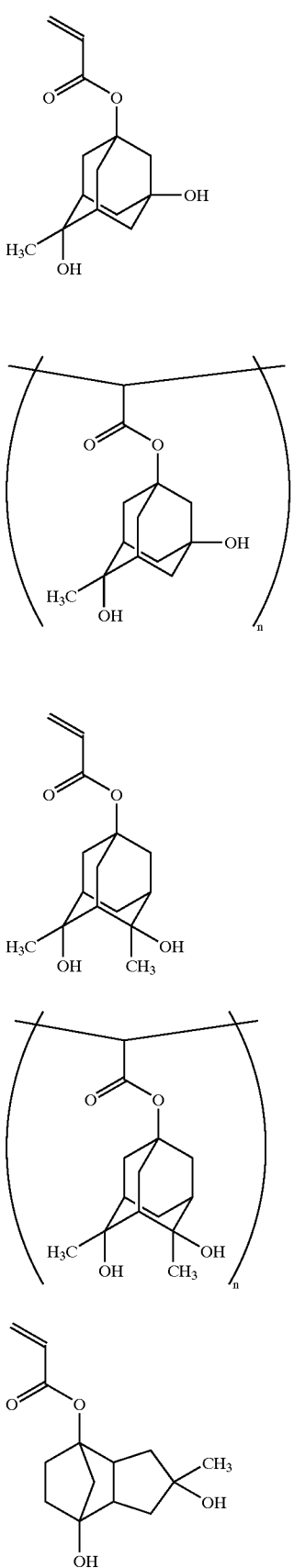

Compound II-9

Compound II-15

Compound II-10

Compound II-16

Compound II-8

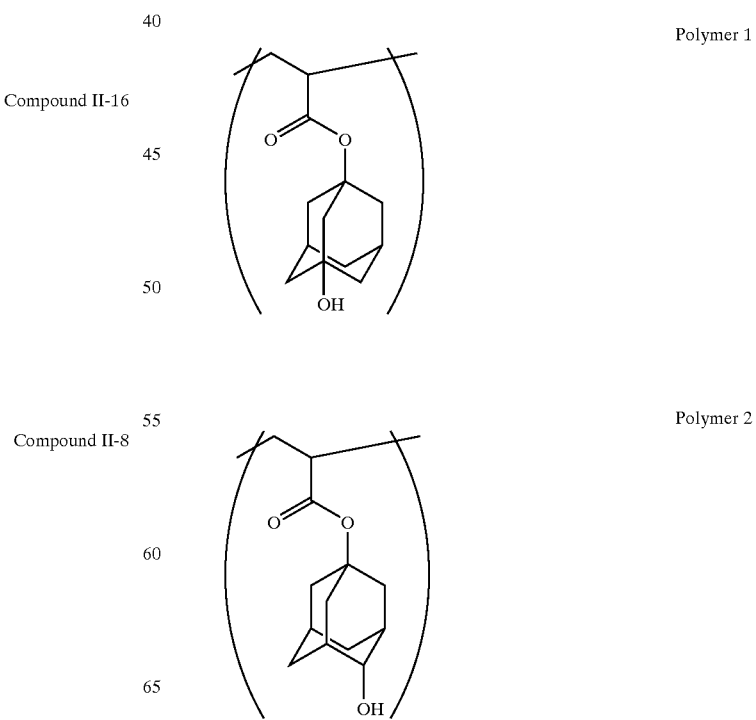

Compound II-17

TABLE II-6

| Example | Polymer | Sensitivity (mJ/cm$^2$) | Resolution ($\mu$mL/S) |
|---|---|---|---|
| Ex. II-33 | Compound II-12 | 30 | 0.16 |
| Ex. II-34 | Compound II-13 | 33 | 0.16 |
| Ex. II-35 | Compound II-14 | 35 | 0.18 |
| Ex. II-36 | Compound II-15 | 57 | 0.18 |
| Ex. II-37 | Compound II-16 | 25 | 0.18 |
| Ex. II-38 | Compound II-17 | 60 | 0.17 |

From the data shown in the above table, it can be known that a negative pattern free from swelling can successfully be formed by the use of any of these resists. Etching was conducted by using CF$_4$ plasma. It was found that the etching rates of these resists were 1.2 to 1.0 time that of polyhydroxystyrene resin.

Examples II-9 to II-11 and Comparative Examples II-1 to II-5

The following homopolymers, Polymers 1 to 8, were obtained by radically polymerizing Monomers 1 to 8. The molecular weights of these polymers were approximately 10,000.

Polymer 1

Polymer 2

-continued
Polymer 3
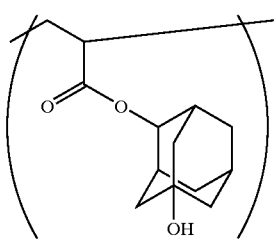
Polymer 4
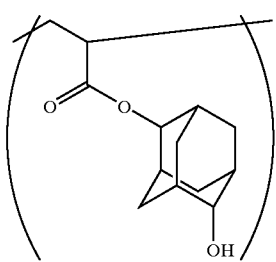
Polymer 5
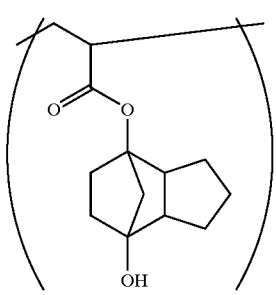
Polymer 6
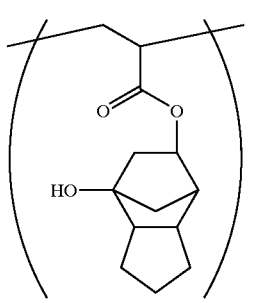
Polymer 7
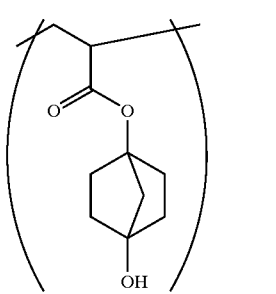
Polymer 8
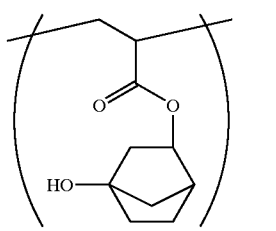
-continued
Monomer 1
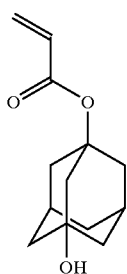
Monomer 2
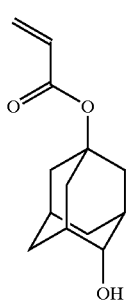
Monomer 3
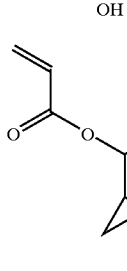
Monomer 4
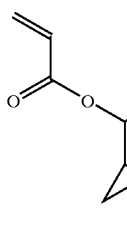
Monomer 5
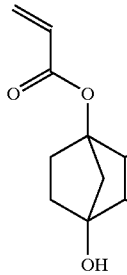
Monomer 6
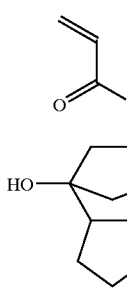

-continued

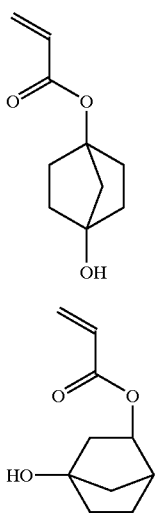

Monomer 7

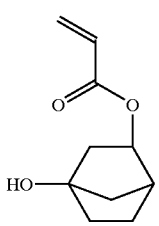

Monomer 8

The glass transition temperatures (Tg) of these polymers were measured by a differential scanning calorimeter (DSC). The results are shown in Table II-7.

TABLE II-7

| Polymer | Ex. No. | Tg Found (° C.) | Tg Calcd. (° C.) |
|---|---|---|---|
| Polymer 1 | Ex. II-9 | 160 | 156 |
| Polymer 2 | Comp. Ex. II-1 | 146 | 147 |
| Polymer 3 | Comp. Ex. II-2 | N.D. | 146 |
| Polymer 4 | Comp. Ex. II-3 | 133 | 136 |
| Polymer 5 | Ex. II-10 | 159 | 156 |
| Polymer 6 | Comp. Ex. II-4 | 135 | 138 |
| Polymer 7 | Ex. II-11 | 154 | 152 |
| Polymer 8 | Comp. Ex. II-5 | 130 | 129 |

As is clear from the date shown in Table II-7, Polymer 1 (Example II-9) in which hydroxyl group or an esterified group thereof is combined with carbons at the two 3-position has a Tg about 10° C. higher than that of Polymer 2 (Comparative Example II-41) or Polymer 3 (Comparative Example II-2) in which such a group is combined with only one tertiary carbon atom, and a Tg 20° C. higher than that of Polymer 4 (Comparative Example II-3) in which such a group is not combined with tertiary carbon atom at all.

Further, it can also be known that Polymer 5 (Example II-10) and Polymer 7 (Example II-11) having different types of aliphatic rings, hydroxyl group or an esterified group thereof being combined with carbons at the two 3-position, have higher glass transition temperatures.

Furthermore, the glass transition temperatures of these polymers obtained by calculation are also shown in Table II-7. The calculation was conducted by the Bicerano method on the CAche system. The values obtained by this calculation are almost the same as those obtained by the experiment. In the step of post-exposure bake that is an essential step in the processing of a chemically amplified resist, it is necessary to bake the resist at a temperature of 100 to 150° C. At this time, when the Tg of the resist is low, a pattern cannot successfully be formed. Therefore, the resist compositions of the present invention, prepared by using the polymers according to the present invention whose glass transition temperatures are high can provide resist patterns with high resolution.

Test Example II-1

Monomer 1 and tetrahydropyranyl were polymerized to obtain a copolymer. This copolymer is quite the same as Resist II-4 that was used in Example II-1. By using this copolymer, a resist was prepared in the same manner as in Example II-1. Further, a copolymer of Monomer 2 and tetrahydropyranyl was obtained in the same manner as in Example II-1, and a comparative resist was prepared by using this copolymer. By the use of these resists, exposure and processing were conducted in the same manner as in Example II-1 to obtain resist patterns.

As a result, it was found the following: when the resist prepared by using the copolymer with Monomer 1 was used, a pattern with an L/S of 0.15 micrometers was obtained; while, when the resist prepared by using the copolymer with Monomer 2 was used, a pattern could not successfully be obtained, and the L/S was only about 0.3 micrometers. The reason for this is as follows: since the copolymer with Monomer 2 has a Tg lower than that of the copolymer with Monomer 1, the former copolymer becomes rubbery during the step of post-exposure bake, and the pattern was fluidized.

Test Example II-2

50 mol % of monomer 5 and 50 mol % of tetrahydropyranyl were polymerized to obtain a copolymer. The polymerization method was the same as that in Example II-1. By using this copolymer, a resist was prepared in the same manner as in Example II-1. Further, in the same manner as in Example II-1, 50 mol % of Monomer 6 and 50 mol % of tetrahydropyranyl were polymerized to obtain a copolymer, and a comparative resist was prepared by using this copolymer. By the use of these resists, exposure and processing were conducted in the same manner as in Example II-1 to obtain resist patterns.

As a result, it was found the following: when the resist prepared by using the copolymer with Monomer 5 was used, a pattern with an L/S of 0.16 micrometers was obtained at 5.2 mJ/cm$^2$; while, when the resist prepared by using the copolymer with Monomer 6 was used, a pattern could not successfully be formed, and the L/S was only about 0.4 micrometers.

The reason for this is as follows: since the copolymer with Monomer 5 has a Tg lower than that of the copolymer with Monomer 6, the former copolymer becomes rubbery during the step of post-exposure bake, and the pattern was fluidized.

Test Example II-3

50 mol % of Monomer 7 and 50 mol % of tetrahydropyranyl were polymerized to obtain a copolymer. The polymerization method was the same as that in Example II-1. By using this copolymer, a resist was prepared in the same manner as in Example II-1. Further, in the same manner as in Example II-1, 50 mol % of Monomer 8 and 50 mol % of tetrahydropyranyl were polymerized to obtain a copolymer, and a comparative resist was prepared by using this copolymer. By the use of these resists, exposure and processing were conducted in the same manner as in Example II-1 to obtain resist patterns.

As a result, it was found the following: when the resist prepared by using the copolymer with Monomer 7 was used, a pattern with an L/S of 0.16 micrometers was formed at 5.2 mj/cm2; while, when the resist prepared by using the copolymer with Monomer 6 was used, a pattern could not successfully be formed, and the L/S was only 0.4 micrometers.

The reason for this is as follows: since the copolymer with Monomer 8 has a Tg lower than that of the copolymer with Monomer 7, the former copolymer becomes rubbery during the step of post-exposure bake, and the pattern was fluidized.

Examples II-12 to II-16 and Comparative Example II-6

[Synthesis of Starting Compounds]

One mol of 1,3-dihydroxyadamantane was stirred in an acetic acid-acetic anhydride solution of $CrO_3$, oxidizing agent, with heating. After carrying out the reaction for 8 hours, the reaction solution was neutralized to obtain a mixture of polyhydroxylated compounds of hydroxyadamantane. This mixture was partitioned by high performance liquid chromatography to obtain 1,3,5-trihydroxyadamantane.

This 1,3,5-trihydroxyadamantane was dissolved in methylene chloride. To this solution were added a small amount of trimethylamine, and then an equimolar amount of trimethylsilyl chloride. Reaction was carried out at room temperature. The reaction product was partitioned by high performance liquid chromatography to obtain 1,3-dihydroxy-5-trimethylsiloxyadamantane.

The 1,3-dicarboxyadamantane was oxidized and partitioned similarly to obtain 1,3-dicarboxy-5-hydroxyadamantane.

The 1,3-dicarboxy-5-hydroxyadamantane was dissolved in THF, and reacted with an excessive amount of thionyl chloride under reflux for 4 hours. The excessive thionyl chloride and solvent were distilled off to obtain 1,3-dichloroformyl-5-hydroxyadamantane, which was an acid chloride compound of the 1,3-dicarboxy-5-hydroxyadamantane.

The 1,3-dichloroformyl-5-hydroxyadamantane was dissolved in methylene chloride. To this solution were added a small amount of trimethylamine, and then an equimolar amount of trimethylsilyl chloride. Reaction was carried out at room temperature to obtain 1,3-dichloroformyl-5-trimethylsiloxyadamantane.

[Synthesis of Resist Resins]

0.05 mol of the 1,3-dihydroxy-5-trimethylsiloxyadamantane was dissolved in THF. To this solution were added 0.040 mol of the 1,3-dichloroformyl-5-trimethylsiloxyadamantane, and then 0.010 mol of 1,3-dicarboxyl-5-hydroxy-adamantane. The mixture was stirred while keeping its temperature at room temperature, and, to this, a solution of 0.1 mol of triethylamine in THF was gradually added dropwise. After stirring two hours, the mixture was stirred at room temperature for a further two hours. The reaction solution was filtered, and then gradually added dropwise to water for reprecipitation. The precipitate was dissolved again in THF. By adding tetrabutylammonium fluoride (TBAF) to this solution, trimethylsilyl was eliminated. The reaction solution was gradually added dropwise to water for reprecipitation, thereby obtaining Ester Oligomer 1 (containing a polyacid anhydride). The molecular weight of the oligomer was found to be 4,000. The chemical formula of Ester oligomer 1 is as follows:

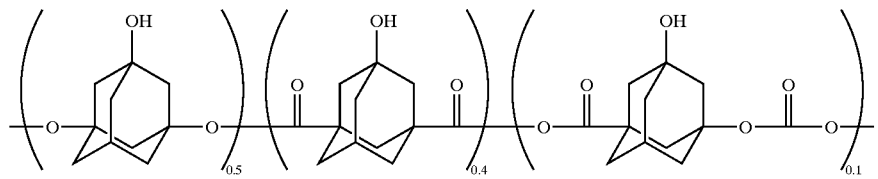

0.05 mol of the 1,3-dichloroformyl-5-trimethylsiloxyadamantane was dissolved in THF. To this solution were added 0.040 mol of menthane diol, and then 0.010 mol of the 1,3-dicarboxy-5-hydroxyadamantane. The mixture was stirred while keeping its temperature at room temperature, and, to this, a solution of 0.1 mol of triethylamine in THF was gradually added dropwise. After stirring for two hours, the reaction solution was stirred for a further two hours at room temperature. The reaction solution was filtered, and then gradually added dropwise to water for reprecipitation. The precipitate was dissolved again in THF. By adding TBAF to this solution, trimethylsilyl was eliminated. The reaction solution was gradually added dropwise to water for reprecipitation to obtain Ester oligomer 2 (containing a polyacid anhydride). The molecular weight of this oligomer was found to be 3,500. Ester Oligomer 2 has the following chemical formula:

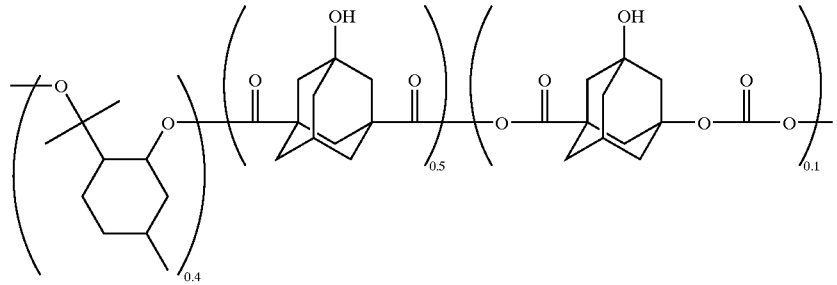

0.05 mol of the 1,3-dichloroformyl-5-trimethylsiloxyadamantane was dissolved in THF. To this solution was added 0.050 mol of menthane diol. The mixture was stirred while keeping its temperature at room temperature, and, to this, a solution of 0.1 mol of triethylamine in THF was gradually added dropwise. After stirring for two hours, the reaction solution was stirred for a further four hours at room temperature. The reaction solution was filtered, and then gradually added dropwise to water for reprecipitation. The precipitate was dissolved again in THF. By adding TBAF to this solution, trimethylsilyl was eliminated. The reaction solution was gradually added dropwise to water for reprecipitation to obtain Ester Oligomer 3. The molecular weight of this oligomer was found to be 3,000. Ester Oligomer 3 has the following chemical formula:

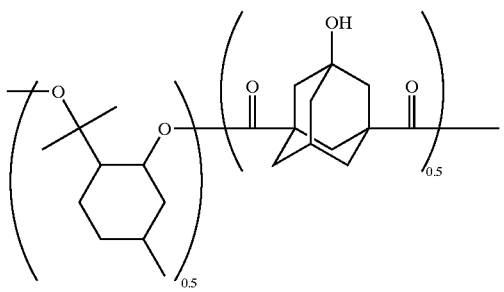

[Synthesis of Comparative Polymer]
[Synthesis of Comparative Ester Oligomer]

0.05 mol of 1,3-diacetylchloride adamantane was dissolved in THF. To this solution was added 0.05 mol of menthane diol. The mixture was stirred while keeping its temperature at room temperature, and, to this, a solution of 0.1 mol of triethylamine in THF was gradually added dropwise. After stirring for two hours, the reaction solution was stirred for a further two hours at room temperature. The reaction solution was filtered, and then gradually added dropwise to water. The precipitate was reprecipitated from a water-acetone solvent to obtain Comparative Ester Oligomer A. This oligomer has the following chemical formula:

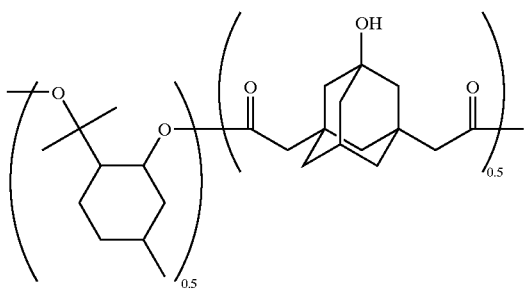

[Synthesis of Dissolution-Preventive Agents]

0.1 Molar equivalent of beta-naphthol novolak was dissolved in THF. This solution was stirred together with a sufficient amount of di-t-butyl dicarbonate in the presence of 0.1 mol of sodium hydroxide at room temperature for 6 hours. The reaction solution was then mixed with water, and extracted from ethyl acetate to obtain t-butoxycarbonylated naphthol novolak (tBocNN) with a molecular weight of 3,000. The rate of introduction of naphthodicarbonyl into tBocNN was 100 mol % of the total hydroxyl group.

To tert-butyl malonate was added, in THF, an equimolar amount of sodium hydroxide. To this mixture was added bromomethyladamantyl ketone, and the mixture was stirred for 3 hours. The salt produced was filtered off, and the filtrate was concentrated to obtain di-tert-butyl 2-((1-adamantyl) carbonylmethyl) malonate (ADTB).

1-Naphthol was condensed with glyoxylic acid in the presence of oxalic acid catalyst to obtain a novolak compound. This compound was dissolved in dihydropyrane. To this solution was added a catalytic amount of hydrochloric acid to obtain a pyranylated novolak compound (NV4THP).

[Preparation of Resists and Formation of Resist Patterns]

The above-synthesized resist resins and dissolution-preventive agents, and TPS-105 or NAI-105 manufactured by Midori Kagaku Co., Ltd., Japan, photo acid generator, were dissolved in cyclohexanone in accordance with the formulations shown in Table II-8, thereby obtaining varnishes of the resists of Examples II-12 to II-16. On the other hand, a comparative varnish was prepared by using the resist of Comparative Example II-6 and TPS-105, photo acid generator, as shown in Table II-8.

TABLE II-8

|  | Oligomer (%) | Additive (%) | Acid Generator (%) |
|---|---|---|---|
| Ex. II-12 | Ester Oligomer 1 (99) | — | TPS-105 (1) |
| Ex. II-13 | Ester Oligomer 1 (79) | ADTP (20) | NAI-105 (1) |
| Ex. II-14 | Ester Oligomer 1 (79) | NV4THP (20) | NAI-105 (1) |
| Ex. II-15 | Ester Oligomer 2 (99) | — | NAI-105 (1) |
| Ex. II-16 | Ester Oligomer 2 (99) | — | NAI-105 (1) |
| Comp. Ex. II-6 | Comparative Ester Oligomer A (99) | — | NAI-105 (1) |

Subsequently, these varnishes of the resists were respectively spin-coated onto silicone wafers to form resists films, each having a thickness of 0.3 micrometers. The surfaces of these resist films were exposed to light of 193 nm emitted by a stepper having an NA of 0.55, using as the light source, an ArF excimer laser, thereby conducting pattern-wise exposure. Thereafter, the resist films were baked at 110° C. for 2 minutes, and developed by a mixture of a 2.38% aqueous solution of tetramethylammonium hydroxide (TMH) and isopropyl alcohol to selectively dissolve and remove the exposed area, thereby forming positive resist patterns. The sensitivities of these resists, and the degrees of resolution of the resist patterns are shown in Table II-9.

TABLE II-9

|  | Sensitivity (mJ/cm$^2$) | Resolution ($\mu$mL/S) | Remarks |
|---|---|---|---|
| Ex. II-12 | 14 | 0.15 | Pattern Configuration: good |
| Ex. II-13 | 12 | 0.14 | Pattern Configuration: good |
| Ex. II-14 | 22 | 0.15 | Pattern Configuration: good |
| Ex. II-15 | 15 | 0.14 | Pattern Configuration: good |
| Ex. II-16 | 20 | 0.15 | Pattern Configuration: good |
| Comp. Ex. II-6 | 13 | 0.15 | Pattern peeled greatly |

The data shown in Table II-9 demonstrate the following: when the resists of Examples II-12 to II-16 are used, resist patterns excellent in resolution can be formed at high sensitivities, and these resists are excellent in transparency against light with a wavelength of 193 nm and in alkali developability; while, when the resist of Comparative Example II-6 is used, a resist pattern excellent in resolution cannot be formed, and the resist pattern readily peels off.

These resists were also evaluated in terms of dry-etching resistance by measuring their etching rates in $CF_4$ plasma etching. As a result, the following were found: the etching rate of the resist containing polyhydroxystyrene resin as its base resin being taken as 1.0, the etching rate of the resist of Comparative Example II-6 was 1.0, while those of the resists of Examples II-12 to II-16 were from 0.9 to 1.2. The resists of Examples II-12 to II-16 were thus confirmed to have high dry-etching resistance.

Examples II-17 to II-19

In THF, the following monomers, Compound II-18 and Compound II-19, were mixed with each other in a ratio of 2:8. To this mixture was added 10 mol % of AIBN, and copolymerization was conducted at 60° C. for 40 hours. The reaction solution was added dropwise to hexane. The precipitate was filtered off, and dried to obtain a resin of Example II-17. The molecular weight of this resin was found to be 12,000.

Compound II-18

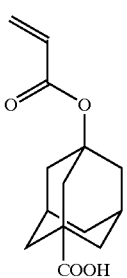

Compound II-19

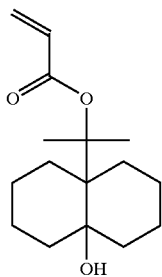

In THF, the following monomers, Compound II-20, Compound II-21 and Compound II-22, were mixed in a ratio of 7:2:1. To this mixture was added 10 mol % of AIBN, and copolymerization was conducted at 60° C. for 40 hours. The reaction solution was added dropwise to hexane. The precipitate was filtered off, and dried to obtain a resin of Example II-18. This resin was found to have a molecular weight of 47,000 with a wide molecular weight distribution. It is assumed that a part of the polymer is cross-linked three-dimensionally.

Compound II-20

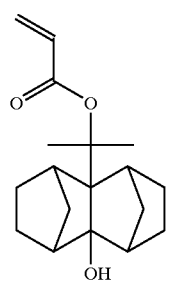

Compound II-21

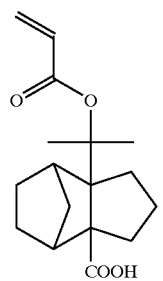

Compound II-22

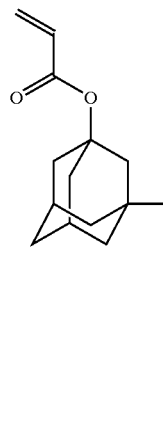

In THF, the following monomers, Compound II-23 and Compound II-24, were mixed with each other in a ratio of 6:4. To this mixture was added 10 mol % of AIBN, and copolymerization was 5 conducted at 60° C. for 40 hours. The reaction solution was added dropwise to hexane. The precipitate was filtered off, and dried to obtain a resin of Example II-19. The molecular weight of this resin was found to be 17,000.

Compound II-23

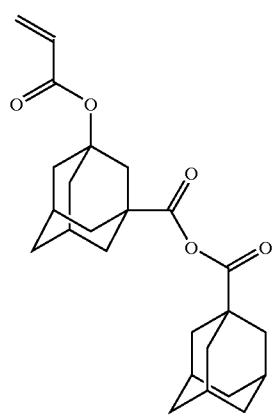

Compound II-24

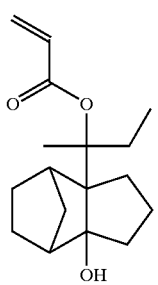

One part by weight of TPS-105 manufactured by Midori Kagaku Co., Ltd., Japan was added as a photo acid generator to each one of the above-synthesized polymers of Examples of II-17 to II-19. These mixtures were respectively dissolved in cyclohexanone, and the solutions were filtered to obtain varnishes of the resists of Examples II-17 to II-19.

Subsequently, these varnishes of the resists were respectively spin-coated onto silicone wafers to form resists films, each having a thickness of 0.3 micrometers. The surfaces of these resist films were exposed to light of 193 nm emitted by a stepper with an NA of 0.54, using an ArF excimer laser as the light source, thereby conducting pattern-wise exposure. Thereafter, the resist films were baked at 110° C. for 2 minutes, and developed by a 2.38% aqueous solution of tetramethylammonium hydroxide (TMH) to selectively dissolve and remove the exposed area, thereby forming positive resist patterns. The sensitivities of these resists, and the degrees of resolution of the resist patterns are shown in Table II-10.

TABLE II-10

| Resist | Sensitivity (mJ/cm$^2$) | Resolution ($\mu$ml/S) |
| --- | --- | --- |
| Ex. II-17 | 13 | 0.15 |
| Ex. II-18 | 12 | 0.14 |
| Ex. II-19 | 12 | 0.14 |

The data shown in Table II-10 demonstrate the following: when the resists of Examples II-17 to II-19 are used, resist patterns excellent in resolution can be formed at high sensitivities, and these resists are excellent both in transparency against light with a wavelength of 193 nm and alkali developability.

These resists were also evaluated in terms of dry-etching resistance by measuring their etching rates in CF$_4$ plasma etching. As a result, the following were found: the etching rate of the resist containing a novolak resin as its base being taken as 1.0, the etching rate of the resist of Comparative Example II-6 was 1.2, while those of the resists of Examples II-17 to II-19 were from 0.9 to 1.0. The resists of Examples II-17 to II-19 were thus confirmed to have high dry-etching resistance.

Examples II-20 and II-21

The following monomer, Compound II-26, and Compound II-19 were mixed with each other in THF in a ratio of 4:6. To this mixture was added 10 mol % of AIBN, and copolymerization was conducted at 60° C. for 40 hours. The reaction solution was added dropwise to hexane. The precipitate was filtered off, and dried to obtain a resin of Example II-20. The molecular weight of this resin was found to be 10,000.

Compound II-26

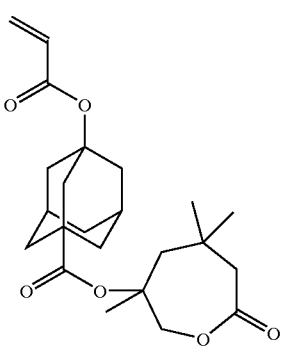

Compound II-20, and the following monomer, Compound II-27, were mixed with each other in THF in a ratio of 6:4. To this mixture was added 10 mol % of AIBN, and copolymerization was conducted at 60° C. for 40 hours. The reaction solution was added dropwise to hexane. The precipitate was filtered off, and dried to obtain a resin of Example II-21. The molecular weight of this resin was found to be 12,000.

Compound II-27

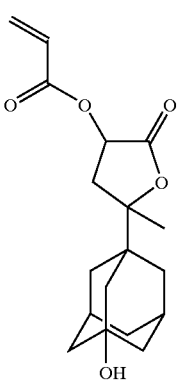

Examples II-22 and II-23

The following monomer, Compound II-28, and Compound II-19 were mixed with each other in THF in a ratio of 4:6. To this mixture was added 10 mol % of AIBN, and copolymerization was conducted at 60° C. for 40 hours. The reaction solution was added dropwise to hexane. The precipitate was filtered off, and dried to obtain a polymer of Example II-22. The molecular weight of this polymer was found to be 6,000.

Compound II-28

The following monomer, Compound II-29, and Compound II-20 were mixed with each other in THF in a ratio of 2:8. To this mixture was added 10 mol % of AIBN, and copolymerization was conducted at 60° C. for 40 hours. The reaction solution was added dropwise to hexane. The precipitate was filtered off, and dried to obtain a polymer of Example II-23. The molecular weight of this polymer was found to be 7,500.

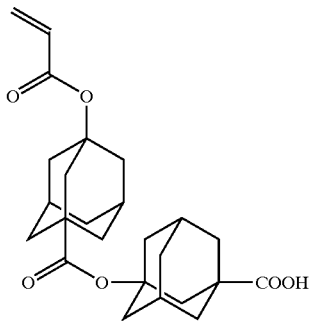

Compound II-29

One part by weight of TPS-105 manufactured by Midori Kagaku Co., Ltd., Japan was added, as a photo acid generator, to each one of the above-synthesized resist resins of Examples of II-20 to II-23. These mixtures were respectively dissolved in cyclohexanone, and the solutions were filtered to obtain varnishes of the resists of Examples II-20 to II-23.

Subsequently, these varnishes of the resists were respectively spin-coated onto silicone wafers to form resists films, each having a thickness of 0.3 micrometers. The surfaces of these resist films were exposed to light of 193 nm emitted by a stepper with an NA of 0.55, using an ArF excimer laser as the light source, thereby conducting pattern-wise exposure. Thereafter, the resist films were baked at 110° C. for 2 minutes, and developed by an aqueous solution of tetramethylammonium hydroxide (TMH) to selectively dissolve and remove the exposed area, thereby forming positive resist patterns. The sensitivities of these resist resins and the degrees of resolution of the resist patterns are shown in Table II-11.

TABLE II-11

| Resist | Sensitivity (mJ/cm$^2$) | Resolution (μmL/S) |
|---|---|---|
| Ex. II-20 | 10 | 0.14 |
| Ex. II-21 | 11 | 0.14 |
| Ex. II-22 | 15 | 0.14 |
| Ex. II-23 | 13 | 0.14 |

The resists of Examples II-20 to II-23 were also evaluated in terms of dry-etching resistance by measuring their etching rates in CF$_4$ plasma etching. As a result, it was confirmed that their dry-etching resistance was 0.8 to 1.0 time that of novolak resin.

Examples II-24 and II-25 and Comparative Example II-7

The following monomers, Compound II-30 and Compound II-31, were mixed with each other in THF in a ratio of 4:6. To this mixture was added 10 mol % of AIBN, and copolymerization was conducted at 60° C. for 40 hours. The reaction solution was added dropwise to hexane. The precipitate was filtered off, and dried to obtain a resin of Example II-24. The molecular weight of this resin was found to be 6,000.

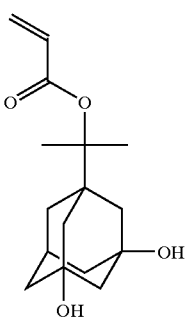

Compound II-30

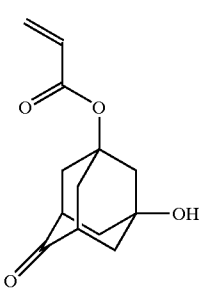

Compound II-31

The following monomers, Compound II-32 and Compound II-33, and maleic anhydride were mixed in THF in a ratio of 3.5:3:3.5. To this mixture was added 10 molt 5 of AIBN, and copolymerization was conducted at 60° C. for 40 hours. The reaction solution was added dropwise to hexane. The precipitate was filtered off, and dried to obtain a resin of Example II-21. The molecular weight of this resin was found to be 5,500.

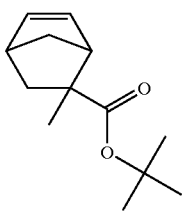

Compound II-32

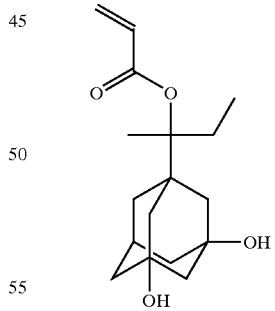

Compound II-33

As Comparative Example II-7, Compound II-32, 2-acryloyloxy-7-hydroxy-methyltricyclodecane and maleic anhydride were mixed in THF in a ratio of 3.5:3:3.5. To this mixture was added 10 mol % of AIBN, and copolymerization was conducted at 60° C. for 40 hours. The reaction solution was added dropwise to hexane. The precipitate was filtered off, and dried to obtain a resin of Comparative Example II-7. The molecular weight of this resin was found to be 9,000.

One part by weight of TPS-105 manufactured by Midori Kagaku Co., Ltd., Japan was added, as a photo acid generator, to each one of the above-synthesized resist resins of Examples of II-24 and II-25, and Comparative Example II-7. These mixtures were respectively dissolved in cyclohexanone, and the solutions were filtered to obtain varnishes of the resists of Examples II-24 and II-25 and of Comparative Example II-7.

Subsequently, these varnishes of the resists were respectively spin-coated onto silicone wafers to form resists films, each having a thickness of 0.3 micrometers. The surfaces of these resist films were exposed to light of 193 nm emitted by a stepper with an NA of 0.55, using an ArF excimer laser as the light source, thereby conducting pattern-wise exposure. Thereafter, the resist films were baked at 110° C. for 2 minutes, and developed by an aqueous solution of tetramethylammonium hydroxide (TMH) to selectively dissolve and remove the exposed area, thereby forming a positive resist pattern. The sensitivities of the resist resins and the degrees of resolution of the resist patterns are shown in Table II-12.

TABLE II-12

| | Sensitivity (mJ/cm$^2$) | Resolution ($\mu$mL/S) | Remarks |
|---|---|---|---|
| Ex. II-24 | 12 | 0.14 | Pattern Configuration: good |
| Ex. II-25 | 17 | 0.13 | Pattern Configuration: good |
| Comp. Ex. II-7 | 55 | 0.5 | Scummy |

The data shown in Table II-12 demonstrate that remarkably good effects are obtained when the resin structure of the present invention is combined with maleic anhydride. The resists of Examples II-24 and II-25 were also evaluated in terms of dry-etching resistance by measuring their etching rates in CF$_4$ plasma etching. As a result, it was confirmed that their dry-etching resistance was 0.8 to 1.0 time that of novolak resin. Examples III-1 to III-9 and Comparative Examples III-1 to III-4 <Synthesis of Starting Compounds (Adamantane Compounds (Monomers) Having >C=O)>
[Synthesis of Compound (III-A) and Compound (III-B)]

One mol of 2-adamantyl ketone was stirred in an acetic acid-acetic anhydride solution of cro$_3$, oxidizing agent, with heating. After carrying out the reaction for 8 hours, the reaction solution was neutralized to obtain a mixture of polyhydroxylated compounds of adamantyl ketone. This mixture was partitioned by high performance liquid chromatography to obtain 1-hydroxy-4-adamantanone (Compound (III-A)), and 1,3-dihydroxy-6-adamantanone (Compound (III-B)).

[Synthesis of Compound (III-C)]

In the same manner as in the synthesis of Compound (III-A) and (III-B), 1, 3-dicarboxyadamantane was oxidized, and partition was conducted to obtain 1,3-dicarboxy-6-adamantanone (Compound (III-C)).

[Synthesis of Compound (III-D)]

Compound (III-C) was dissolved in THF, and reacted with an excessive amount of thionyl chloride for 4 hours under reflux. The excessive thionyl chloride and solvent were distilled off to obtain an acid chloride compound of Compound (III-C) (Compound (III-D)).

[Synthesis of Compound (III-E)]

Compound (III-A) was dissolved in THF, and stirred together with an equimolar amount of acrylic acid chloride. To this mixture was added dropwise an excessive amount of triethylamine at room temperature, and the mixture was stirred for 3 hours. The salt precipitated was filtered off, and the filtrate was concentrated to obtain an acrylic ester of Compound (III-A) (Compound (III-E)).

Figure 4:
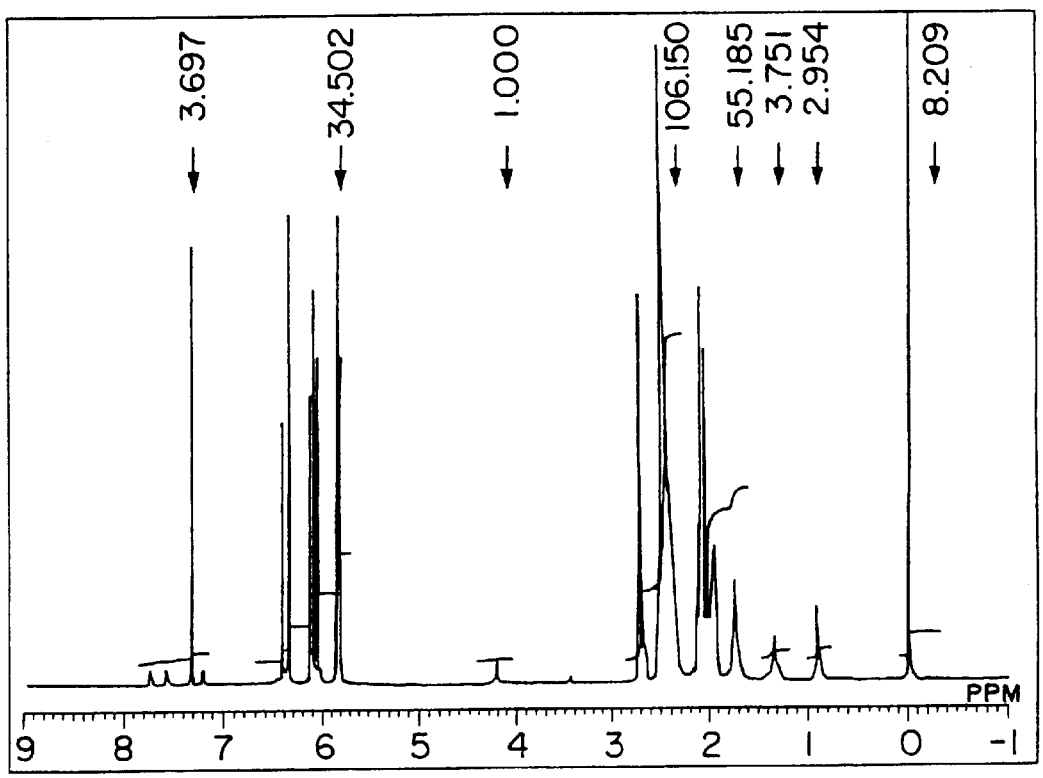
FIGS. 4 and 5 are $^1$H-NMR charts of Compounds (III-E) and (III-F), respectively, for use in the production of resist resins of the present invention.

The $^1$HNMR chart of this compound is shown in FIG. 4.

[Synthesis of Compound (III-F)]

Figure 5:
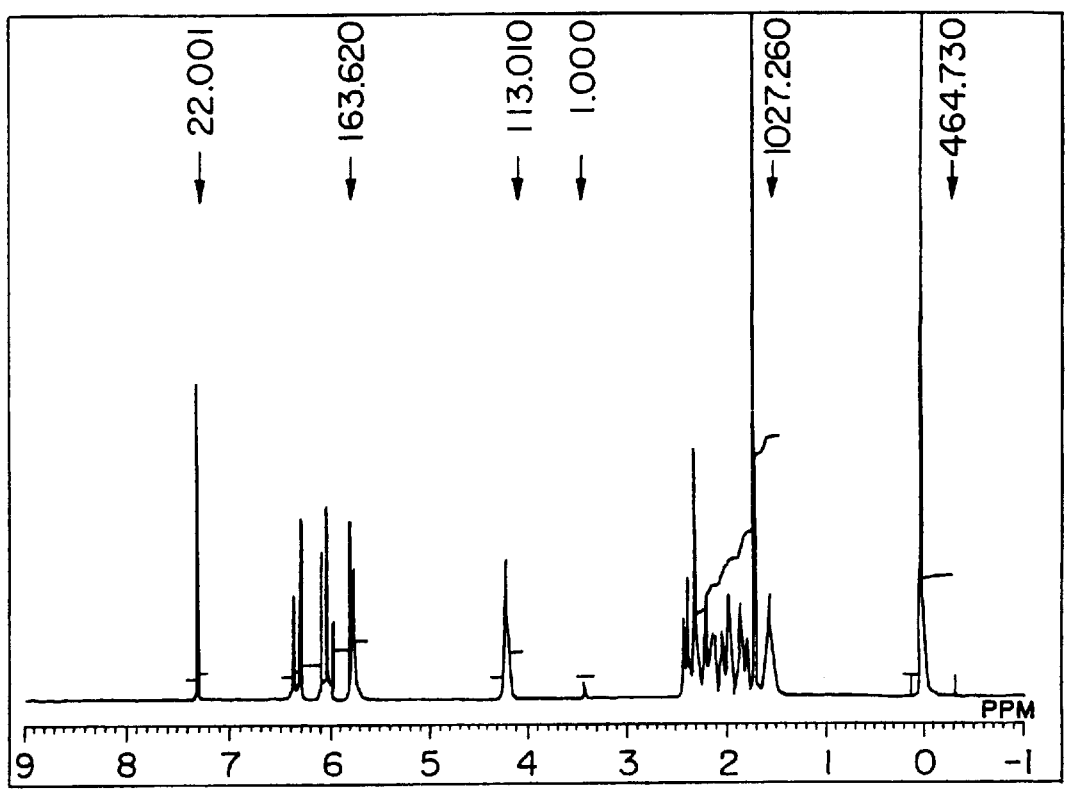

Compound (III-E) and an equimolar amount of 2,2'-dimethyl-1,3-dioxane-4,6-dione were stirred in pyridine at room temperature for one week. The reaction product was added dropwise to water to obtain 1-acryloyloxylated 4-(5-adamatylidene)-2,2-dimethyl-1,3-dioxane-4,6-dione (Compound (III-F)). The $^1$HNMR chart of this compound is shown in FIG. 5.

[Synthesis of Compound (III-G)]

Dihydropyrane was added to methacrylic acid by the use of an acid catalyst to obtain tetrahydropyranyl methacrylate (Compound (III-G)).

[Synthesis of Compound (III-H)]

1-Adamantanol and acrylic acid chloride were subjected to desalting reaction by the use of a basic catalyst to obtain adamantyl acrylate (Compound (III-H)).

It is noted that methacrylic acid, menthane diol and 1,3-dicarboxyl adamantane were reagents manufactured by Aldrich Chemical Company, Inc., and used as they were.

[Synthesis of Compound (III-I)]

2-Methyl-2-adamantanol was dissolved in methylene chloride, and the solution was stirred together with an equimolar amount of acrylic acid chloride. To this mixture was added dropwise an excessive amount of triethylamine at room temperature, and the mixture was stirred for 3 hours. The salt precipitated was filtered off, and the filtrate was concentrated to obtain an acrylic ester of 2-methyl-2-adamantanol (Compound (III-I)).

[Synthesis of Compound (III-J)]

Hydroxypinanone was dissolved in THF, and the solution was stirred together with an equimolar amount of acrylic acid chloride. To this mixture was added dropwise an excessive amount of triethylamine at room temperature, and the mixture was stirred for 3 hours. The salt precipitated was filtered off, and the filtrate was concentrated to obtain an acrylic ester of hydroxypinanone (Comparative Monomer J).

Synthesis of Resins 0.6 mol of Compound (III-E) and 0.4 mol of Compound (III-G) were mixed with 200 g of THF. Subsequently, 2 g of AIBN was added to this mixture, and the resulting mixture was heated at 60° C. for 36 hours. The reaction solution was added dropwise to hexane to obtain Copolymer III-1 having an average molecular weight of approximately 7,000. The structural formula of Copolymer III-1 is as follows:

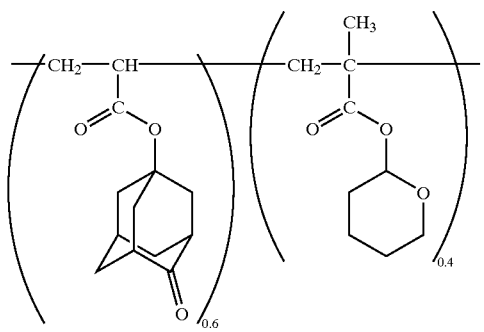

0.6 mol of Compound (III-F) and 0.4 mol of Compound (III-G) were mixed with 200 g of THF. Subsequently, 2 g of AIBN was added to this mixture, and the resulting mixture was heated at 60° C. for 36 hours. The reaction solution was added dropwise to hexane to obtain Copolymer III-2 having an average molecular weight of approximately 8,000. The structural formula of Copolymer III-2 is as follows:

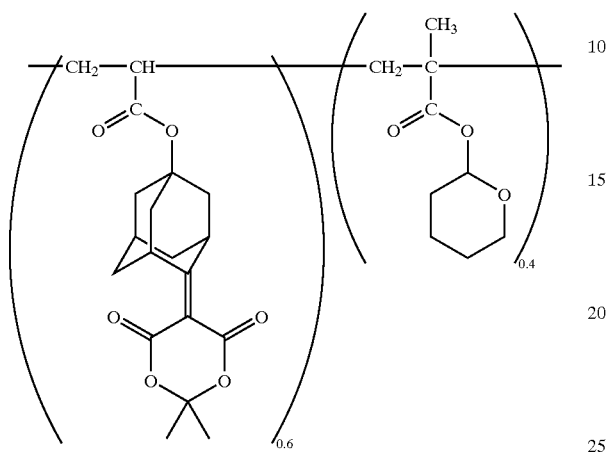

0.6 mol of Compound (III-E) and 0.4 mol of Compound (III-I) were mixed with 200 g of THF. Subsequently, 2 g of AIBN was added to this mixture, and the resulting mixture was heated at 60° C. for 36 hours. The reaction solution was added dropwise to hexane to obtain Copolymer III-3 having an average molecular weight of approximately 5,000. The structural formula of Copolymer III-3 is as follows:

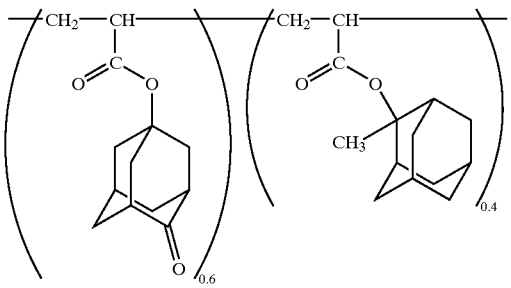

0.04 mol of Compound (III-B) was dissolved in THF. To this solution were added 0.05 mol of Compound (III-D), and then 0.010 mol of Compound (III-C). The mixture was stirred while keeping its temperature at room temperature, and, to this, a solution of 0.1 mol of triethylamine in THF was gradually added dropwise. After stirring for 2 hours, the mixture was stirred at room temperature for a further 2 hours, and the reaction solution was filtered. The filtrate was gradually added dropwise to water, and the precipitate was reprecipitated to obtain Ester Oligomer III-4 (containing a polyacid anhydride). The average molecular weight of this oligomer was found to be 4,000. The structural formula of Ester oligomer III-4 is as follows:

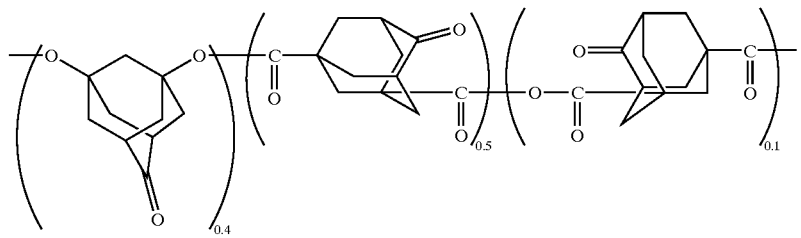

0.05 mol of Compound (III-D) was dissolved in THF. To this solution were added 0.040 mol of menthane diol, and then 0.010 mol of Compound (III-C). The mixture was stirred while keeping its temperature at room temperature, and, to this, a solution of 0.1 mol of triethylamine in THF was gradually added dropwise. After stirring for 2 hours, the mixture was stirred at room temperature for a further 2 hours, and the reaction solution was filtered. The filtrate was gradually added dropwise to water, and the precipitate was reprecipitated to obtain Ester Oligomer III-5 (containing a polyacid anhydride). The average molecular weight of this oligomer was found to be 3,500. The structural formula of Ester Oligomer III-5 is as follows:

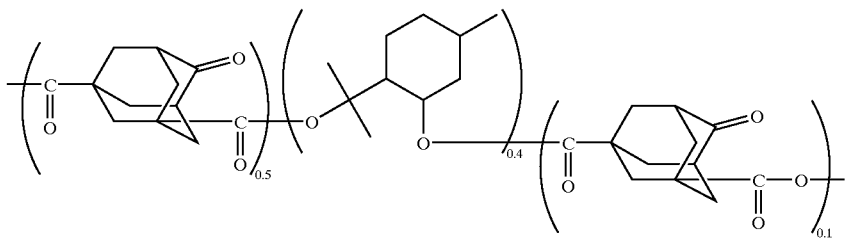

0.05 mol of Compound (III-D) was dissolved in THF. To this solution was added 0.050 mol of menthane diol. The mixture was stirred while keeping its temperature at room temperature, and, to this, a solution of 0.1 mol of triethylamine in THF was gradually added dropwise. After stirring for 2 hours, the mixture was stirred at room temperature for a further 4 hours, and the reaction solution was filtered. The filtrate was gradually added dropwise to water, and the precipitate was reprecipitated to obtain Ester oligomer III-6. The average molecular weight of this oligomer was found to be 3,000. The structural formula of Ester oligomer III-6 is as follows:

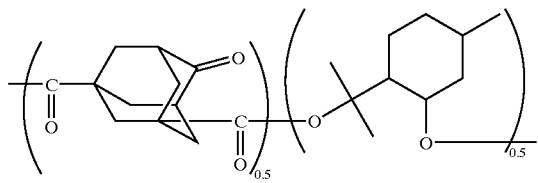

Synthesis of Comparative Acrylate Polymers 0.6 mol of the adamatyl acrylate (Compound (III-H)) and 0.4 mol of the tetrahydropyrany methacrylate (Compound (III-G)) were reacted with each other in THF for 40 hours by the use of AIBN(10mol %) as an initiator. The reaction solution was added dropwise to hexane to obtain Comparative Acrylate Polymer III-A. The structural formula of this polymer is as follows:

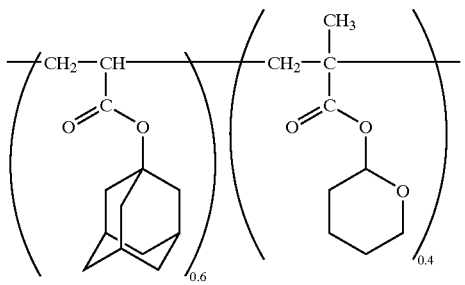

0.6 mol of Compound (III-J) and 0.4 mol of Compound (III-G) were mixed with 200 g of THF. Subsequently, 2 g of AIBN was added to this mixture, and the resulting mixture was heated at 60° C. for 36 hours. The reaction solution was added dropwise to hexane to obtain Comparative Acrylate Polymer III-B having an average molecular weight of approximately 10,000. The structural formula of this polymer is as follows:

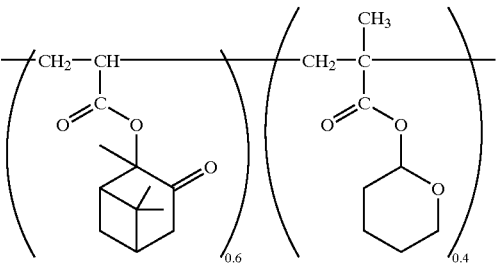

0.5 mol of Compound (III-E), 0.4 mol of Compound (III-G) and 0.1 mol of methacrylic acid were mixed with 200 g of THF. Subsequently, 2 g of AIBN was added to this mixture, and the resulting mixture was heated at 60°C. for 36 hours. The reaction solution was added dropwise to hexane to obtain Comparative Acrylate Polymer III-C having an average molecular weight of approximately 8,000. The structural formula of this polymer is as follows:

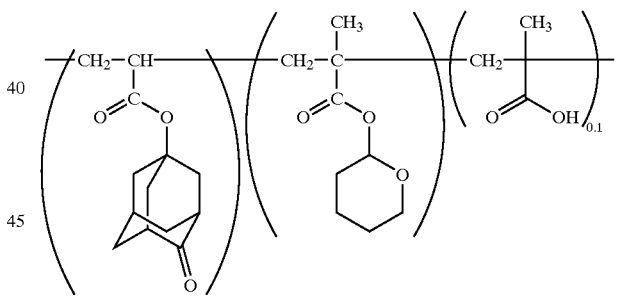

Synthesis of Comparative Ester Polymer 0.05 mol of adamantandicarbonyl chloride was dissolved in THF, and to this solution was added 0.05 mol of menthane diol. The mixture was stirred while keeping its temperature at room temperature, and, to this, a solution of 0.1 mol of trimethylamine in THF was gradually added dropwise. After stirring for two hours, the reaction solution was stirred for a further 2 hours, and then filtered. The filtrate was gradually added dropwise to water, and the precipitate was reprecipitated from a water-acetone solvent to obtain Comparative Ester Oligomer III-D. The structural formula of this oligomer is as follows:

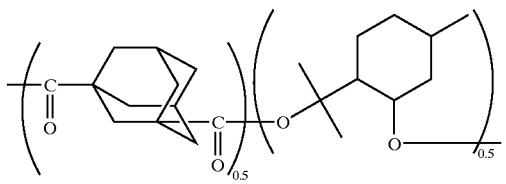

Synthesis of Dissolution-Preventive Agents

Beta-naphthol novolak in an amount of 0.1 mol in terms of naphthol was dissolved in THF. This solution was stirred together with a sufficient amount of di-t-butyl dicarbonate in the presence of 0.1 mol of sodium hydroxide at room temperature for 6 hours. The reaction solution was mixed with water, and extracted from ethyl acetate to obtain t-butoxycarbonylated naphthol novolak (tBocNN) having a molecular weight of 3,000. The rate of introduction of t-butoxycarbonyl into the tBocNN was 100 mol % of the total hydroxyl group.

To tert-butyl malonate was added, in THF, an equimolar amount of sodium hydroxide. To this mixture was added bromomethyl amadantyl ketone, and the mixture was stirred for 3 hours. The salt precipitated was filtered off, and the filtrate was concentrated to obtain di-tert-butyl 2-((1-amadantyl)carbonyl-methyl)malonate (ADTB).

1-Naphthol was condensed with glyoxylic acid in the presence of oxalic acid catalyst to obtain a novolak compound. This compound was dissolved in dihydropyrane. To this solution was added a catalytic amount of hydrochloric acid to obtain a pyranylated novolak compound (NV4THP).

Preparation of Resists & Formation of Resist Patterns

The above-synthesized polymer compounds and dissolution-preventive agents, and TPS-105 or NAI-105 manufactured by Midori Kagaku Co., Ltd., Japan, photo acid generator, were dissolved in cyclohexanone (polyester type) or PGMEA (acrylic type) in accordance with the formulations shown in Tables III-1 and III-2 to obtain varnishes of the resists of Examples III-1 to III-9.

TABLE III-1

| | Polymer or Oligomer (%) | Additive (%) | Acid Generator (%) |
|---|---|---|---|
| Ex. III-1 | Copolymer 1 (99) | — | TPS-105 (1) |
| EX. III-2 | Copolymer 1 (79) | t-BocNN (20) | TPS-105 (1) |
| Ex. III-3 | Copolymer 2 (99) | — | TPS-105 (1) |
| Ex. III-4 | Copolymer 3 (99) | — | TPS-105 (1) |
| Ex. III-5 | Ester Oligomer 4 (99) | — | TPS-105 (1) |
| Ex. III-6 | Ester Oligomer 4 (79) | ADTB (20) | NAI-105 (1) |
| Ex. III-7 | Ester Oligomer 4 (79) | NV4THP (20) | NAI-105 (1) |
| Ex. III-8 | Ester Oligomer 5 (99) | — | NAI-105 (1) |
| Ex. III-9 | Ester Oligomer 6 (99) | — | TPS-105 (1) |

On the other hand, comparative varnishes III-1 to III-4 were prepared by using the comparative polymers, and TPS-105, photo acid generator, as shown in Table III-2.

TABLE III-2

| | Polymer or Oligomer (%) | Additive (%) | Acid Generator (%) |
|---|---|---|---|
| Comp.Ex. III-1 | Comparative Acryl Polymer A (99) | — | TPS-105 (1) |
| Comp.Ex. III-2 | Comparative Acryl Polymer B (99) | — | TPS-105 (1) |
| Comp.Ex. III-3 | Comparative Acryl Polymer C (99) | — | TPS-105 (1) |
| Comp.Ex. III-4 | Comparative Acryl Polymer D (99) | — | TPS-105 (1) |

Subsequently, these varnishes of the resists were respectively spin-coated onto silicon wafers to form resist films, each having a thickness of 0.3 micrometers. These resists films were respectively exposed to light of 193 nm emitted by a stepper with an NA of 0.55, using as the light source an ArF excimer laser, thereby conducting pattern-wise exposure. Thereafter, these resist films were baked at 110° C. for 2 minutes, and then developed by a mixture of a 2.38% aqueous solution of tetramethylammonium hydroxide (TMAH), MAH and isopropyl alcohol. The exposed area was thus selectively dissolved and removed to form positive resist patterns. The sensitivities of the resist resins, and the degrees of resolution of the resist patterns are shown in Table III-3.

TABLE III-3

| | Sensitivity (mJ/cm$^2$) | Resolution ($\mu$mL/S) | Remarks |
|---|---|---|---|
| Ex. III-1 | 5 | 0.15 | Good |
| Ex. III-2 | 15 | 0.15 | Good |
| Ex. III-3 | 10 | 0.15 | Good |
| Ex. III-4 | 7 | 0.14 | Good |
| Ex. III-5 | 14 | 0.15 | Good |
| Ex. III-6 | 12 | 0.14 | Good |
| Ex. III-7 | 22 | 0.15 | Good |
| Ex. III-8 | 15 | 0.14 | Good |
| Ex. III-9 | 20 | 0.15 | Good |
| Comp. Ex. III-1 | 22 | 0.35 | Impossible to form fine pattern |
| Comp. Ex. III-2 | 10 | 0.19 | Pattern peeled greatly |
| Comp. Ex. III-3 | 7 | 0.17 | Pattern peeled greatly, used thin developer |
| Comp. Ex. III-4 | 3 | 0.15 | Pattern peeled greatly |

The date shown in Table III-3 demonstrate the following: when the resists of Examples III-1 to III-9 are used, resist patterns excellent in resolution can be formed at high sensitivities, and these resists are excellent in both transparency against light with a wavelength of 193 nm and alkali developability; while, when the resists of Comparative III-1 to III-3 are used, resist patterns excellent in resolution cannot be formed, and the resist films readily peel off.

In addition, these resists were evaluated in terms of dry-etching resistance by measuring their etching rates in $CF_4$ plasma etching. As a result, it was found the following: the etching rate of the resist containing as its base resin polyhydroxystyrene resin being taken as 1.0, the etching rates of the resists of Comparative Examples III-1 and III-4 are from 1.0 to 1.3 (moderate), and those of the resists of Comparative Examples III-2 and III-3 are approximately 1.4 to 1.6 (poor); while the etching rates of the resists of Examples III-1 to III-9 are from 0.9 to 1.2. The resists of Examples III-1 to III-9 are thus confirmed to have high dry-etching resistance.

Examples III-10 to III-18 and Comparative Examples III-5 to III-9

Synthesis of Starting Compounds (Adamantane Compounds (Monomers) Having Lactonyl Group)

[Synthesis of Compound (III-a) and Compound (III-b)]

One mol of 2-adamantyl ketone was stirred in an acetic acid-acetic anhydride solution of $CrO_3$, oxidizing agent, with heating. After carrying out the reaction for 8 hours, the reaction solution was neutralized to obtain a mixture of polyhydroxylated compounds of adamantyl ketone. This mixture was partitioned by high performance liquid chromatography to obtain 1-hydroxy-4-adamantanone (Compound (III-a)) and 1,3-dihydroxy-6-adamantanone (Compound (III-b)).

[Synthesis of Compound (III-c)]

Similarly, 1,3-dicarboxyadamantane was oxidized, and partition was conducted to obtain 1, 3-dicarboxy-6-adamantanone, Compound (III-c). ps [Synthesis of Compound (III-d)]

Compound (III-c) was dissolved in THF, and reacted with an excessive amount of thionyl chloride under reflux for 4 hours. The excessive thionyl chloride and solvent were distilled off to obtain an acid chloride compound of Compound (III-c) (Compound (III-d)).

[Synthesis of Compound (III-a')]

Compound (III-a) was dissolved in dichloromethane. To this solution was added methachloroperbenzoic acid, and the mixture was stirred at room temperature for 1 hour. The reaction solution was then treated with diazomethane to obtain a lactone (Compound (III-a')).

[Synthesis of Compound (III-b')]

Compound (III-b) was dissolved in dichloromethane. To this solution was added methachloroperbenzoic acid, and the mixture was stirred at room temperature for 1 hour. The reaction solution was then treated with diazomethane to obtain a lactone (Compound (III-b')).

[Synthesis of Compound (III-c')]

Similarly, 1,3-dicarboxyadamantane was oxidized, and partition was conducted to obtain a lactone (Compound (III-c'))

[Synthesis of Compound (III-d')]

Compound (III-c') was dissolved in THF, and reacted with an excessive amount of thionyl chloride under reflux for 4 hours. The excessive thionyl chloride and solvent were distilled off to obtain an acid chloride compound of Compound (III-c') (Compound (III-d')).

[Synthesis of Compound (III-e)]

Compound (III-a') was dissolved in THF, and stirred together with an equimolar amount of acrylic acid chloride. To this mixture was added dropwise an excessive amount of triethylamine at room temperature, and the mixture was stirred for 3 hours. The precipitated salt was filtered off, and the filtrate was concentrated to obtain an acrylic ester of Compound (III-a') (Compound III-e, R in the general formula (3) being acryloyl group).

[Synthesis of Compound (III-f)]

Compound (III-b') was dissolved in THF, and stirred with an equimolar amount of acrylic acid chloride. To this mixture was added dropwise an excessive amount of triethylamine at room temperature, and the mixture was stirred for 3 hours. The precipitated salt was filtered off, and the filtrate was concentrated to obtain an acrylic ester of Compound (III-b') (Compound III-f, R in the general formula (4) being acryloyl group).

[Synthesis of Compound (III-g)]

Dihydropyrane was added to methacrylic acid by the use of an acid catalyst to obtain tetrahydropyranyl methacrylate (Compound (III-g)).

[Synthesis of Compound (III-h)]

1-Adamantanol and acrylic acid chloride were subjected to desalting reaction by using a basic catalyst to obtain adamantyl acrylate (Compound (III-h)).

Methacrylic acid, menthane diol and 1,3-dicarboxyl adamantane are reagents manufactured by Aldrich Chemical Company, Inc., and were used as they were.

[Synthesis of Compound (III-i)]

2-Methyl-2-adamantanol was dissolved in methylene chloride, and stirred together with an equimolar amount of acrylic acid chloride. To this mixture was added dropwise an excessive amount of triethylamine at room temperature, and the mixture was stirred for 3 hours. The precipitated salt was filtered off, and the filtrate was concentrated to obtain an acrylic ester of 2-methyl-2-adamantanol (Compound (III-i)).

[Synthesis of Compound (III-j)]

Hydroxypinanone was dissolved in THF, and stirred together with an equimolar amount of acrylic acid chloride. To this mixture was added dropwise an excessive amount of triethylamine at room temperature, and the mixture was stirred for 3 hours. The precipitated salt was filtered off, and the filtrate was concentrated to obtain an acrylic ester of hydroxypinanone (Comparative Compound (III-j)).

Synthesis of Resins 0.6 mol of Compound (III-e) and 0.4 mol of Compound (III-g) were mixed with 200 g of THF. To this mixture was then added 2 g of AIBN, and the mixture was heated at 60°C. for 36 hours. The reaction solution was added dropwise to hexane to obtain Copolymer III-7 having an average molecular weight of approximately 7,000. The structural formula of this copolymer is as follows:

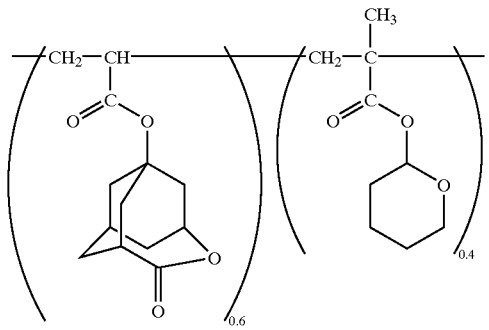

0.6 mol of Compound (III-f) and 0.4 mol of Compound (III-g) were mixed with 200 g of THF. To this mixture was then added 2 g of AIBN, and the mixture was heated at 60° C. for 36 hours. The reaction solution was added dropwise to hexane to obtain Copolymer 1lI-8 having an average molecular weight of approximately 8,000. The structural formula of this copolymer is as follows:

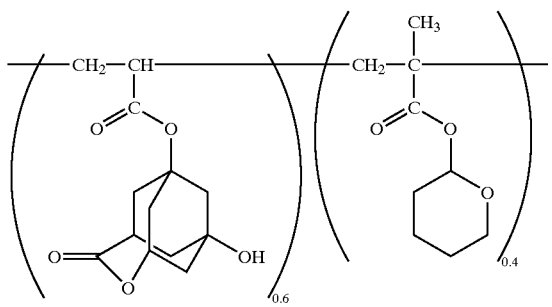

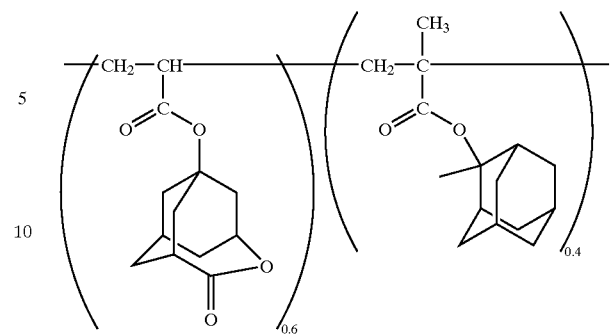

0.6 mol of Compound (III-e) and 0.4 mol of Compound (III-i) were mixed with 200 g of THF. To this mixture was then added 2 g of AIBN, and the mixture was heated at, 60° C. for 36 hours. The reaction solution was added dropwise to hexane to obtain Copolymer III-9 having an average molecular weight of approximately 5,000. The structural formula of this copolymer is as follows:

0.05 mol of Compound (III-b') was dissolved in THF. To this solution were added 0.040 mol of Compound (III-d), and then 0.010 mol of Compound (III-c). The mixture was stirred while maintaining its temperature at room temperature, and, to this, a solution of 0.1 mol of triethylamine in THF was gradually added dropwise. After stirring for 2 hours, the mixture was stirred for a further 2 hours at room temperature, and then filtered. The filtrate was gradually added dropwise to water, and the precipitate was reprecipitated to obtain Ester Oligomer III-10 (containing a polyacid anhydride). The average molecular weight of this oligomer was found to be 4,000. The structural formula of this oligomer is as follows:

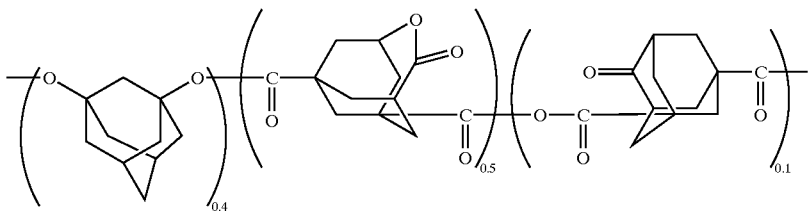

0.05 mol of Compound (III-d') was dissolved in THF. To this solution were added 0.040 mol of menthane diol , and then 0.010 mol of Compound (III-c). The mixture was stirred while maintaining its temperature at room temperature, and, to this, a solution of 0.1 mol of triethylamine in THF was gradually added dropwise. After stirring for 2 hours, the mixture was stirred for a further 2 hours at room temperature, and then filtered. The filtrate was gradually added dropwise to water, and the precipitate was reprecipitated to obtain Ester Oligomer III-11 (containing a polyacid anhydride). The average molecular weight of this oligomer was found to be 3,500. The structural formula of this oligomer is as follows:

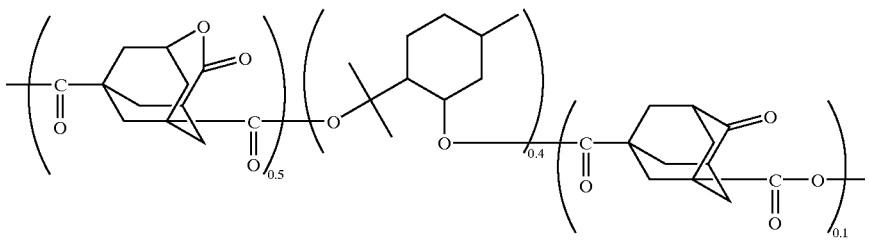

0.05 mol of Compound (III-d') was dissolved in THF. To this solution was added 0.050 mol of menthane diol. The mixture was stirred while maintaining its temperature at room temperature, and, to this, a solution of 0.1 mol of triethylamine in THF was gradually added dropwise. After stirring for 2 hours, the mixture was stirred for a further 4 hours at room temperature, and then filtered. The filtrate was gradually added dropwise to water, and the precipitate was reprecipitated to obtain Ester Oligomer III-12. The average molecular weight of this oligomer was found to be 3,000. The structural formula of this oligomer is as follows:

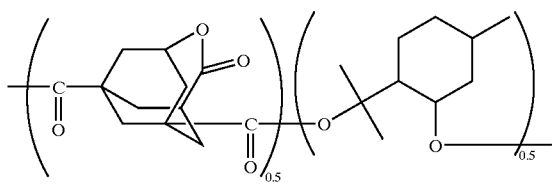

[Synthesis of Comparative Acrylate Polymer]

0.6 mol of the adamantyl acrylate (Compound (III-h)) and 0.4 mol of the tetrahydropyranyl methacrylate (Compound (III-g)) were reacted with each other in THF for 40 hours by using AIBN (10 mol %) as an initiator. The reaction solution was added dropwise to hexane to obtain Comparative Acrylate Polymer III-E. The structural formula of this polymer is as follows:

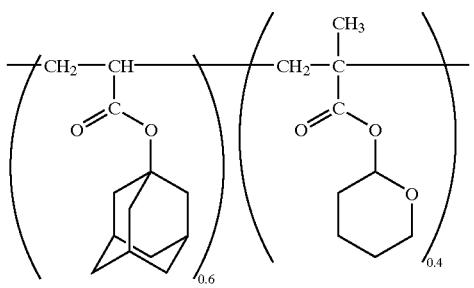

[Synthesis of Comparative Ester Oligomer]

0.05 mol of adamatandicarbonyl chloride was dissolved in THF, and to this solution was added 0.05 mol of menthane diol. The mixture was stirred while maintaining its temperature at room temperature, and, to this, a solution of 0.1 mol of triethylamine in THF was gradually added dropwise. After stirring for two hours, the reaction solution was stirred for a further 2 hours, and then filtered. The filtrate was gradually added dropwise to water, and the precipitate was reprecipitated from a water-acetone solvent to obtain Comparative Ester Oligomer III-F. The structural formula of this oligomer is as follows:

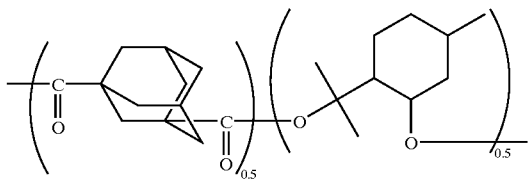

[(Comparative Acrylate Polymer]

Comparative Acrylate Polymers III-G, III-H and III-I described in Japanese Patent Laid-Open Publication No. 3169/1998, having the following general formulas were prepared.

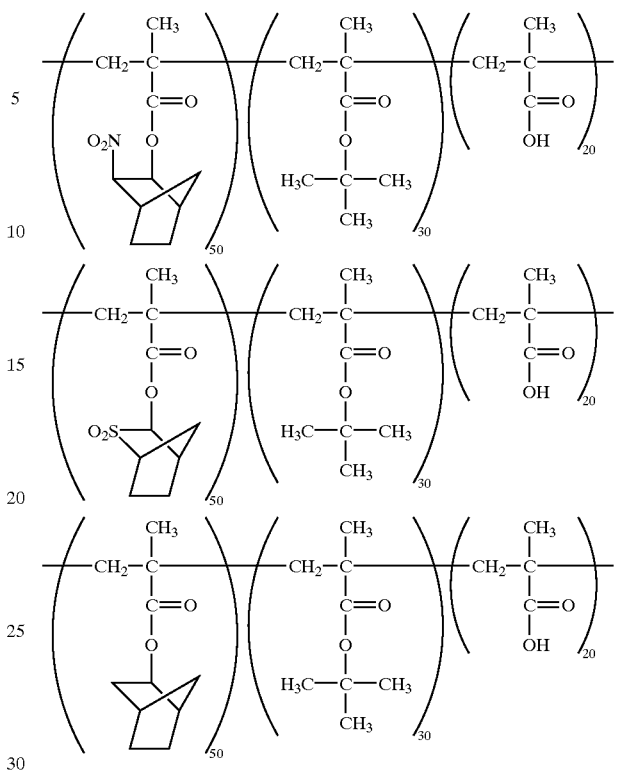

[Preparation of Resists and Formation of Resist Patterns]

The above-synthesized polymer compounds and dissolution-preventive agents, and TPS-105 or NAI-105 manufactured by Midori Kagaku Co., Ltd., Japan, photo acid generator, were dissolved in cyclohexanone (polyester type) or PGMEA (acrylic ester type) in accordance with the formulations shown in Table III-4 to obtain varnishes of the resists of Examples III-10 to III-18.

TABLE III-4

| | Polymer or Oligomer (%) | Additive (%) | Acid Generator (%) |
|---|---|---|---|
| Ex. III-10 | Copolymer 7 (99) | — | TPS-105 (1) |
| Ex. III-11 | Copolymer 7 (79) | t-BocNN (20) | TPS-105 (1) |
| Ex. III-12 | Copolymer 8 (99) | — | TPS-105 (1) |
| Ex. III-13 | Copolymer 9 (99) | — | TPS-105 (1) |
| Ex. III-14 | Ester Oligomer 10 (99) | — | TPS-105 (1) |
| Ex. III-15 | Ester Oligomer 10 (79) | ADTB (20) | NAI-105 (1) |
| Ex. III-16 | Ester Oligomer 10 (79) | NV4THP (20) | NAI-105 (1) |
| Ex. III-17 | Ester Oligomer 11 (99) | — | NAI-105 (1) |
| Ex. III-18 | Ester Oligomer 12 (99) | — | TPS-105 (1) |

On the other hand, varnishes of the resists of Comparative Examples III-5 to III-9 were prepared by using the comparative polymers, and, as a photo acid generator, TPS-105 as shown in Table III-5.

TABLE III-5

| | Polymer or Oligomer (%) | Additive (%) | Acid Generator (%) |
|---|---|---|---|
| Comp. Ex. III-5 | Comparative Acryl Polymer E (99) | — | TPS-105 (1) |

TABLE III-5-continued

| | Polymer or Oligomer (%) | Additive (%) | Acid Generator (%) |
|---|---|---|---|
| Comp. Ex. III-6 | Comparative Acryl Polymer F (99) | — | TPS-105 (1) |
| Comp. Ex. III-7 | Comparative Acryl Polymer G (99) | — | TPS-105 (1) |
| Comp. Ex. III-8 | Comparative Acryl Polymer H (99) | — | TPS-105 (1) |
| Comp. Ex. III-9 | Comparative Acryl Polymer I (99) | — | TPS-105 (1) |

Subsequently, the varnishes of these resists were respectively spin-coated onto silicon wafers to form resist films, each having a thickness of 0.3 micrometers. The surfaces of these resist films were exposed to light of 193 nm emitted by a stepper with an A of 0.55, using as the light source an ArF excimer laser, thereby conducting pattern-wise exposure. The resist films were then baked at 110°C. for 2 minutes, and developed by a mixture of a 2.38% aqueous solution of tetramethyl-ammonium hydroxide (TMAH), MAH and isopropyl alcohol. The exposed area was thus selectively dissolved and removed to form positive resist patterns. The sensitivities of the resists, and the degrees of resolution of the resist patterns are as shown in Table III-6.

TABLE III-6

| | Sensitivity (mJ/cm$^2$) | Resolution ($\mu$mL/S) | Remarks |
|---|---|---|---|
| Ex. III-10 | 5 | 0.15 | Good |
| Ex. III-11 | 15 | 0.15 | Good |
| Ex. III-12 | 10 | 0.15 | Good |
| Ex. III-13 | 7 | 0.14 | Good |
| Ex. III-14 | 14 | 0.15 | Good |
| Ex. III-15 | 12 | 0.14 | Good |
| Ex. III-16 | 22 | 0.15 | Good |
| Ex. III-17 | 15 | 0.14 | Good |
| Ex. III-18 | 20 | 0.15 | Good |
| Comp. Ex. III-5 | 22 | 0.35 | Impossible to form fine pattern |
| Comp. Ex. III-6 | 10 | 0.19 | Pattern peeled greatly |
| Comp. Ex. III-7 | 13 | 0.35 | Impossible to form fine pattern |
| Comp. Ex. III-8 | 20 | 0.35 | Impossible to form fine pattern |
| Comp. Ex. III-9 | 13 | 0.20 | Pattern peeled greatly |

The date shown in Table III-6 demonstrate the following: when the resists of Examples of III-10 to III-18 are used, resist patterns excellent in resolution are formed at high sensitivities, and the resists are excellent in both transparency against light of 193 nm and alkali developability; while, when the resists of Comparative Examples III-5 to III-9 are used, resist patterns excellent in resolution cannot be formed, and the resist films readily peel off.

In addition, these resists were evaluated in terms of dry-etching resistance by measuring their etching rates in $CF_4$ plasma etching. As a result, the following were found: the etching rate of the resist containing as its base resin polyhydroxystyrene resin being taken as 1.0, the etching rates of the resists of Comparative Examples III-5 and III-6 were from 1.0 to 1.3 (moderate), and those of the resists of Comparative Examples III-7, III-8 and III-9 were approximately 1.4 to 1.6 (poor); while the etching rates of the resists of Examples III-10 to III-18 were from 0.9 to 1.2. The resists of Examples III-10 to III-18 were thus confirmed to have high dry-etching resistance.

What is claimed is:

1. A positive-working resist resin having bridged-bond-containing aliphatic rings in its main or side chain, wherein a part of the bridged-bond-containing aliphatic rings has a structure in which at least two tertiary carbons on one bridged-bond-containing aliphatic ring are substituted by oxygen-containing polar groups.

2. A positive working resist resin according to claim 1, wherein the percentage of the bridged-bond-containing aliphatic ring is from 20 to 90% by weight of the resin, and the percentage of the bridged-bond-containing aliphatic ring on which at least two tertiary carbons are substituted by oxygen-containing polar groups is larger than 70% of the total aliphatic ring substituted by two or more oxygen-containing polar groups.

3. A positive-working resist composition comprising at least a positive-working resist resin according to claim 1 and a photo acid generator.

4. A positive-working resist composition according to claim 3, wherein a part of the bridged-bond-containing aliphatic rings in the resist resin has a structure in which at least three tertiary carbons on one bridged-bond-containing aliphatic ring are substituted by oxygen-containing polar groups.

5. A positive-working resist composition according to claim 3, wherein the bridged-bond-containing aliphatic ring is at least one selected from the group consisting of adamantane ring, tricyclodecane ring, tetracylododecane ring and norbomane ring.

6. A positive-working resist composition according to claim 3, wherein at least one of the oxygen-containing polar groups is at least one organic group selected from the group consisting of substituted or unsubstituted hydroxyl groups, and substituents containing cyclic lactones.

7. A positive-working resist composition according to claim 3, wherein at least one of the oxygen-containing polar groups is a carboxyl group protected by a group that can be decomposed by an acid.

8. A positive-working resist composition according to claim 3, wherein the resin contains an acid anhydride structure, and at least one of the oxygen-containing polar groups is a hydroxyl group.

9. A positive-working resist composition according to claim 3, wherein the resin is a polymer of a monomer having a bridged-bond-containing aliphatic ring, at least two oxygen-containing polar groups being combined with a tertiary carbon atom on the bridged-bond-containing aliphatic ring, and at least one of the oxygen-containing polar groups combined with the bridged-bond-containing aliphatic ring in the monomer is an acryloyloxy or methacryloyloxy group.

10. A positive-working resist composition according to claim 9, wherein the resin is a polymer of a monomer having a bridged-bond-containing aliphatic ring, at least two oxygen-containing polar groups being combined with a tertiary carbon atom on the bridged-bond-containing aliphatic ring, and the monomer is a compound represented by the following general formula (II-1):

wherein $R_1$ is an acryloyl or methacryloyl group, $R_2$ is a hydrogen atom or an oxygen-containing polar group, and $R_3$ is a hydrogen atom, a group decomposable by an acid, a cyclic substituent having a lactone ring, or a substituent having an acid anhydride structure formed with a bridged-bond-containing alicyclic compound containing a carboxylic acid.

11. A positive-working resist composition according to claim 9, wherein the resin is a polymer of a monomer having a bridged-bond-containing aliphatic ring, at least two oxygen-containing polar groups being combined with a tertiary carbon atom on the bridged-bond-containing aliphatic ring, and the monomer is a compound represented by the following general formula (II-2):

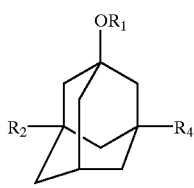

(II-2)

wherein $R_1$ is an acryloyl or methacryloyl group, $R_2$ is a hydrogen atom, an oxygen-containing polar group, a hydroxyl group, or a cyclic substituent having a lactone ring, and $R_4$ is a hydrogen atom, a cyclic substituent having a lactone ring, or a substituent having an acid anhydride structure formed with a bridged-bond-containing alicyclic compound containing a carboxylic acid.

12. A positive-working resist composition according to claim 3, wherein the resin is an alicyclic-backbone-type resin obtainable by the dehydration condensation of a monomer having a bridged-bond-containing aliphatic ring, two or more organic groups of at least one of the carboxyl group and hydroxyl group being combined with a tertiary carbon atom on the ring.

13. A positive-working resist resin according to claim 1, which further has bridged-bond-containing aliphatic rings which are a combination of at least two aliphatic rings selected from 5-membered rings, 6-membered rings and 7-membered rings and at least one of the rings containing in the ring is a lactone ring.

14. A positive-working resist composition comprising at least a positive-working resist resin according to claim 13 and a photo acid generator.

15. A pattern forming process comprising the steps of:

forming a film containing a resist composition according to claim 3 on a substrate, subjecting the film to pattern-wise exposure, and developing the film which has been exposed to light.

* * * * *